US009660211B2

(12) United States Patent
Seo et al.

(10) Patent No.: US 9,660,211 B2
(45) Date of Patent: *May 23, 2017

(54) LIGHT-EMITTING ELEMENT, LIGHT-EMITTING DEVICE, DISPLAY DEVICE, ELECTRONIC APPLIANCE, AND LIGHTING DEVICE

(71) Applicant: Semiconductor Energy Laboratory Co., Ltd., Kanagawa-ken (JP)

(72) Inventors: Satoshi Seo, Kanagawa (JP); Hiromi Seo, Kanagawa (JP); Tatsuyoshi Takahashi, Kanagawa (JP); Takahiro Ishisone, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/738,112

(22) Filed: Jun. 12, 2015

(65) Prior Publication Data
US 2015/0280163 A1    Oct. 1, 2015

Related U.S. Application Data

(63) Continuation of application No. 13/955,904, filed on Jul. 31, 2013, now Pat. No. 9,059,421.

(30) Foreign Application Priority Data

Aug. 3, 2012 (JP) ................................. 2012-173027

(51) Int. Cl.
H01L 29/08 (2006.01)
H01L 51/50 (2006.01)
(Continued)

(52) U.S. Cl.
CPC ........ H01L 51/504 (2013.01); H01L 51/5016 (2013.01); H01L 51/5206 (2013.01);
(Continued)

(58) Field of Classification Search
CPC ... H01L 27/32–27/326; H01L 51/50–51/5012; H01L 51/525–51/5287;
(Continued)

(56) References Cited

U.S. PATENT DOCUMENTS 6,863,997 B2   3/2005   Thompson et al.
6,869,695 B2   3/2005   Thompson et al.
(Continued)

FOREIGN PATENT DOCUMENTS

CN   001934906 A   3/2007
CN   102668149 A   9/2012
(Continued)

OTHER PUBLICATIONS

Baldo, M.A. et al., "Highly Efficient Phosphorescent Emission From Organic Electroluminescent Devices," Nature, Sep. 10, 1998, vol. 395, pp. 151-154.
(Continued)

Primary Examiner — Cuong B Nguyen
(74) Attorney, Agent, or Firm — Husch Blackwell LLP

(57) ABSTRACT

A multicolor light-emitting element using fluorescence and phosphorescence, which has a small number of manufacturing steps owing to a relatively small number of layers to be formed and is advantageous for practical application can be provided. In addition, a multicolor light-emitting element using fluorescence and phosphorescence, which has favorable emission efficiency is provided. A light-emitting element which includes a light-emitting layer having a stacked-layer structure of a first light-emitting layer exhibiting light
(Continued)

emission from a first exciplex and a second light-emitting layer exhibiting phosphorescence is provided.

19 Claims, 25 Drawing Sheets

(51) Int. Cl.
H01L 51/52 (2006.01)
H01L 51/00 (2006.01)

(52) U.S. Cl.
CPC ...... *H01L 51/5221* (2013.01); *H01L 51/0084* (2013.01); *H01L 51/0085* (2013.01); *H01L 51/0087* (2013.01); *H01L 51/5012* (2013.01); *H01L 2251/5376* (2013.01); *H01L 2251/5384* (2013.01)

(58) Field of Classification Search
CPC .............. H01L 2227/32–2227/326; H01L 2251/5323–2251/5361; H01L 2924/12044
See application file for complete search history.

(56) References Cited

U.S. PATENT DOCUMENTS

| | | | |
|---|---|---|---|
| 6,951,694 B2 | 10/2005 | Thompson et al. | |
| 7,553,557 B2 | 6/2009 | Thompson et al. | |
| 7,572,522 B2 | 8/2009 | Seo et al. | |
| 7,943,925 B2 | 5/2011 | Yamazaki | |
| 8,247,086 B2 | 8/2012 | Inoue et al. | |
| 9,059,421 B2 * | 6/2015 | Seo | H01L 51/504 |
| 2005/0048310 A1 | 3/2005 | Cocchi et al. | |
| 2006/0134464 A1 | 6/2006 | Nariyuki | |
| 2006/0228577 A1 | 10/2006 | Nagara | |
| 2007/0194701 A1 | 8/2007 | Ito et al. | |
| 2007/0244320 A1 | 10/2007 | Inoue et al. | |
| 2008/0160345 A1 | 7/2008 | Inoue et al. | |
| 2008/0286604 A1 | 11/2008 | Inoue et al. | |
| 2010/0052527 A1 | 3/2010 | Ikeda et al. | |
| 2010/0145044 A1 | 6/2010 | Inoue et al. | |
| 2011/0001146 A1 | 1/2011 | Yamazaki et al. | |
| 2011/0210316 A1 | 9/2011 | Kadoma et al. | |
| 2011/0215714 A1 | 9/2011 | Seo et al. | |
| 2012/0098417 A1 | 4/2012 | Inoue et al. | |
| 2012/0205632 A1 | 8/2012 | Shitagaki et al. | |
| 2012/0205687 A1 | 8/2012 | Yamazaki et al. | |
| 2012/0206035 A1 | 8/2012 | Shitagaki et al. | |
| 2012/0217486 A1 | 8/2012 | Takemura et al. | |
| 2012/0217487 A1 | 8/2012 | Yamazaki et al. | |
| 2012/0242219 A1 | 9/2012 | Seo et al. | |
| 2012/0248421 A1 | 10/2012 | Yamazaki et al. | |
| 2012/0256535 A1 | 10/2012 | Seo et al. | |
| 2012/0267618 A1 | 10/2012 | Monkman et al. | |
| 2013/0048964 A1 | 2/2013 | Takeda et al. | |
| 2013/0069090 A1 | 3/2013 | Sawabe et al. | |
| 2013/0306945 A1 | 11/2013 | Seo | |
| 2014/0034926 A1 | 2/2014 | Matsubara et al. | |

FOREIGN PATENT DOCUMENTS

| | | |
|---|---|---|
| EP | 1 727 396 A1 | 11/2006 |
| EP | 2 363 398 A1 | 9/2011 |
| EP | 2 366 753 A1 | 9/2011 |
| JP | 2000-133453 A | 5/2000 |
| JP | 2004-047493 A | 2/2004 |
| JP | 2004-522276 | 7/2004 |
| JP | 2006-203172 A | 8/2006 |
| JP | 2010-033780 A | 2/2010 |
| JP | 2011-201869 A | 10/2011 |
| JP | 2011-204673 A | 10/2011 |
| JP | 2012-004526 A | 1/2012 |
| JP | 4970934 B2 | 7/2012 |
| JP | 2013-509670 | 3/2013 |
| KR | 2006-0129478 A | 12/2006 |
| KR | 2011-0099645 A | 9/2011 |
| KR | 2012-0103571 A | 9/2012 |
| TW | 200303154 | 8/2003 |
| TW | 200540252 | 12/2005 |
| WO | WO 00/70655 A2 | 11/2000 |
| WO | WO 03/059015 A1 | 7/2003 |
| WO | WO 2005/091684 A1 | 9/2005 |
| WO | WO 2011/042443 A1 | 4/2011 |

OTHER PUBLICATIONS

Baldo, M.A. et al., "Very High-Efficiency Green Organic Light-Emitting Devices Based on Electrophosphorescence," Applied Physics Letters, Jul. 5, 1999, vol. 75, No. 1, pp. 4-6.

Gu, G. et al., "Transparent Organic Light Emitting Devices," Applied Physics Letters, May 6, 1996, vol. 68, No. 19, pp. 2606-2608.

Choong, V.-E. et al., "Organic Light-Emitting Diodes With a Bipolar Transport Layer," Applied Phyics Letters, Jul. 12, 1999, vol. 75, No. 2, pp. 172-174.

Adachi, C. et al., "Nearly 100% Internal Phosphorescence Efficiency in an Organic Light Emitting Device," Journal of Applied Physics, Nov. 15, 2001, vol. 90, No. 10, pp. 5048-5051.

Baldo, M.A. et al., "Prospects for Electrically Pumped Organic Lasers," Physical Review. B, Jul. 1, 2002, vol. 66, pp. 035321-1-035321-16.

Markham, J.P.J. et al., "High-Efficiency Green Phosphorescence from Spin-Coated Single-Layer Dendrimer Light-Emitting Diodes," Applied Physics Letters, Apr. 15, 2002, vol. 80, No. 15, pp. 2645-2647.

Itano, K. et al., "Exciplex Formation at the Organic Solid-State Interface: Yellow Emission in Organic Light-Emitting Diodes Using Green-Fluorescent tris(8-quinolinolato)aluminum and Hole-Transporting Molecular Materials with Low Ionization Potentials," Applied Physics Letters, Feb. 9, 1998, vol. 72, No. 6, pp. 636-638.

Kondakova, M.E. et al., "High-Efficiency, Low-Voltage Phosphorecent Organic Light-Emitting Diode Devices with Mixed Host," Journal of Applied Phsyics, 2008, vol. 104, pp. 094501-1-094501-17.

Seo, J.H. et al., "Efficient Blue-Green Organic Light-Emitting Diodes Based on Heteroleptic tris-cyclometalated iridium(III) Complexes," Thin Solid Films, 2009, vol. 517, No. 5, pp. 1807-1810.

Fujita, M. et al., "Reduction of Operating Voltage in Organic Light-Emitting Diode by Corrugated Photonic Crystal Structure," Applied Physics Letters, Dec. 6, 2004, vol. 85, No. 23, pp. 5769-5771.

International Search Report re Application No. PCT/JP2013/070951, dated Oct. 8, 2013.

Written Opinion re Application No. PCT/JP2013/070951, dated Oct. 8, 2013.

* cited by examiner

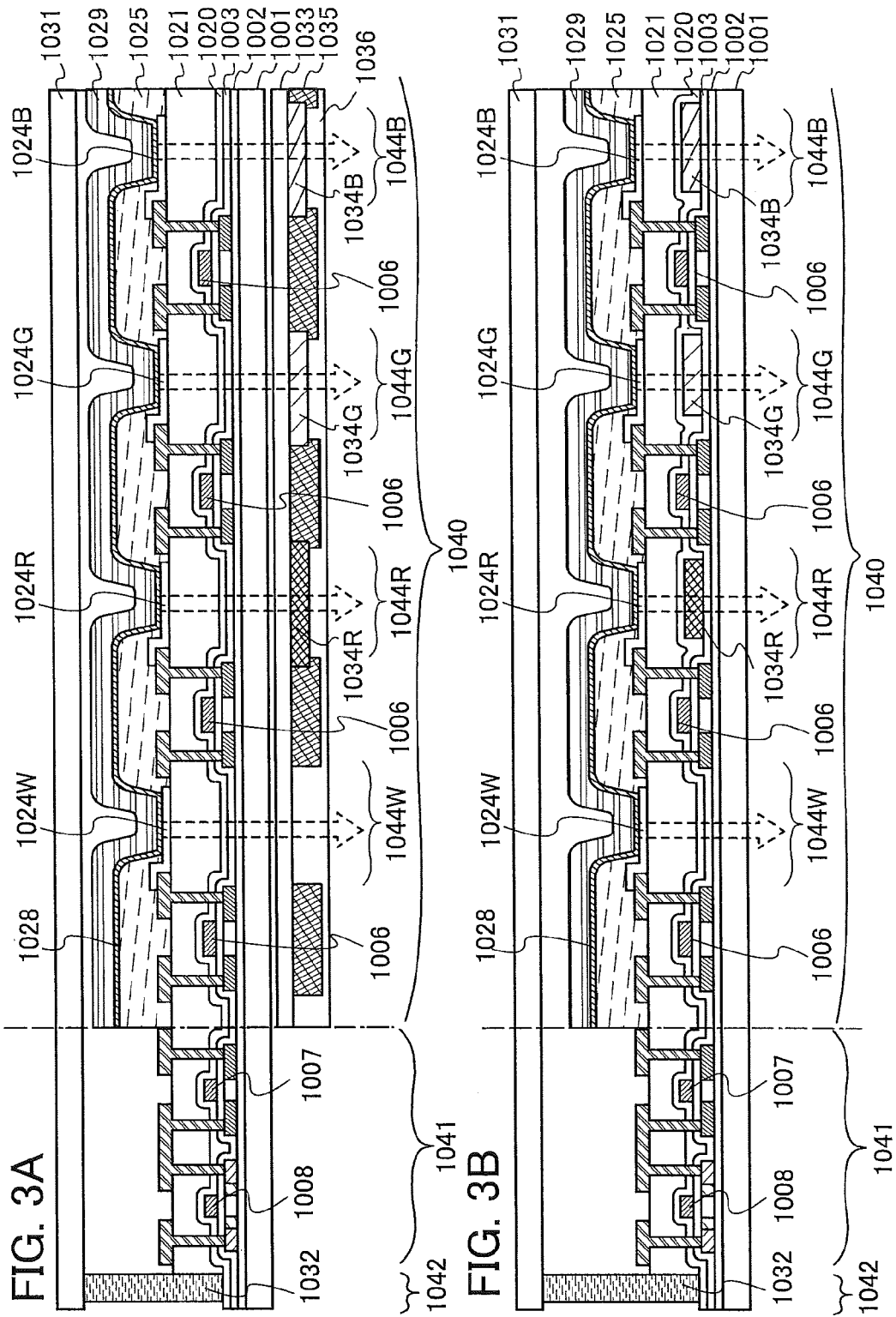

FIG. 7A
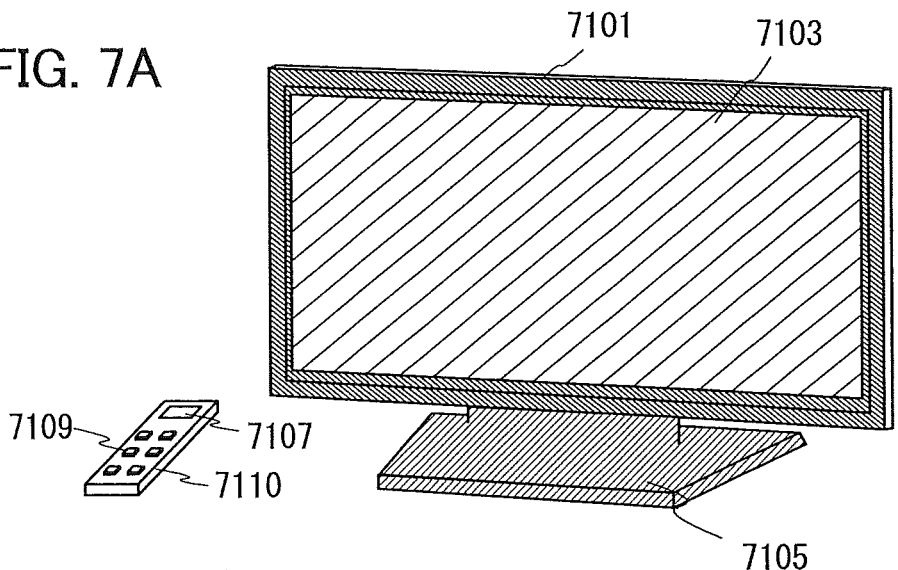
FIG. 7B1
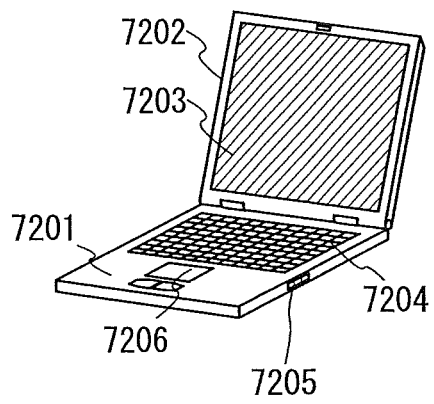
FIG. 7B2
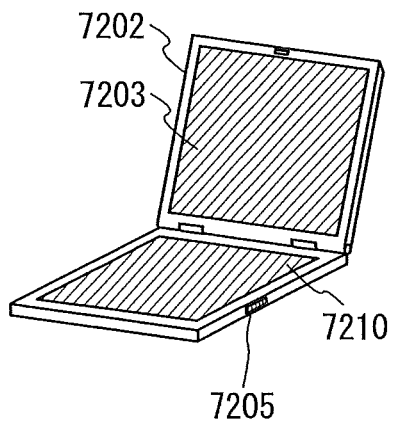
FIG. 7C
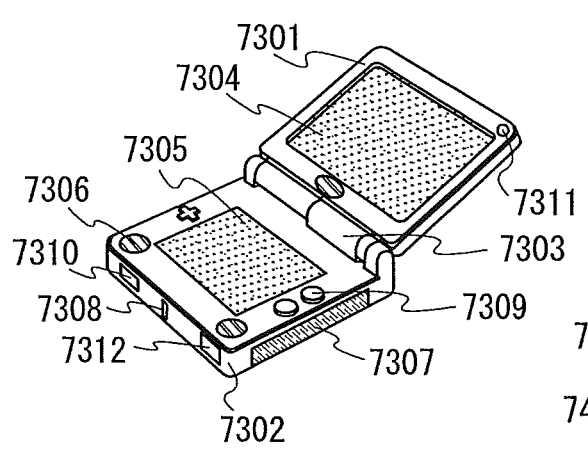
FIG. 7D
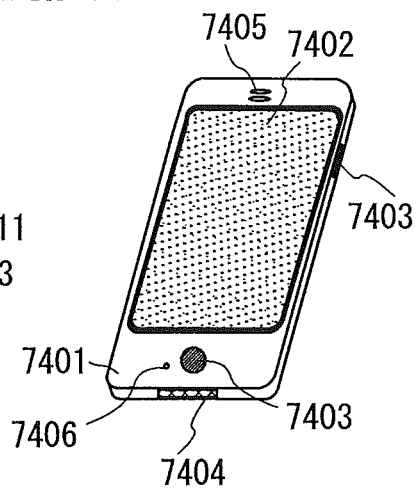

LIGHT-EMITTING ELEMENT, LIGHT-EMITTING DEVICE, DISPLAY DEVICE, ELECTRONIC APPLIANCE, AND LIGHTING DEVICE

This application is a continuation of copending U.S. application Ser. No. 13/955,904, filed on Jul. 31, 2013 which is incorporated herein by reference.

TECHNICAL FIELD

The present invention relates to a light-emitting element, a display device, a light-emitting device, an electronic appliance, and a lighting device each of which uses an organic compound as a light-emitting substance.

BACKGROUND ART

In recent years, research and development of a light-emitting element (organic EL element) which uses an organic compound and utilizes electroluminescence (EL) have been actively promoted. In the basic structure of such a light-emitting element, an organic compound layer containing a light-emitting substance (an EL layer) is interposed between a pair of electrodes. By voltage application to this element, light emission from the light-emitting substance can be obtained.

Such a light-emitting element is a self-luminous element and has advantages over a liquid crystal display in having high pixel visibility and eliminating the need for backlights, for example; thus, such a light-emitting element is thought to be suitable for a flat panel display element. A display including such a light-emitting element is also highly advantageous in that it can be thin and lightweight. Besides, very high speed response is one of the features of such an element.

In such a light-emitting element, light-emitting layers can be successively formed two-dimensionally, so that planar light emission can be obtained. Thus, a large-area element can be easily formed. This feature is difficult to obtain with point light sources typified by incandescent lamps and LEDs or linear light sources typified by fluorescent lamps. Thus, the light-emitting element also has great potential as a planar light source which can be applied to a lighting device and the like.

In the case of such an organic EL element, electrons from a cathode and holes from an anode are injected into an EL layer, so that current flows. By recombination of the injected electrons and holes, the organic compound having a light-emitting property is put in an excited state to provide light emission.

The excited state of an organic compound can be a singlet excited state or a triplet excited state, and light emission from the singlet excited state (S*) is referred to as fluorescence, and light emission from the triplet excited state (T*) is referred to as phosphorescence. The statistical generation ratio of the excited states in the light-emitting element is considered to be S*:T*=1:3.

In a compound that emits light from the singlet excited state (hereinafter, referred to as fluorescent substance), at room temperature, generally light emission from the triplet excited state (phosphorescence) is not observed while only light emission from the singlet excited state (fluorescence) is observed. Therefore, the internal quantum efficiency (the ratio of generated photons to injected carriers) of a light-emitting element using a fluorescent substance is assumed to have a theoretical limit of 25% based on the ratio of S* to T* which is 1:3.

In contrast, in a compound that emits light from the triplet excited state (hereinafter, referred to as phosphorescent compound), light emission from the triplet excited state (phosphorescence) is observed. Further, since intersystem crossing (i.e., transfer from a singlet excited state to a triplet excited state) easily occurs in a phosphorescent compound, the internal quantum efficiency can be increased to 100% in theory. That is, higher emission efficiency than in the case of using a fluorescent substance can be achieved. For these reasons, in order to achieve a highly efficient light-emitting element; a light-emitting element using a phosphorescent compound has been actively developed recently.

A white light-emitting element disclosed in Patent Document 1 includes a light-emitting region containing plural kinds of light-emitting dopants which emit phosphorescence.

REFERENCE

Patent Document

[Patent Document 1] Japanese Translation of PCT International Application No. 2004-522276

DISCLOSURE OF INVENTION

As a multicolor light-emitting element typified by a white light-emitting element, an element in which a layer in which fluorescence is used as light with a short wavelength (fluorescent layer), a layer in which phosphorescence is used as light with a long wavelength (phosphorescent layer), and an intermediate layer (charge generation layer) between the fluorescent layer and the phosphorescent layer are provided has been developed and partly put into practical application.

This structure, in which fluorescence is used as light with a short wavelength and a problem in the lifetime and phosphorescence is used as light with a long wavelength, is characterized by enabling a multicolor light-emitting element with stable characteristics to be achieved in spite of lower efficiency than an element in which phosphorescence is used as light with both short and long wavelengths.

The multicolor light-emitting element having the above-described structure in which the reliability is put ahead of the performance is suitable for practical application; on the other hand, a larger number of films are formed in order to obtain one light-emitting element, which hinders the practical application of the light-emitting element.

In such an element, the intermediate layer is provided between the phosphorescent layer and the fluorescent layer and elements are connected in series in order to prevent quenching of phosphorescence due to the fluorescent layer.

For a fluorescent layer, a substance having a condensed aromatic ring skeleton, typified by anthracene, is generally used as a host material. Such a substance having a condensed aromatic ring skeleton has a low triplet level. Thus, in the case where the fluorescent layer is formed in contact with a phosphorescent layer, the triplet excited energy generated in the phosphorescent layer is transferred to the triplet level of the host material in the fluorescent layer to be quenched. Meanwhile, the above-described problem is alleviated by using a host material with high triple excited energy for the fluorescent layer. In that case, however, the singlet excited energy of the host material is increased (becomes too high), so that energy is not sufficiently transferred from the host material to a fluorescent dopant, resulting in insufficient emission efficiency in the fluorescent layer. As a result, a nonradiative deactivation process of the host material might be increased to degrade the characteristics (particularly, lifetime) of the element.

In view of the above, an object of one embodiment of the present invention is to provide a multicolor light-emitting element using fluorescence and phosphorescence, which has a small number of manufacturing steps owing to a relatively small number of layers to be formed and which is advantageous for practical application.

Another object of one embodiment of the present invention is to provide a multicolor light-emitting element using fluorescence and phosphorescence, which has favorable emission efficiency.

Another object of one embodiment of the present invention is to provide a multicolor light-emitting element using fluorescence and phosphorescence, which has a relatively small number of layers to be formed, is advantageous for practical application, and has favorable emission efficiency.

Another object of one embodiment of the present invention is to provide a light-emitting device, a display device, an electronic appliance, and a lighting device each of which can be manufactured at low cost by using any of the above-described light-emitting elements.

Another object of one embodiment of the present invention is to provide a light-emitting device, a display device, an electronic appliance, and a lighting device each of which has reduced power consumption by using any of the above-described light-emitting elements.

It is only necessary that at least one of the above-described objects be achieved in the present invention.

Any of the above-described objects can be achieved by a light-emitting element which includes a light-emitting layer having a stacked-layer structure of a first light-emitting layer exhibiting light emission from a first exciplex and a second light-emitting layer exhibiting phosphorescence. It is preferable that light emitted from the first light-emitting layer have an emission peak on the shorter wavelength side than light emitted from the second light-emitting layer.

An exciplex is an excited state formed from two kinds of substances. In the case of photoexcitation, the exciplex is formed in such a manner that one molecule in an excited state takes in the other substance in a ground state. Thus, when the exciplex emits light to be in a ground state, it returns to be the original substances. For this reason, a ground state of the exciplex does not exist and energy transfer between the exciplexes does not occur in principle. This makes it difficult for energy transfer through a host material occupying a large part of the light-emitting layer to occur, and makes it easy for the light-emitting element having the structure to achieve both fluorescence from a first exciplex in the first light-emitting layer and phosphorescence from a phosphorescent compound in the second light-emitting layer.

The luminance of a light-emitting element using a phosphorescent substance emitting light with a short wavelength (e.g., substance emitting blue phosphorescence) tends to degrade quickly. In view of the above, fluorescence with a short wavelength is used, so that a light-emitting element with less degradation of luminance can be provided. Note that in the light-emitting element of one embodiment of the present invention, the first light-emitting layer which is a fluorescent layer and the second light-emitting layer which is a phosphorescent layer are stacked in contact with each other; thus, the light-emitting element has a small number of layers included in an EL layer, is advantageous in terms of cost, and is suitable for mass production. Moreover, although the fluorescent layer and the phosphorescent layer are in contact with each other, deactivation of the triplet excited level is less likely to occur owing to the use of the above-described exciplex; thus, both phosphorescence and fluorescence can be obtained.

One embodiment of the present invention is a light-emitting element which includes a first electrode, a second electrode, and an EL layer interposed between the first electrode and the second electrode. The EL layer includes a light-emitting layer in which at least a first light-emitting layer and a second light-emitting layer are stacked. The first light-emitting layer contains at least a first organic compound and a second organic compound. The second light-emitting layer contains at least a third organic compound and a phosphorescent substance. A combination of the first organic compound and the second organic compound forms a first exciplex.

Another embodiment of the present invention is a light-emitting element having the above-described structure, in which light emission of the first exciplex has an emission peak on the shorter wavelength side than light emission of the phosphorescent substance.

The singlet excited level and the triplet excited level of the exciplex are close to each other. Thus, reverse intersystem crossing from the triplet excited level of the exciplex to the singlet excited level thereof easily occurs. In other words, delayed fluorescence is easily emitted. The exciplex from which delayed fluorescence can be obtained is used for the first light-emitting layer, whereby the triplet excited state can also be converted into light emission; thus, the light-emitting element can have higher emission efficiency than in the case of using a normal fluorescent substance. For sufficient reverse intersystem crossing from the triplet excited level to the singlet excited level, a small difference in energy between the triplet excited level and the singlet excited level is advantageous; the difference in energy is preferably greater than or equal to 0 eV and less than or equal to 0.2 eV, more preferably greater than or equal to 0 eV and less than or equal to 0.1 eV.

Thus, another embodiment of the present invention is a light-emitting element having the above-described structure, in which the first exciplex efficiently exhibits reverse intersystem crossing from the triplet excited level to the singlet excited level.

Another embodiment of the present invention is a light-emitting element having the above-described structure, in which the first exciplex exhibits delayed fluorescence.

It is preferable that in the second light-emitting layer, energy be transferred efficiently from a host to the phosphorescent compound.

Thus, another embodiment of the present invention is a light-emitting element having the above-described structure, in which the second light-emitting layer further contains a fourth organic compound and a combination of the third organic compound and the fourth organic compound forms a second exciplex. Further, the lowest-energy-side absorption band of the phosphorescent substance and an emission spectrum of the second exciplex preferably overlap with each other.

Another embodiment of the present invention is a light-emitting element having the above-described structure, in which the difference in equivalent energy values between a peak wavelength of the lowest-energy-side absorption band of the phosphorescent substance and a peak wavelength of the emission spectrum of the second exciplex is less than or equal to 0.2 eV.

Although there is no limitation on each of the combination of the first organic compound and the second organic compound and the combination of the third organic compound and the fourth organic compound as long as an exciplex can be formed, one organic compound is preferably a material having an electron-transport property and the other organic compound is preferably a material having a hole-transport property. This structure allows efficient formation of an exciplex. Further, by changing the mixture ratio, the transport property of the light-emitting layer itself can be adjusted and a recombination region can be easily adjusted. As a result, extreme localization of the recombination region can be prevented, leading to a long lifetime of the element.

Thus, another embodiment of the present invention is a light-emitting element having the above-described structure, in which one of the first organic compound and the second organic compound is a material having an electron-transport property and the other is a material having a hole-transport property and one of the third organic compound and the fourth organic compound is a material having an electron-transport property and the other is a material having a hole-transport property.

In the light-emitting element of one embodiment of the present invention, each light-emitting layer is preferably formed of a material having a hole-transport property and a material having an electron-transport property as described above. The recombination region in the light-emitting layer is preferably in the vicinity of an interface between the first light-emitting layer and the second light-emitting layer. Thus, in the light-emitting element having the above-described structure, one of the light-emitting layers, which is closer to an anode than the other light-emitting layer, preferably contains a large amount of material having a hole-transport property, and the other light-emitting layer, which is closer to a cathode than the one light-emitting layer, preferably contains a large amount of material having an electron-transport property. This structure allows the recombination region to be in the vicinity of the interface between the first light-emitting layer and the second light-emitting layer, which is convenient for distribution of recombination energy.

Further, the first exciplex may be the same as the second exciplex. Thus, another embodiment of the present invention is a light-emitting element in which the combination of the first organic compound and the second organic compound is the same as the combination of the third organic compound and the fourth organic compound.

Part of a layer formed of the two kinds of substances forming the exciplex is doped with a phosphorescent substance, which enables a multicolor light-emitting element to be easily obtained. Note that in this case, the ratio of the material having a hole-transport property to the material having an electron-transport property may be different between the first light-emitting layer and the second light-emitting layer.

The emission spectrum of the light-emitting element having any of the above-described structures is made by combining light emission from the first exciplex and light emission from the phosphorescent substance, and thus has at least two peaks.

Here, a fluorescent substance may be further contained as a dopant in the first light-emitting layer. As described above, since the singlet excited level and the triplet excited level of the exciplex formed in the first light-emitting layer are close to each other, reverse intersystem crossing from the triplet excited level to the singlet excited level easily occurs. That is, part of the triplet excited state can be converted into the singlet excited state; thus, the proportion of the singlet excited state is higher than that in the conventional case (25%). Thus, the energy of the singlet excited state with the increased proportion is transferred to the fluorescent substance, whereby the light-emitting element can have higher emission efficiency than a light-emitting element using a normal fluorescent substance. The advantage of this structure is that the fluorescent substance with a high fluorescent quantum yield can be used as the dopant. As described above, a material having a function of generating the singlet excited state from the triplet excited state (the exciplex) is different from a material having a function of efficiently obtaining light emission from the singlet excited state (the fluorescent compound, which is a dopant), whereby high emission efficiency can be easily obtained. Further, since the light-emitting substance exists as the dopant, quenching or a chemical reaction due to an impurity can be prevented, leading to a long lifetime.

When light emission colors which are complementary to each other are selected, the light-emitting element having any of the above-described structures can provide white light emission.

Another embodiment of the present invention is a light-emitting module which includes the light-emitting element having any of the above-described structures and a means which controls the light-emitting element.

Another embodiment of the present invention is a display module which includes the light-emitting element having any of the above-described structures in a display portion and a means which controls the light-emitting element.

Another embodiment of the present invention is a lighting device which includes the light-emitting element having any of the above-described structures.

Another embodiment of the present invention is a light-emitting device which includes the light-emitting element having any of the above-described structures and a means which controls the light-emitting element.

Another embodiment of the present invention is a display device which includes the light-emitting element having any of the above-described structures in a display portion and a means which controls the light-emitting element.

Another embodiment of the present invention is an electronic appliance which includes the light-emitting element having any of the above-described structures.

The light-emitting device in this specification includes an image display device using a light-emitting element. Further, the category of the light-emitting device in this specification includes a module in which a light-emitting element is provided with a connector such as an anisotropic conductive film or a tape carrier package (TCP); a module in which the end of the TCP is provided with a printed wiring board; and a module in which an IC (integrated circuit) is directly mounted on a light-emitting element by a COG (chip on glass) method. Furthermore, the category includes light-emitting devices which are used in lighting equipment or the like.

According to one embodiment of the present invention, a multicolor light-emitting element using fluorescence and phosphorescence, which has a relatively small number of layers to be formed and is advantageous for practical application, can be provided.

According to another embodiment of the present invention, a multicolor light-emitting element using fluorescence and phosphorescence, which has favorable emission efficiency, can be provided.

According to another embodiment of the present invention, a multicolor light-emitting element using fluorescence and phosphorescence, which has a relatively small number of layers to be formed, is advantageous for practical application, and has favorable emission efficiency, can be provided.

According to another embodiment of the present invention, a light-emitting device, a display device, an electronic appliance, and a lighting device each of which can be manufactured at low cost by using any of the above-described light-emitting elements can be provided.

According to another embodiment of the present invention, a light-emitting device, a display device, an electronic appliance, and a lighting device each of which has reduced power consumption by using any of the above-described light-emitting elements can be provided.

BRIEF DESCRIPTION OF DRAWINGS

FIGS. 3A and 3B are conceptual diagrams of active matrix light-emitting devices.

FIGS. 7A, 7B1, 7B2, 7C, and 7D illustrate electronic appliances.

BEST MODE FOR CARRYING OUT THE INVENTION

Hereinafter, embodiments of the present invention will be described with reference to the accompanying drawings. Note that the present invention is not limited to the following description, and it will be easily understood by those skilled in the art that various changes and modifications can be made without departing from the spirit and scope of the present invention. Therefore, the invention should not be construed as being limited to the description in the embodiments below.

(Embodiment 1)

Figure 1A:
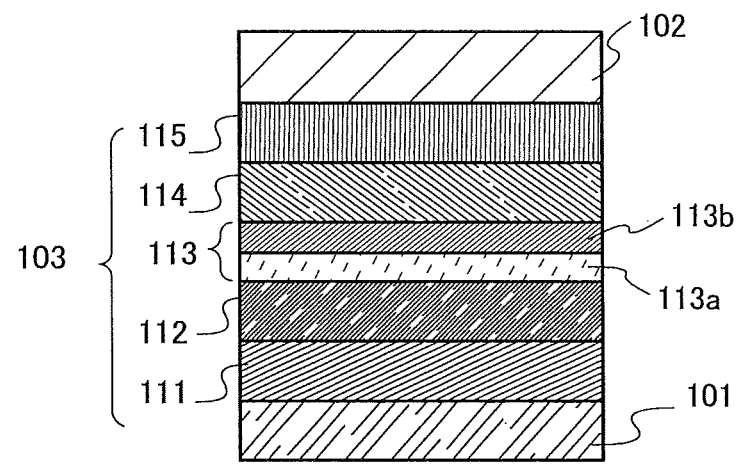
FIGS. 1A and 1B are conceptual diagrams of light-emitting elements.

FIG. 1A is a diagram illustrating a light-emitting element of one embodiment of the present invention. The light-emitting element includes at least a pair of electrodes (a first electrode 101 and a second electrode 102) and an EL layer 103 including a light-emitting layer 113. In the light-emitting layer 113, a first light-emitting layer 113a and a second light-emitting layer 113b are stacked in contact with each other.

FIG. 1A also illustrates a hole-injection layer 111, a hole-transport layer 112, an electron-transport layer 114, and an electron-injection layer 115 in the EL layer 103. However, this stacked-layer structure is an example, and the structure of the EL layer 103 in the light-emitting element of one embodiment of the present invention is not limited thereto. Note that in FIG. 1A, the first electrode 101 functions as an anode, and the second electrode 102 functions as a cathode.

The first light-emitting layer 113a contains a first organic compound and a second organic compound. The second light-emitting layer 113b contains a third organic compound and a phosphorescent compound. The light-emitting element of this embodiment is characterized in that a combination of the first organic compound and the second organic compound forms a first exciplex. This structure enables fluorescence originating from the first exciplex to be efficiently obtained from the first light-emitting layer, and phosphorescence originating from the phosphorescent compound to be efficiently obtained from the second light-emitting layer.

It is generally known that when a fluorescent layer and a phosphorescent layer are stacked to obtain light emission, the triplet excited energy of a phosphorescent compound is transferred to a host material occupying a large part of the fluorescent layer, resulting in a significant decrease in emission efficiency. The reason is as follows: since a substance having a condensed aromatic ring skeleton, typified by anthracene or the like, is generally used as a host material, the triple excited level is low and the triplet excited energy generated in the phosphorescent layer is transferred, resulting in nonradiative quenching of the triplet excited energy. At present, it is difficult to obtain a desired emission wavelength and favorable element characteristics and reliability by using a substance other than the substance having a condensed aromatic ring skeleton; thus, it is difficult to obtain a light-emitting layer which includes a stack a fluorescent layer and a phosphorescent layer and has favorable characteristics.

The exciplex used in the first light-emitting layer of this embodiment is an excited state formed from two kinds of substances. In the case of photoexcitation, the exciplex is formed in such a manner that one molecule in an excited state takes in the other substance in a ground state. Thus, when the exciplex emits light to be in a ground state, it returns to be the original substance. For this reason, a ground state of the exciplex does not exist, and energy transfer between the exciplexes or energy transfer from the other substance to the exciplex does not occur in principle. This means that energy transfer to the first exciplex does not occur in principle, so that in the light-emitting element of this embodiment, energy transfer between the first light-emitting layer and the second light-emitting layer is controlled and both fluorescence and phosphorescence can be easily obtained.

When compounds whose triplet excited levels are higher than that of the phosphorescent compound (or the phosphorescent compound and the third organic compound, or the phosphorescent compound, the third organic compound, and the fourth organic compound) in the second light-emitting layer 113b are used as the first organic compound and the second organic compound in the first light-emitting layer 113a, energy transfer from the triplet excited level of the phosphorescent compound (or the phosphorescent compound and the third organic compound, or the phosphorescent compound, the third organic compound, and the fourth organic compound) to one or both of the first organic compound and the second organic compound in a ground state in the first light-emitting layer 113a can also be controlled.

Organic compounds which are brought into an excited state quickly form an exciplex; thus, energy transfer from organic compounds in excited states, which have not yet formed an exciplex, is less likely to occur.

From this, in the light-emitting element of this embodiment, energy transfer through a host material occupying a large part of the light-emitting layer is less likely to occur, and both fluorescence of the first exciplex in the first light-emitting layer and phosphorescence of the phosphorescent compound in the second light-emitting layer can be easily obtained.

The first exciplex is formed from the first organic compound and the second organic compound to obtain light emission from the exciplex, whereby fluorescence with a desired wavelength can be obtained in spite of the use of the substance with a high triplet excited level. Further, since light emission from the exciplex originates from a difference in energy between the shallower HOMO level of the HOMO levels of the two compounds and the deeper LUMO level of the LUMO levels of the two compounds, desired light emission can be easily obtained by changing the combination of the first organic compound and the second organic compound.

A fluorescent substance may be further contained as a dopant in the first light-emitting layer 113a up to several weight percent (specifically, 0.01 wt % to 5 wt %, preferably 0.01 wt % to 1 wt %). The above-described amount does not cause energy transfer through the fluorescent substance, and energy transfer through a host material is controlled by the exciplex; thus, both fluorescence from the fluorescent substance and phosphorescence from the phosphorescent compound can be achieved. Further, the energy is transferred from the first exciplex to the fluorescent substance with a high fluorescent quantum yield, whereby the emission efficiency can be improved. As described above, since the singlet excited level and the triplet excited level of the exciplex formed in the first light-emitting layer are close to each other, reverse intersystem crossing from the triplet excited level to the singlet excited level easily occurs. That is, part of the triplet excited state can be converted into the singlet excited state; thus, the proportion of the singlet excited state is higher than that in the conventional case (25%). Thus, the energy of the singlet excited state with the increased proportion is transferred to the fluorescent substance, whereby the light-emitting element can have higher emission efficiency than a light-emitting element using a normal fluorescent substance. As described above, a material having a function of generating the singlet excited state from the triplet excited state (the exciplex) is different from a material having a function of efficiently obtaining light emission from the singlet excited state (the fluorescent compound, which is a dopant), whereby high emission efficiency can be easily obtained. Further, since the light-emitting substance is used as the dopant, quenching or a chemical reaction due to an impurity can be prevented, leading to a long lifetime.

Note that a fourth organic compound may be further contained in the second light-emitting layer 113b so that the combination of the third organic compound and the fourth organic compound form a second exciplex. Such a structure of the second light-emitting layer 113b enables energy transfer between the light-emitting layers to be further controlled. In addition, as described later, energy transfer from the second exciplex to the phosphorescent compound can be enhanced.

Although there is no limitation on the combination of the first organic compound and the second organic compound and the combination of the third organic compound and the fourth organic compound as long as an exciplex can be formed, one organic compound is preferably a material having a hole-transport property and the other organic compound is preferably a material having an electron-transport property. This is because in this case, a donor-acceptor excited state is easily formed, which allows an exciplex to be efficiently formed. In the case where the combination of the first organic compound and the second organic compound and the combination of the third organic compound and the fourth organic compound are each a combination of the material having a hole-transport property and the material having an electron-transport property, the carrier balance can be easily controlled depending on the mixture ratio. Specifically, the ratio of the material having a hole-transport property to the material having an electron-transport property is preferably 1:9 to 9:1.

Since the carrier balance can be easily controlled in the light-emitting element having the above-described structure, a recombination region can also be easily adjusted. In the light-emitting element of this embodiment, the recombination region is preferably formed in the vicinity of an interface between the first light-emitting layer and the second light-emitting layer. As described above, the light-emitting element of this embodiment has a structure capable of controlling energy transfer between the light-emitting layers; thus, the recombination region formed in the vicinity of the interface between the first light-emitting layer and the second light-emitting layer enables excited energy to be distributed to both of the light-emitting layers in a balanced manner. In terms of an even distribution of the excited energy to these light-emitting layers, the recombination region is more preferably formed in the vicinity of the interface between the two light-emitting layers. In order to form the recombination region of carriers in the vicinity of the interface between the first light-emitting layer 113a and the second light-emitting layer 113b, one of the first light-emitting layer 113a and the second light-emitting layer 113b, which is closer to the anode than the other light-emitting layer, is made to be a hole-transport layer, and the other, which is closer to the cathode than the one light-emitting layer, is made to be an electron-transport layer. Note that the recombination region can be adjusted easily by adjusting the ratio of the material having a hole-transport property to the material having an electron-transport property. The layer may contain a large amount of material having a hole-transport property to be a hole-transport layer; the layer may contain a large amount of material having an electron-transport property to be an electron-transport layer. Note that the emission color can be easily adjusted by adjusting the ratio of the material having a hole-transport property to the material having an electron-transport property.

The combination of the first organic compound and the second organic compound may be the same as or different from the combination of the third organic compound and the fourth organic compound. When the combinations are the same (i.e., the first exciplex is the same as the second exciplex), energy transfer between the first light-emitting layer and the second light-emitting layer can be further controlled. In addition, since fewer kinds of materials are used, the light-emitting element is advantageous in terms of cost and is put into practical application more easily. Moreover, a carrier injection barrier at the interface between the first light-emitting layer and the second light-emitting layer can be lowered, which contributes to a long lifetime of the element.

Needless to say, the first exciplex may be different from the second exciplex. It is preferable to select the second exciplex having an emission wavelength matching an absorption wavelength of the phosphorescent compound as described later for higher emission efficiency of the phosphorescent compound. Although there is high probability that the first exciplex is different from the second exciplex when such selection is made, energy transfer between the exciplexes does not occur in principle; thus, energy transfer between the first light-emitting layer and the second light-emitting layer can be suppressed, so that both fluorescence and phosphorescence can be easily obtained. In addition, the light-emitting element can have higher emission efficiency.

Note that in the light-emitting element, light emitted from the first light-emitting layer preferably has a peak on the shorter wavelength side than light emitted from the second light-emitting layer. The luminance of a light-emitting element using the phosphorescent substance emitting light with a short wavelength tends to degrade quickly. In view of the above, fluorescence with a short wavelength is used, so that a light-emitting element with less degradation of luminance can be provided. Note that in the light-emitting element of one embodiment of the present invention, the first light-emitting layer which is a fluorescent layer and the second light-emitting layer which is a phosphorescent layer are stacked in contact with each other; thus, the light-emitting element has a small number of layers included in an EL layer, is advantageous in terms of cost, and is suitable for mass production. Moreover, although the fluorescent layer and the phosphorescent layer are in contact with each other, deactivation of the triplet excited level is less likely to occur owing to the use of the above-described exciplex; thus, both phosphorescence and fluorescence can be obtained.

Here, it is preferable that the first exciplex efficiently exhibit reverse intersystem crossing from the triplet excited level to the singlet excited level. Since the exciplex is in a state with a small energy difference between the singlet excited state and the triplet excited state, reverse intersystem crossing from the triplet excited level to the singlet excited level easily occurs. In other words, delayed fluorescence is easily emitted. The use of the exciplex from which delayed fluorescence is efficiently obtained for the first light-emitting layer enables also the triplet excited state to be converted into light emission; thus, the light-emitting element can have higher emission efficiency than in the case of using a normal fluorescent substance. Note that the delayed fluorescence here includes one exhibited and amplified by some heating (including self heat generation) (what is called thermally activated delayed fluorescence (TADF)). The delayed fluorescence is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV. A structure using an exciplex having the above-described relation is preferable.

Further, in the light-emitting element of this embodiment, the first light-emitting layer and the second light-emitting layer are made to emit light with different emission wavelengths, so that the light-emitting element can be a multi-color light-emitting element. The emission spectrum of the light-emitting element is formed by combining light having different emission peaks, and thus has at least two peaks.

Such a light-emitting element is suitable for obtaining white light emission. When the first light-emitting layer and the second light-emitting layer emit light of complementary colors, white light emission can be obtained. The white light-emitting element utilizes phosphorescence, has a smaller number of layers to be formed than a stack-type light-emitting element, and can be provided at low cost in spite of having high emission efficiency. In addition, light emitted from the exciplex which efficiently exhibits delayed fluorescence is utilized as light with a short wavelength, whereby the light-emitting element can have high emission efficiency and a long lifetime.

Here, for obtaining a light-emitting element having high emission efficiency, energy transfer to the phosphorescent substance in the second light-emitting layer is considered. In this explanation, a substance which supplies energy to the phosphorescent substance is referred to as a host material. Carrier recombination occurs in both the host material and the phosphorescent substance; thus, efficient energy transfer from the host material to the phosphorescent substance is needed to increase emission efficiency. As mechanisms of the energy transfer from the host material to the phosphorescent substance, two mechanisms of Dexter mechanism and Förster mechanism have been proposed.

The efficiency of energy transfer from the host molecule to the guest molecule (energy transfer efficiency $\Phi_{ET}$) is expressed by the formula given below. In the formula, $k_r$ denotes a rate constant of a light-emission process (fluorescence in energy transfer from a singlet excited state, and phosphorescence in energy transfer from a triplet excited state), $k_n$ denotes a rate constant of a non-light-emission process (thermal deactivation or intersystem crossing), and $\tau$ denotes a measured lifetime of an excited state.

$$\Phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad \text{[FORMULA 1]}$$

First, according to the formula given above, it is understood that the energy transfer efficiency $\Phi_{ET}$ can be increased by significantly increasing the rate constant $k_{h^* \to g}$ of energy transfer as compared with another competing rate constant $k_r + k_n$ (=1/$\tau$). Then, in order to increase the rate constant $k_{h^* \to g}$ of energy transfer, in Förster mechanism and Dexter mechanism, it is preferable that an emission spectrum of a host molecule (a fluorescent spectrum in energy transfer from a singlet excited state, and a phosphorescent spectrum in energy transfer from a triplet excited state) largely overlap with an absorption spectrum of a guest molecule (a phosphorescent substance in the second light-emitting layer).

Here, a longest-wavelength-side (lowest-energy-side) absorption band in the absorption spectrum of the phosphorescent substance is important in considering the overlap between the emission spectrum of the host molecule and the absorption spectrum of the phosphorescent substance.

In an absorption spectrum of the phosphorescent substance, an absorption band that is considered to contribute to light emission most greatly is at an absorption wavelength corresponding to direct transition from a ground state to a triplet excitation state and a vicinity of the absorption wavelength, which is on the longest wavelength side. Therefore, it is probably preferable that the emission spectrum (a fluorescent spectrum and a phosphorescent spectrum) of the host material overlap with the absorption band on the longest wavelength side in the absorption spectrum of the phosphorescent substance.

For example, most organometallic complexes, especially light-emitting iridium complexes, have a broad absorption band at around 500 nm to 600 nm as the absorption band on the longest wavelength side. This absorption band is mainly based on a triplet MLCT (metal to ligand charge transfer) transition. Note that the absorption band probably also includes absorptions based on a triplet $\pi$-$\pi^*$ transition and a singlet MLCT transition and these absorptions probably overlap each other to form a broad absorption band on the longest wavelength side in the absorption spectrum. Therefore, as described above, it is preferable that the broad absorption band on the longest wavelength side largely overlap with the emission spectrum of the host material when an organometallic complex (especially iridium complex) is used as the guest material.

Here, first, energy transfer from a host material in a triplet excited state will be considered. From the above-described discussion, it is preferable that, in energy transfer from a triplet excited state, the phosphorescent spectrum of the host material and the absorption band on the longest wavelength side of the phosphorescent substance largely overlap each other.

However, a question here is energy transfer from the host molecule in the singlet excited state. In order to efficiently perform not only energy transfer from the triplet excited state but also energy transfer from the singlet excited state, it is clear from the above-described discussion that the host material needs to be designed such that not only its phosphorescent spectrum but also its fluorescent spectrum overlaps with the absorption band on the longest wavelength side of the guest material. In other words, unless the host material is designed so as to have its fluorescent spectrum in a position similar to that of its phosphorescent spectrum, it is not possible to achieve efficient energy transfer from the host material in both the singlet excited state and the triplet excited state.

However, in general, the singlet excited level differs greatly from the triplet excited level (singlet excited level>triplet excited level); therefore, the fluorescence emission wavelength also differs greatly from the phosphorescence emission wavelength (fluorescence emission wavelength<phosphorescence emission wavelength). For example, 4,4'-di(N-carbazolyl)biphenyl (abbreviation: CBP), which is commonly used as a host molecule in a light-emitting element including a phosphorescent substance, has a phosphorescent spectrum at around 500 nm and has a fluorescent spectrum at around 400 nm, which are largely different by about 100 nm. This example also shows that it is extremely difficult to design a host material so as to have its fluorescent spectrum in a position similar to that of its phosphorescent spectrum.

Further, the energy level of the singlet excited level of a certain substance is higher than that of the triplet excited level; thus, the triplet excited level of a host material whose fluorescence spectrum corresponds to a wavelength close to an absorption spectrum of a guest material on the longest wavelength side is lower than the triplet excited level of the guest material.

However, an exciplex is used as a host material in the second light-emitting layer of the light-emitting element of this embodiment. Fluorescence from the exciplex has a spectrum on the longer wavelength side than a fluorescence spectrum of the third organic compound alone or the fourth organic compound alone. Therefore, energy transfer from a singlet excited state can be maximized while the triplet excited levels of the third organic compound alone and the fourth organic compound alone are kept higher than the triplet excited level of the guest material. In addition, the exciplex is in a state where the triplet excited level and the singlet excited level are close to each other; therefore, the fluorescence spectrum and the phosphorescence spectrum exist at substantially the same position. Accordingly, both the fluorescence spectrum and the phosphorescence spectrum of the exciplex can overlap largely with an absorption corresponding to transition of the guest molecule from the singlet ground state to the triplet excited state (a broad absorption band in an absorption spectrum of the guest molecule, which exists on the longest wavelength side); thus, the light-emitting element can have high energy transfer efficiency.

As described above, the lowest-energy-side absorption band of the phosphorescent substance in the second light-emitting layer overlaps with the emission spectrum of the second exciplex in the second light-emitting layer, whereby the light-emitting element can have more favorable emission efficiency. Further, the difference in equivalent energy values between peak wavelengths of the lowest-energy-side absorption band of the phosphorescent substance and the emission spectrum of the second exciplex is preferably less than or equal to 0.2 eV, in which case the overlap between the absorption band and the emission spectrum is large.

In FIG. A, the first light-emitting layer 113a is formed on the side where the first electrode 101 functioning as the anode is formed and the second light-emitting layer 113b is formed on the side where the second electrode 102 functioning as the cathode is formed. However, the stacking order may be reversed.

(Embodiment 2)

In this embodiment, a detailed example of the structure of the light-emitting element described in Embodiment 1 is described below with reference to FIG. 1A.

A light-emitting element in this embodiment includes, between a pair of electrodes, an EL layer including a plurality of layers. In this embodiment, the light-emitting element includes the first electrode 101, the second electrode 102, and the EL layer 103 provided between the first electrode 101 and the second electrode 102. Note that in this embodiment, the first electrode 101 functions as an anode and the second electrode 102 functions as a cathode. In other words, when voltage is applied between the first electrode 101 and the second electrode 102 so that the potential of the first electrode 101 is higher than that of the second electrode 102, light emission can be obtained.

Since the first electrode 101 functions as the anode, the first electrode 101 is preferably formed using any of metals, alloys, electrically conductive compounds with a high work function (specifically, a work function of 4.0 eV or more), mixtures thereof, and the like. Specific examples are indium oxide-tin oxide (ITO: indium tin oxide), indium oxide-tin oxide containing silicon or silicon oxide, indium oxide-zinc oxide, indium oxide containing tungsten oxide and zinc oxide (IWZO), and the like. Such conductive metal oxide films are usually formed by a sputtering method, but may also be formed by application of a sol-gel method or the like. In an example of the formation method, indium oxide-zinc oxide is deposited by a sputtering method using a target obtained by adding 1 wt % to 20 wt % of zinc oxide to indium oxide. Further, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), or the like can be used. Graphene can also be used. Note that when a composite material described later is used for a layer which is in contact with the first electrode 101 in the EL layer 103, an electrode material can be selected regardless of its work function.

There is no particular limitation on the stacked structure of the EL layer 103 as long as the light-emitting layer 113 has the structure described in Embodiment 1. For example, the EL layer 103 can be formed by combining a hole-injection layer, a hole-transport layer, the light-emitting layer, an electron-transport layer, an electron-injection layer, a carrier-blocking layer, an intermediate layer, and the like as appropriate. In this embodiment, the EL layer 103 has a structure in which a hole-injection layer 111, a hole-transport layer 112, a light-emitting layer 113, an electron-transport layer 114, and an electron-injection layer 115 are stacked in this order over the first electrode 101. Materials for the layers are specifically given below.

The hole-injection layer 111 is a layer containing a substance having a high hole-injection property. Molybdenum oxide, vanadium oxide, ruthenium oxide, tungsten oxide, manganese oxide, or the like can be used. Alternatively, the hole-injection layer 111 can be formed using a phthalocyanine-based compound such as phthalocyanine (abbreviation: $H_2Pc$) or copper phthalocyanine (abbreviation: CuPc), an aromatic amine compound such as 4,4'-bis [N-(4-diphenylaminophenyl)-N-phenylamino]biphenyl (abbreviation: DPAB) or N,N'-bis{4-[bis(3-methylphenyl) amino]phenyl}-N,N-diphenyl-(1,1'-biphenyl)-4,4'-diamine (abbreviation: DNTPD), a high molecular compound such as poly(3,4-ethylenedioxythiophene)/poly(styrenesulfonic acid) (PEDOT/PSS), or the like.

Alternatively, a composite material in which a substance having a hole-transport property contains a substance having an acceptor property can be used for the hole-injection layer 111. Note that the use of such a substance having a hole-transport property which contains a substance having an acceptor property enables selection of a material used to form an electrode regardless of its work function. In other words, besides a material having a high work function, a material having a low work function can also be used for the first electrode 101. As the acceptor substance, 7,7,8,8-tetracyano-2,3,5,6-tetrafluoroquinodimethane (abbreviation: $F_4$-TCNQ), chloranil, and the like can be given. In addition, a transition metal oxide can be given. In addition, oxides of metals belonging to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is especially preferable because it is stable in the air, has a low hygroscopic property, and is easily handled.

As the substance having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the organic compound used for the composite material is preferably an organic compound having a high hole-transport property. Specifically, a substance having a hole mobility of $10^{-6}$ cm$^2$/Vs or higher is preferably used. Organic compounds which can be used as the substance having a hole-transport property in the composite material are specifically given below.

Examples of the aromatic amine compound include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1,1'-biphenyl]-4,4'-diamine (abbreviation: DNTPD), 1,3,5-tris [N-(4-diphenylaminophenyl)-N-phenylamino]benzene (abbreviation: DPA3B), and the like.

As carbazole derivatives which can be used for the composite material, the following can be given specifically: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

In addition, examples of the carbazole derivatives which can be used for the composite material include 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon which can be used for the composite material include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis (4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Besides, pentacene, coronene, or the like can also be used. As these aromatic hydrocarbons given here, it is preferable that an aromatic hydrocarbon having a hole mobility of $1 \times 10^{-6}$ cm$^2$/Vs or more and having 14 to 42 carbon atoms be used.

The aromatic hydrocarbon which can be used for the composite material may have a vinyl skeleton. Examples of the aromatic hydrocarbon having a vinyl group include 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Moreover, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), or poly[N,N'-bis(4-butylphenyl)-N,N'-bis(phenyl)benzidine (abbreviation: poly-TPD) can also be used.

By providing a hole-injection layer, a high hole-injection property can be achieved to allow a light-emitting element to be driven at a low voltage.

The hole-transport layer 112 is a layer containing a substance having a hole-transport property. Examples of the substance having a hole-transport property include aromatic amine compounds such as 4,4'-bis[N-(1-naphthyl)-N-phenylamino]biphenyl (abbreviation: NPB), N,N'-bis(3-methylphenyl)-N,N-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), and the like. The substances given here have high hole-transport properties and are mainly ones having a hole mobility of $10^{-6}$ cm$^2$/Vs or more. An organic compound given as an example of the substance having a hole-transport property in the composite material described above can also be used for the hole-transport layer 112. Moreover, a high molecular compound such as poly(N-vinylcarbazole) (abbreviation: PVK) or poly(4-vinyltriphenylamine) (abbreviation: PVTPA) can also be used. Note that the layer containing a substance having a hole-transport property is not limited to a single layer, and may be a stack of two or more layers containing any of the above substances.

The light-emitting layer 113 has the structure of the light-emitting layer 113, which is described in Embodiment 1. In other words, the first light-emitting layer 113a and the second light-emitting layer 113b are stacked in this order over the first electrode. The first light-emitting layer 113a contains a first organic compound and a second organic compound. The second light-emitting layer 113b contains a third organic compound, a fourth organic compound, and a phosphorescent compound. The light-emitting element of this embodiment is characterized in that the combination of the first organic compound and the second organic compound forms a first exciplex and the combination of the third organic compound and the fourth organic compound forms a second exciplex. The first exciplex exhibits fluorescence and the second exciplex provides energy for the phosphorescent compound, so that both fluorescence and phosphorescence can be efficiently obtained from the first light-emitting layer and the second light-emitting layer, respectively.

Examples of materials which can be used as the phosphorescent compound in the second light-emitting layer 113b are given below.

The examples include an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), or tris[4-(3-biphenyl)-5-isopropyl-3-phenyl-4H-1,2,4-triazolato]iridium(III) (abbreviation: Ir(iPrptz-3b)$_3$); an organometallic iridium complex having a 1H-triazole skeleton, such as tris[3-methyl-1-(2-methylphenyl)-5-phenyl-1H-1,2,4-triazolato]iridium(III) (abbreviation: Ir(Mptz1-mp)$_3$) or tris(1-methyl-5-phenyl-3-propyl-1H-1,2,4-triazolato)iridium(III) (abbreviation: Ir(Prptz1-Me)$_3$); an organometallic iridium complex having an imidazole skeleton, such as fac-tris[1-(2,6-diisopropylphenyl)-2-phenyl-1H-imidazole]iridium(III) (abbreviation: Ir(iPrpmi)$_3$), or tris[3-(2,6-dimethylphenyl)-7-methylimidazo[1,2-f]phenanthridinato]iridium(III) (abbreviation: Ir(dmpimpt-Me)$_3$); and an organometallic iridium complex in which a phenylpyridine derivative having an electron-withdrawing group is a ligand, such as bis[2-(4',6'-difluorophenyl)pyridinato-N,C$^{2'}$]iridium(III) tetrakis(1-pyrazolyl) borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), or bis[2-(4',6'-difluorophenyl)pyridinato-N,C$^{2'}$]iridium(III) acetylacetonate (abbreviation: FIr(acac)). These are compounds emitting blue phosphorescence and have an emission peak at 440 nm to 520 nm.

Other examples include organometallic iridium complexes having pyrimidine skeletons, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)], (acetylacetonato)bis(6-tert-butyl-4-phenylpyrimidinato)iridium(III) (abbreviation: Ir(tBuppm)$_2$(acac)), (acetylacetonato)bis[6-(2-norbornyl)-4-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), and (acetylacetonato)bis(4,6-diphenylpyrimidinato)iridium(III) (abbreviation: Ir(dppm)$_2$(acac)); organometallic iridium complexes having pyrazine skeletons, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having pyridine skeletons, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$acac)), bis(benzo[h]quinolinato)iridium(III) acetylacetonate (abbreviation: Ir(bzq)$_2$(acac)), tris(benzo[h]quinolinato)iridium (III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium(III) acetylacetonate (abbreviation: Ir(pq)$_2$(acac)); and a rare earth metal complex such as tris(acetylacetonato) (monophenanthroline)terbium(III) (abbreviation: Tb(acac)$_3$(Phen)). These are mainly compounds emitting green phosphorescence and have an emission peak at 500 nm to 600 nm. Note that an organometallic iridium complex having a pyrimidine skeleton has distinctively high reliability and emission efficiency and thus is especially preferable.

Other examples include (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(d1npm)$_2$(dpm)); organometallic iridium complexes having pyrazine skeletons, such as (acetylacetonato)bis(2,3,5-triphenylpyrazinato)iridium(III) (abbreviation: Ir(tppr)$_2$(acac)), bis(2,3,5-triphenylpyrazinato)(dipivaloylmethanato)iridium(III) (abbreviation: Ir(tppr)$_2$(dpm)), or (acetylacetonato)bis[2,3-bis(4-fluorophenyl)quinoxalinato]iridium(III) (abbreviation: Ir(Fdpq)$_2$(acac)); organometallic iridium complexes having pyridine skeletons, such as tris(1-phenylisoquinolinato-N,C$^{2'}$)iridium(III) (abbreviation: Ir(piq)$_3$) and bis(1-phenylisoquinolinato-N,C$^{2'}$)iridium(III)acetylacetonate (abbreviation: Ir(piq)$_2$acac); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato) (monophenanthroline)europium(III) (abbreviation: Eu(DBM)$_3$(Phen)) and tris[1-(2-thenoyl)-3,3,3-trifluoroacetonato](monophenanthroline)europium(III) (abbreviation: Eu(TTA)$_3$(Phen)). These are compounds emitting red phosphorescence and have an emission peak at 600 nm to 700 nm. Further, the organometallic iridium complex having a pyrazine skeleton can provide red light emission with favorable chromaticity.

Known phosphorescent materials, other than the phosphorescent compounds given above, may be selected and used.

Further, in the case where a fluorescent substance is contained in the first light-emitting layer 113a, known fluorescent substances may be used other than compounds given below.

Examples of the fluorescent substance include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9-phenyl-9H-fluoren-9-yl)phenyl]-N,N'-diphenyl-pyrene-1,6-diamine (abbreviation: 1,6FLPAPm), N,N'-bis(3-methylphenyl)-N,N'-bis[3-(9-phenyl-9H-fluoren-9-yl)phenyl]-pyrene-1,6-diamine (abbreviation: 1,6mMemFLPAPm), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine](abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N-diphenylquinacridone (abbreviation: DPQd), rubrene, 5,12-bis(1,1-biphenyl-4-yl)-6,1-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[i]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[j]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[i]quinolizin-9-yl)ethenyl]-4H-pyran-4-ylidene}propanedinitrile (abbreviation: BisDCJTM). Condensed aromatic diamine compounds typified by pyrenediamine compounds such as 1,6FLPAPrn and 1,6mMemFLPAPm are particularly preferable because of their high hole-trapping properties, high emission efficiency, and high reliability.

A substance efficiently exhibiting delayed fluorescence is included in the examples of the fluorescent substance. The substance exhibiting delayed fluorescence converts part of the triplet excited state into the singlet excited state to contribute to light emission, so that emission efficiency can be improved. That is, synergy effects between the use of the fluorescent substance and the formation of the exciplex in the first light-emitting layer can be expected. As such a material, materials given below can be used.

A fullerene, a derivative thereof, an acridine derivative such as proflavine, eosin, or the like can be used. A metal-containing porphyrin such as a porphyrin containing magnesium (Mg), zinc (Zn), cadmium (Cd), tin (Sn), platinum (Pt), indium (In), or palladium (Pd) can be given. Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$(OEP)), which are shown in the following structural formulae.

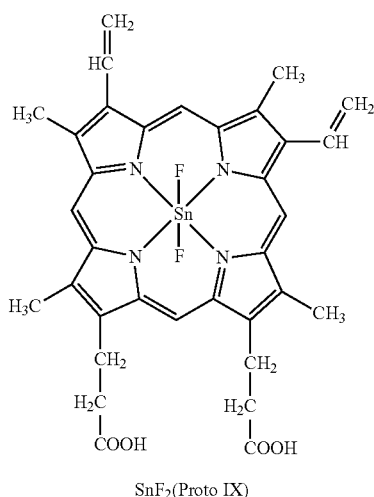
SnF₂(Proto IX)
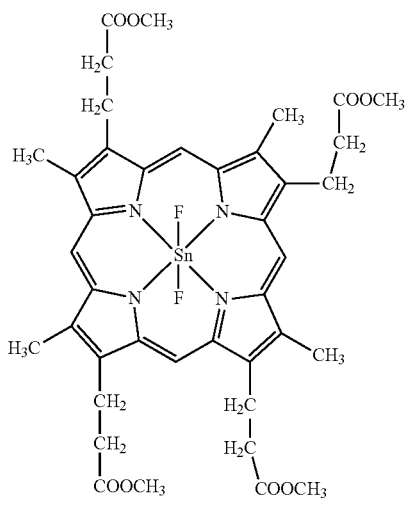
SnF₂(Copro III-4Me)
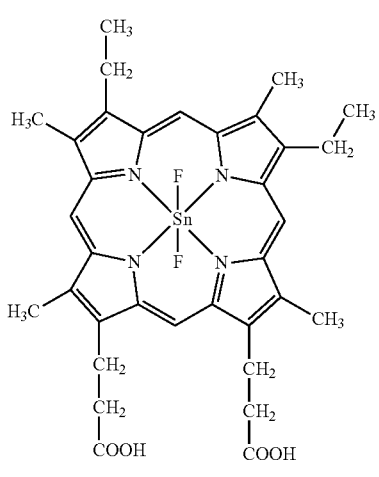
SnF₂(Meso IX)
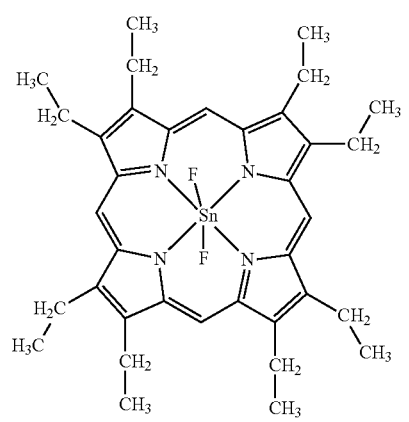
SnF₂(OEP)
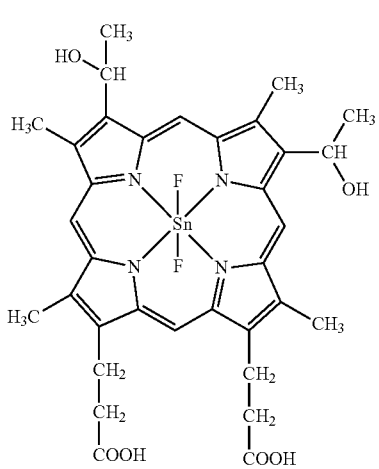
SnF₂(Hemato IX)
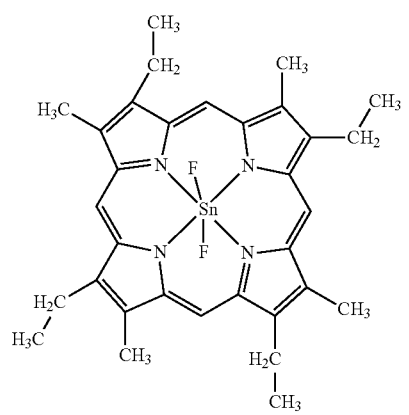
SnF₂(Etio I)

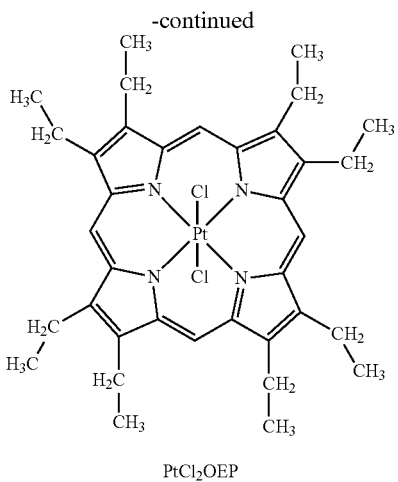

PtCl₂OEP

Alternatively, as the material exhibiting thermally activated delayed fluorescence, a heterocyclic compound including a π-electron rich heteroaromatic ring and a π-electron deficient heteroaromatic ring can be used, such as 2-(biphenyl-4-yl)-4,6-bis(12-phenylindolo[2,3-α]carbazol-11-yl)-1,3,5-triazine (abbreviation: PIC-TRZ), which is shown in the structural formula given below. The heterocyclic compound is preferably used because of the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the energy difference between the $S_1$ level and the $T_1$ level becomes small.

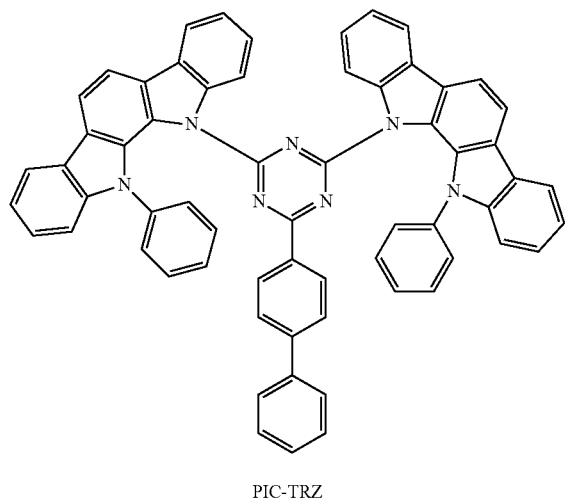 [SMILES: c1ccc(-c2ccc(-c3nc(-n4c5ccccc5c5ccc6c7ccccc7n(-c7ccccc7)c6c54)nc(-n4c5ccccc5c5ccc6c7ccccc7n(-c7ccccc7)c6c54)n3)cc2)cc1]

PIC-TRZ

There is no particular limitation on the materials which can be used as the first organic compound, the second organic compound, the third organic compound, and the fourth organic compound as long as the combination of the materials satisfies the conditions described in Embodiment 1. A variety of kinds of carrier-transport materials can be selected.

Examples of the material having an electron-transport property include a heterocyclic compound having a polyazole skeleton, such as bis(10-hydroxybenzo[h]quinolinato)beryllium(II) (abbreviation: BeBq₂), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound having a polyazole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II); a heterocyclic compound having a diazine skeleton, such as 2-[3-(dibenzothiophen-4-yl)phenyl]dibenzo[h]quinoxaline (abbreviation: 2mDBT-PDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); and a heterocyclic compound having a pyridine skeleton, such as 2-[3'-(dibenzothiophen-4-yl)biphenyl-3-yl]dibenzo[f,h]quinoline (abbreviation: 2mDBTBPDBQu-II), 3,5-bis[3-(9H-carbazol-9-yl)phenyl]pyridine (abbreviation: 35DCzPPy), or 1,3,5-tri[3-(3-pyridyl)phenyl]benzene (abbreviation: TmPyPB). Among the above materials, a heterocyclic compound having a diazine skeleton and a heterocyclic compound having a pyridine skeleton have high reliability and are thus preferable. Specifically, a heterocyclic compound having a diazine (pyrimidine or pyrazine) skeleton has a high electron-transport property to contribute to a reduction in drive voltage.

Examples of the material having a hole-transport property include a compound having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP- III), or 4-[4-(9-phenyl-9H-fluoren-9-yl)phenyl]-6-phenyldibenzothiophene (abbreviation: DBTFLP-IV); and a compound having a furan skeleton, such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, a compound having an aromatic amine skeleton and a compound having a carbazole skeleton are preferable because these compounds are highly reliable and have high hole-transport properties to contribute to a reduction in drive voltage.

Carrier-transport materials can be selected from known substances as well as from the carrier-transport materials given above. Note that as the first to fourth organic compounds, substances having a triplet level (a difference in energy between a ground state and a triplet excited state) higher than that of the phosphorescent compound are preferably selected. An exciplex to be formed exhibits light emission originating from a difference in energy between the shallower HOMO level of the HOMO levels of the two compounds to be combined and the deeper LUMO level of the LUMO levels of the two compounds to be combined; thus, the combination of the first organic compound and the second organic compound with which light emission with a desired wavelength can be achieved is selected. In addition, it is preferable that the combination of the third organic compound and the fourth organic compound be selected so that an exciplex which exhibits light emission whose wavelength overlaps with a wavelength of a lowest-energy-side absorption band of the phosphorescent compound is formed.

Further, the combination of a material having an electron-transport property as one organic compound and a material having a hole-transport property as the other organic compound is advantageous for the formation of an exciplex. The transport property of the light-emitting layer can be easily adjusted and a recombination region can be easily adjusted by changing the contained amount of each compound. The ratio of the contained amount of the material having an electron-transport property to the contained amount of the material having an electron-transport property may be 1:9 to 9:1.

The light-emitting layer 113 having the above-described structure can be formed by co-evaporation by a vacuum evaporation method, or an inkjet method, a spin coating method, a dip coating method, or the like using a mixed solution.

Note that although the structure in which the first light-emitting layer 113a is formed on the anode side and the second light-emitting layer 113b is formed on the cathode side is described in this embodiment, the stacking order may be reversed. In other words, the second light-emitting layer 113b may be formed on the anode side and the first light-emitting layer 113a may be formed on the cathode side.

Further, the second light-emitting layer 113b may be formed of two layers which have different ratios of the contained amount of the third organic compound to the contained amount of the fourth organic compound. This enables luminance degradation of the light-emitting element to be further controlled.

The other structure and effect of the light-emitting layer 113 are the same as those described in Embodiment 1. Embodiment 1 is to be referred to.

The electron-transport layer 114 is a layer containing a substance having an electron-transport property. Example of the electron-transport layer 114 is a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq), or the like. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can be used. Other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances given here have high electron-transport properties and are mainly ones having an electron mobility of $10^{-6}$ cm$^2$/Vs or more. Note that any of the above-described host materials having electron-transport properties may be used for the electron-transport layer 114.

The electron-transport layer 114 is not limited to a single layer and may be a stack of two or more layers containing any of the substances given above.

Further, a layer for controlling transport of electron carriers may be provided between the electron-transport layer and the light-emitting layer. This is a layer formed by addition of a small amount of a substance having a high electron-trapping property to the aforementioned materials having a high electron-transport property, and the layer is capable of adjusting carrier balance by retarding transport of electron carriers. Such a structure is very effective in preventing a problem (such as a reduction in element lifetime) caused when electrons pass through the light-emitting layer.

In addition, an electron-injection layer 115 may be provided in contact with the second electrode 102 between the electron-transport layer 114 and the second electrode 102. For the electron-injection layer 115, an alkali metal, an alkaline earth metal, or a compound thereof, such as lithium fluoride (LiF), cesium fluoride (CsF), or calcium fluoride (CaF$_2$), can be used. For example, a layer that is formed using a substance having an electron-transport property and contains an alkali metal, an alkaline earth metal, or a compound thereof can be used. Note that a layer that is formed using a substance having an electron-transport property and contains an alkali metal or an alkaline earth metal is preferably used as the electron-injection layer 115, in which case electron injection from the second electrode 102 is efficiently performed.

For the second electrode 102, any of metals, alloys, electrically conductive compounds, and mixtures thereof which have a low work function (specifically, a work function of 3.8 eV or less) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys thereof (e.g., MgAg and ALi), rare earth metals such as europium (Eu) and ytterbium (Yb), alloys thereof, and the like. However, when the electron-injection layer is provided between the second electrode 102 and the electron-transport layer, for the second electrode 102, any of a variety of conductive materials such as Al, Ag, ITO, or indium oxide-tin oxide containing silicon or silicon oxide can be used regardless of the work function. Films of these electrically conductive materials can be formed by a sputtering method, an inkjet method, a spin coating method, or the like.

Any of a variety of methods can be used to form the EL layer 103 regardless whether it is a dry process or a wet process. For example, a vacuum evaporation method, an ink-jet method, a spin coating method or the like may be used. A different formation method may be employed for each electrode or each layer.

In addition, the electrode may be formed by a wet method using a sol-gel method, or by a wet method using paste of a metal material. Alternatively, the electrode may be formed by a dry method such as a sputtering method or a vacuum evaporation method.

In the light-emitting element having the above-described structure, current flows due to a potential difference between the first electrode 101 and the second electrode 102, and holes and electrons recombine in the light-emitting layer 113 which contains a substance with a high light-emitting property, so that light is emitted. That is, a light-emitting region is formed in the light-emitting layer 113.

Light emission is extracted out through one or both of the first electrode 101 and the second electrode 102. Therefore, one or both of the first electrode 101 and the second electrode 102 are light-transmitting electrodes. In the case where only the first electrode 101 is a light-transmitting electrode, light emission is extracted through the first electrode 101. In the case where only the second electrode 102 is a light-transmitting electrode, light emission is extracted through the second electrode 102. In the case where both the first electrode 101 and the second electrode 102 are light-transmitting electrodes, light emission is extracted through the first electrode 101 and the second electrode 102.

The structure of the layers provided between the first electrode 101 and the second electrode 102 is not limited to the above-described structure. Preferably, a light-emitting region where holes and electrons recombine is positioned away from the first electrode 101 and the second electrode 102 so that quenching due to the proximity of the light-emitting region and a metal used for electrodes and carrier-injection layers can be prevented.

Further, in order that transfer of energy from an exciton generated in the light-emitting layer can be suppressed, preferably, the hole-transport layer and the electron-transport layer which are in contact with the light-emitting layer 113, particularly a carrier-transport layer in contact with a side closer to the light-emitting region in the light-emitting layer 113, are formed using a substance having a wider band gap than the light-emitting substance of the light-emitting layer or the emission center substance included in the light-emitting layer.

A light-emitting element in this embodiment is preferably fabricated over a substrate of glass, plastic, or the like. As the way of stacking layers over the substrate, layers may be sequentially stacked from the first electrode 101 side or sequentially stacked from the second electrode 102 side. In a light-emitting device, although one light-emitting element may be formed over one substrate, a plurality of light-emitting elements may be formed over one substrate. With a plurality of light-emitting elements as described above formed over one substrate, a lighting device in which elements are separated or a passive-matrix light-emitting device can be manufactured. A light-emitting element may be formed over an electrode electrically connected to a thin film transistor (TFT), for example, which is formed over a substrate of glass, plastic, or the like, so that an active matrix light-emitting device in which the TFT controls the drive of the light-emitting element can be manufactured. Note that there is no particular limitation on the structure of the TFT, which may be a staggered TFT or an inverted staggered TFT.

In addition, crystallinity of a semiconductor used for the TFT is not particularly limited either; an amorphous semiconductor or a crystalline semiconductor may be used. In addition, a driver circuit formed in a TFT substrate may be formed with an n-type TFT and a p-type TFT, or with either an n-type TFT or a p-type TFT.

Note that this embodiment can be combined with any of the other embodiments as appropriate.

Next, an embodiment of a light-emitting element with a structure in which a plurality of light-emitting units are stacked (hereinafter this type of light-emitting element is also referred to as a stacked element) is described with reference to FIG. 1B. In this light-emitting element, a plurality of light-emitting units are provided between a first electrode and a second electrode. One light-emitting unit has a structure similar to that of the EL layer 103, which is illustrated in FIG. 1A. In other words, the light-emitting element illustrated in FIG. 1A includes a single light-emitting unit; the light-emitting element in this embodiment includes a plurality of light-emitting units.

Figure 1B:
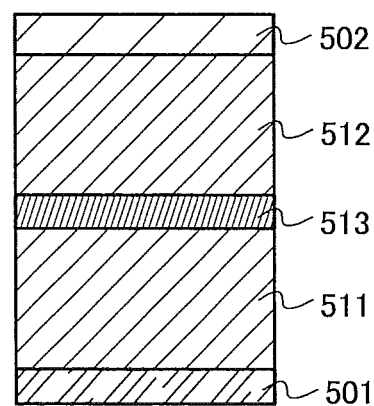

In FIG. 1B, a first light-emitting unit 511 and a second light-emitting unit 512 are stacked between a first electrode 501 and a second electrode 502, and a charge generation layer 513 is provided between the first light-emitting unit 511 and the second light-emitting unit 512. The first electrode 501 and the second electrode 502 correspond, respectively, to the first electrode 101 and the second electrode 102 illustrated in FIG. 1A, and the materials given in the description for FIG. 1A can be used. Further, the first light-emitting unit 511 and the second light-emitting unit 512 may have the same structure or different structures.

The charge generation layer 513 includes a composite material of an organic compound and a metal oxide. As the composite material of the organic compound and the metal oxide, the composite material which can be used for the hole-injection layer 111 illustrated in FIG. 1A can be used. As the organic compound, a variety of compounds such as an aromatic amine compound, a carbazole compound, aromatic hydrocarbon, and a high molecular compound (an oligomer, a dendrimer, a polymer, or the like) can be used. A compound having a hole mobility of $1 \times 10^{-6}$ cm$^2$/Vs or more is preferably used as the organic compound having a hole-transport property. Note that any other substance may be used as long as the substance has a hole-transport property higher than an electron-transport property. The composite material of the organic compound and the metal oxide can achieve low-voltage driving and low-current driving because of the superior carrier-injecting property and carrier-transporting property. Note that when a surface of a light-emitting unit on the anode side is in contact with a charge generation layer, the charge generation layer can also serve as a hole-transport layer of the light-emitting unit; thus, a hole-transport layer does not need to be formed in the light-emitting unit.

The charge generation layer 513 may have a stacked-layer structure of a layer containing the composite material of an organic compound and a metal oxide and a layer containing another material. For example, a layer containing a composite material of the organic compound and the metal oxide may be combined with a layer containing a compound of a substance selected from substances with an electron-donating property and a compound with a high electron-transport property. Moreover, a layer containing a composite material of the organic compound and the metal oxide may be combined with a transparent conductive film.

The charge generation layer 513 interposed between the first light-emitting unit 511 and the second light-emitting unit 512 may have any structure as long as electrons can be injected to a light-emitting unit on one side and holes can be injected to a light-emitting unit on the other side when a voltage is applied between the first electrode 501 and the second electrode 502. For example, in FIG. 1B, any layer can be used as the charge generation layer 513 as long as the layer injects electrons into the first light-emitting unit 511 and holes into the second light-emitting unit 512 when a voltage is applied such that the potential of the first electrode is higher than that of the second electrode.

The light-emitting element having two light-emitting units is described with reference to FIG. 1B; however, the present invention can be similarly applied to a light-emitting element in which three or more light-emitting units are stacked. With a plurality of light-emitting units partitioned by the charge generation layer between a pair of electrodes as in the light-emitting element according to this embodiment, it is possible to provide a light-emitting element which can emit light with high luminance with the current density kept low and has a long lifetime. Moreover, a light-emitting device having low power consumption, which can be driven at low voltage, can be achieved.

The light-emitting units emit light having different colors from each other, thereby obtaining light emission of a desired color in the whole light-emitting element. For example, in a light-emitting element having two light-emitting units, the emission colors of the first light-emitting unit are red and green and the emission color of the second light-emitting unit is blue, so that the light-emitting element can emit white light as the whole element.

When the above-described structure of the light-emitting layer 113 is applied to at least one of the plurality of units, the number of manufacturing steps of the unit can be reduced; thus, a multicolor light-emitting element which is advantageous for practical application can be provided.

The above-described structure can be combined with any of the structures in this embodiment and the other embodiments.

(Embodiment 3)

In this embodiment, a light-emitting device including the light-emitting element described in Embodiment 1 or 2 is described.

Figure 2A:
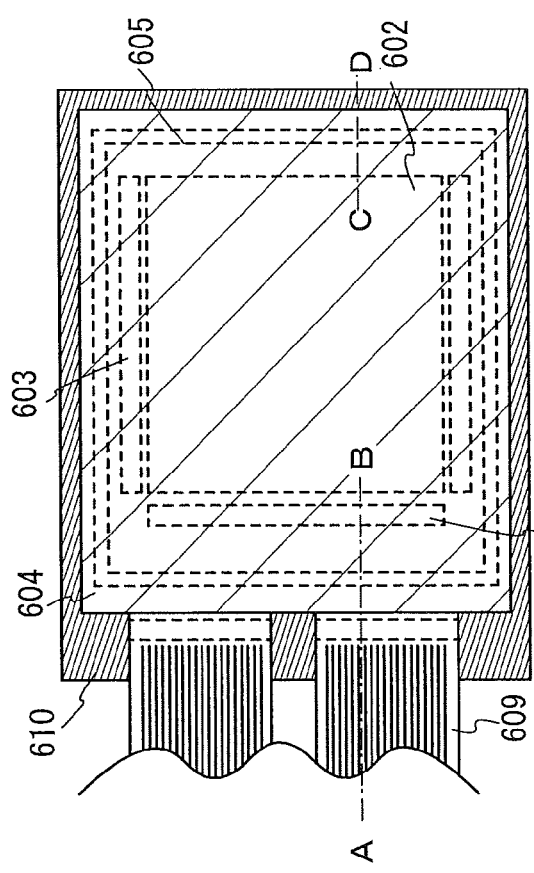
FIGS. 2A and 2B are conceptual diagrams of an active matrix light-emitting device.
Figure 2B:
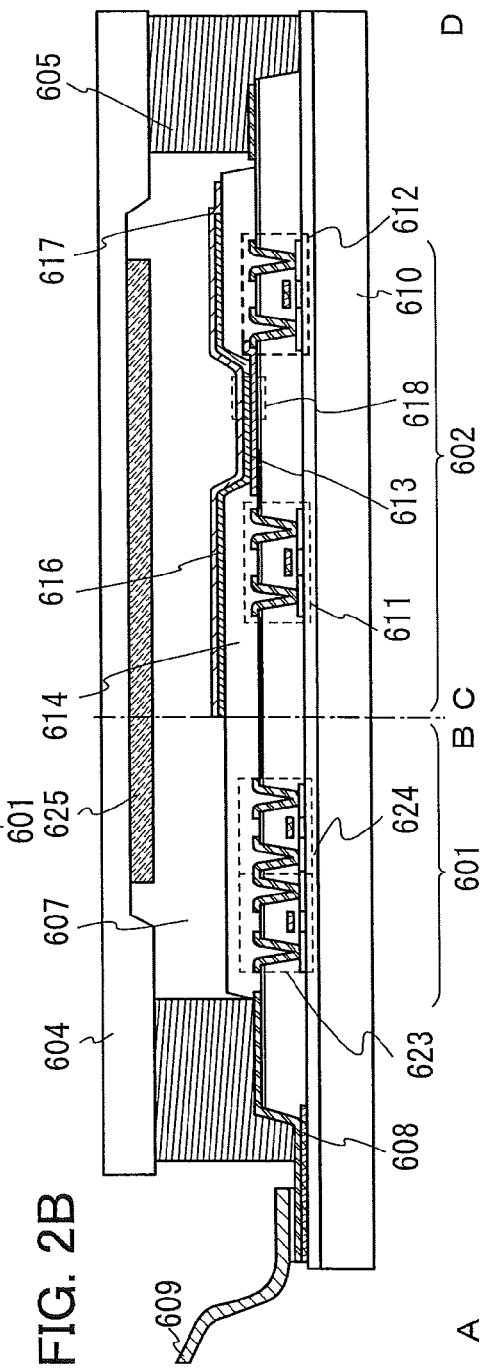

In this embodiment, the light-emitting device manufactured using the light-emitting element described in Embodiment 1 or 2 is described with reference to FIGS. 2A and 2B. Note that FIG. 2A is a top view illustrating the light-emitting device and FIG. 2B is a cross-sectional view of FIG. 2A taken along lines A-B and C-D. This light-emitting device includes a driver circuit portion (source line driver circuit) 601, a pixel portion 602, and a driver circuit portion (gate line driver circuit) 603, which are to control light emission of the light-emitting element and illustrated with dotted lines. Moreover, a reference numeral 604 denotes a sealing substrate; 605, a sealing material; and 607, a space surrounded by the sealing material 605.

Note that a lead wiring 608 is a wiring for transmitting signals to be input to the source line driver circuit 601 and the gate line driver circuit 603 and for receiving a video signal, a clock signal, a start signal, a reset signal, and the like from an FPC (flexible printed circuit) 609 serving as an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

Next, a cross-sectional structure is described with reference to FIG. 2B. The driver circuit portion and the pixel portion are formed over an element substrate 610; the source line driver circuit 601, which is a driver circuit portion, and one of the pixels in the pixel portion 602 are illustrated here.

In the source line driver circuit 601, a CMOS circuit is formed in which an n-channel TFT 623 and a p-channel TFT 624 are combined. In addition, the driver circuit may be formed with any of a variety of circuits such as a CMOS circuit, a PMOS circuit, or an NMOS circuit. Although a driver-integrated type in which the driver circuit is formed over the substrate is described in this embodiment, the present invention is not limited to this type and the driver circuit can be formed outside the substrate.

The pixel portion 602 is formed with a plurality of pixels including a switching TFT 611, a current controlling TFT 612, and a first electrode 613 connected electrically with a drain of the current controlling TFT. An insulator 614 is formed to cover the end portions of the first electrode 613. Here, the insulator 614 is formed using a positive type photosensitive acrylic resin film.

In order to improve the coverage, the insulator 614 is formed to have a curved surface with curvature at its upper or lower end portion. For example, in the case where positive photosensitive acrylic is used for a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a second electrode 617 are formed over the first electrode 613. As a material used for the first electrode 613 functioning as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

In addition, the EL layer 616 is formed by any of a variety of methods such as an evaporation method using an evaporation mask, an inkjet method, and a spin coating method. The EL layer 616 has the structure described in Embodiment 1 or 2. Further, for another material included in the EL layer 616, any of low molecular-weight compounds and polymeric compounds (including oligomers and dendrimers) may be used.

As a material used for the second electrode 617, which is formed over the EL layer 616 and functions as a cathode, a material having a low work function (e.g., Al, Mg, Li, Ca, or an alloy or a compound thereof, such as MgAg, MgIn, or AlLi) is preferably used. In the case where light generated in the EL layer 616 is transmitted through the second electrode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the light-emitting element is formed with the first electrode 613, the EL layer 616, and the second electrode 617. The light-emitting element has the structure described in Embodiment 1 or 2. In the light-emitting device of this embodiment, the pixel portion, which includes a plurality of light-emitting elements, may include both the light-emitting element described in Embodiment 1 or 2 and a light-emitting element having a different structure.

Further, the sealing substrate 604 is attached to the element substrate 610 with the sealing material 605, so that the light-emitting element 618 is provided in the space 607 surrounded by the element substrate 610, the sealing substrate 604, and the sealing material 605. The space 607 may be filled with filler, or may be filled with an inert gas (such as nitrogen or argon), or the sealing material 605. It is preferable that the sealing substrate be provided with a recessed portion and the desiccant 625 be provided in the recessed portion, in which case deterioration due to influence of moisture can be suppressed.

An epoxy-based resin or glass frit is preferably used for the sealing material 605. It is preferable that such a material do not transmit moisture or oxygen as much as possible. As the sealing substrate 604, a glass substrate, a quartz substrate, or a plastic substrate formed of fiberglass reinforced plastic (FRP), polyvinyl fluoride (PVF), polyester, acrylic, or the like can be used.

As described above, the light-emitting device which uses the light-emitting element described in Embodiment 1 or 2 can be obtained.

The light-emitting device in this embodiment is fabricated using the light-emitting element described in Embodiment 1 or 2 and thus can have favorable characteristics. Specifically, since the light-emitting element described in Embodiment 1 or 2 has favorable emission efficiency, the light-emitting device can have reduced power consumption. In addition, since the light-emitting element is easy to mass-produce, the light-emitting device can be provided at low cost.

FIGS. 3A and 3B each illustrate an example of a light-emitting device in which full color display is achieved by formation of a light-emitting element exhibiting white light emission and with the use of coloring layers (color filters) and the like. In FIG. 3A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024Q and 1024B of light-emitting elements, a partition 1025, an EL layer 1028, a second electrode 1029 of the light-emitting elements, a sealing substrate 1031, a sealing material 1032, and the like are illustrated.

In FIG. 3A, coloring layers (a red coloring layer 1034R, a green coloring layer 1034G, and a blue coloring layer 1034B) are provided on a transparent base material 1033. A black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 3A, light emitted from part of the light-emitting layer does not pass through the coloring layers, while light emitted from the other part of the light-emitting layer passes through the coloring layers. Since light which does not pass through the coloring layers is white and light which passes through any one of the coloring layers is red, blue, or green, an image can be displayed using pixels of the four colors.

FIG. 3B illustrates an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

Figure 4:
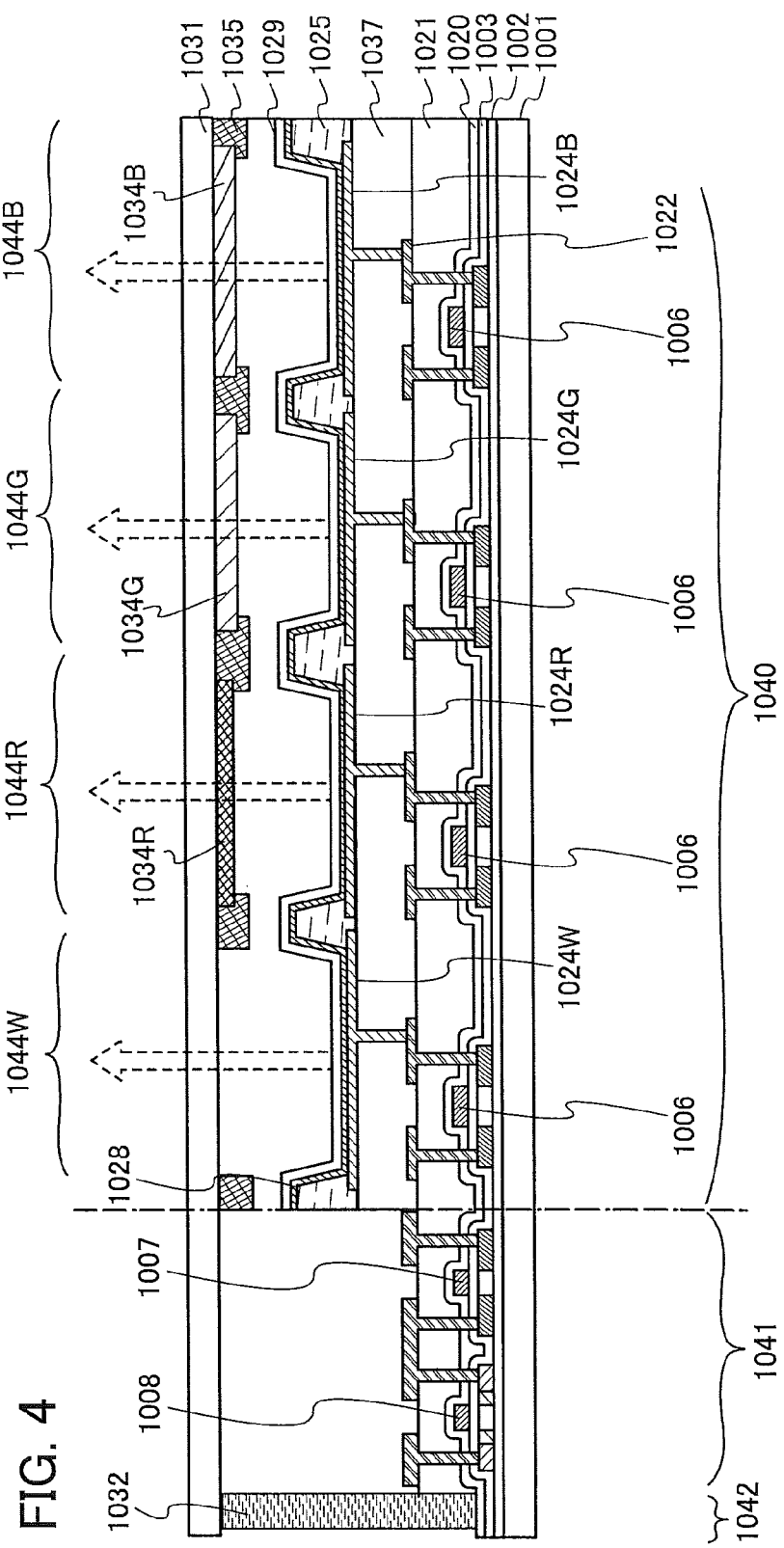
FIG. 4 is a conceptual diagram of an active matrix light-emitting device.

The above-described light-emitting device is a light-emitting device having a structure in which light is extracted from the substrate 1001 side where the TFTs are formed (a bottom emission structure), but may be a light-emitting device having a structure in which light is extracted from the sealing substrate 1031 side (a top emission structure). FIG. 4 is a cross-sectional view of a light-emitting device having a top emission structure. In this case, a substrate which does not transmit light can be used as the substrate 1001. The process up to the step of forming of a connection electrode which connects the TFT and the anode of the light-emitting element is performed in a manner similar to that of the light-emitting device having a bottom emission structure. Then a third interlayer insulating film 1037 is formed to cover an electrode 1022. This insulating film may have a planarization function. The third interlayer insulating film 1037 can be formed using a material similar to that of the second interlayer insulating film, and can alternatively be formed using any other known material.

The first electrodes 1024W, 1024R, 1024G and 1024B of the light-emitting elements each function as an anode here, but may function as a cathode. Further, in the case of a light-emitting device having a top emission structure as illustrated in FIG. 4, the first electrodes are preferably reflective electrodes. The EL layer 1028 is formed to have a structure similar to the structure of the EL layer 103, which is described in Embodiment 1 or 2, with which white light emission can be obtained.

In the case of a top emission structure as illustrated in FIG. 4, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (the black matrix) 1035 which is positioned between pixels. The coloring layers (the red coloring layer 1034R, the green coloring layer 1034G, and the blue coloring layer 1034B) and the black layer (the black matrix) may be covered with the overcoat layer 1036. Note that a light-transmitting substrate is used as the sealing substrate 1031.

Further, although an example in which full color display is performed using four colors of red, green, blue, and white is shown here, there is no particular limitation and full color display using three colors of red, green, and blue may be performed.

The light-emitting device in this embodiment is manufactured using the light-emitting element described in Embodiment 1 or 2 and thus can have favorable characteristics. Specifically, since the light-emitting element described in Embodiment 1 or 2 has favorable emission efficiency, the light-emitting device can have reduced power consumption. In addition, since the light-emitting element is easy to mass-produce, the light-emitting device can be provided at low cost.

Figure 5A:
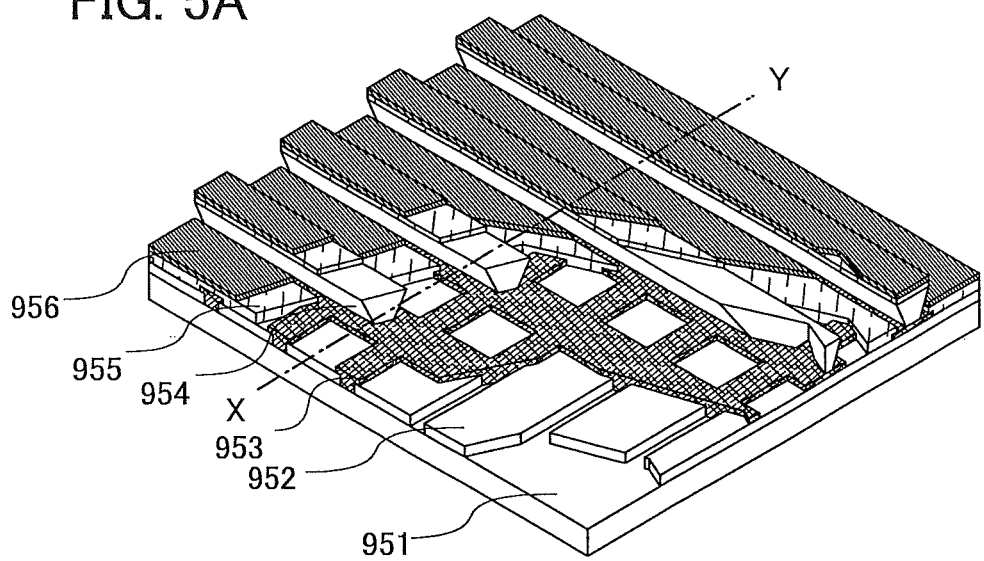
FIGS. 5A and 5B are conceptual diagrams of a passive matrix light-emitting device.
Figure 5B:
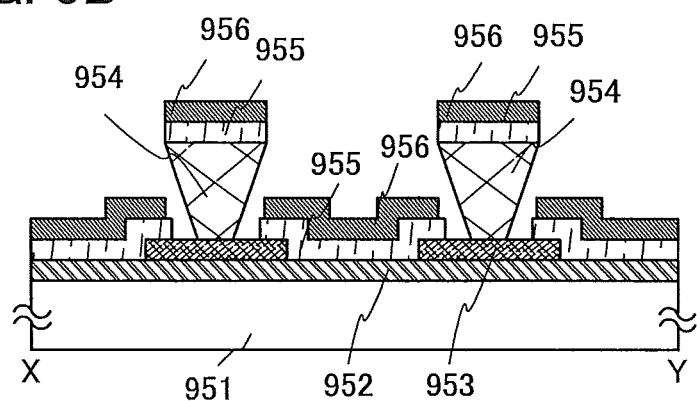

An active matrix light-emitting device is described above, whereas a passive matrix light-emitting device is described below. FIGS. 5A and 5B illustrate a passive matrix light-emitting device manufactured using the present invention. FIG. 5A is a perspective view of the light-emitting device, and FIG. 5B is a cross-sectional view of FIG. 5A taken along line X-Y. In FIGS. 5A and 5B, an EL layer 955 is provided between an electrode 952 and an electrode 956 over a substrate 951. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition wall layer 954 is trapezoidal, and the lower side (a side which is in the same direction as a plane direction of the insulating layer 953 and in contact with the insulating layer 953) is shorter than the upper side (a side which is in the same direction as the plane direction of the insulating layer 953 and not in contact with the insulating layer 953. The partition layer 954 thus provided can prevent defects in the light-emitting element due to static electricity or the like. Further, also in the passive matrix light-emitting device, the light-emitting element described in Embodiment 1 or 2, which has favorable emission efficiency, is used, so that the light-emitting device can have less power consumption. Moreover, since the light-emitting element is easy to mass-produce, the light-emitting device can be provided at low cost.

Since many minute light-emitting elements arranged in a matrix in the light-emitting device described above can each be controlled, the light-emitting device can be suitably used as a display device for displaying images.

This embodiment can be freely combined with any of other embodiments.

(Embodiment 4)

Figure 6A:
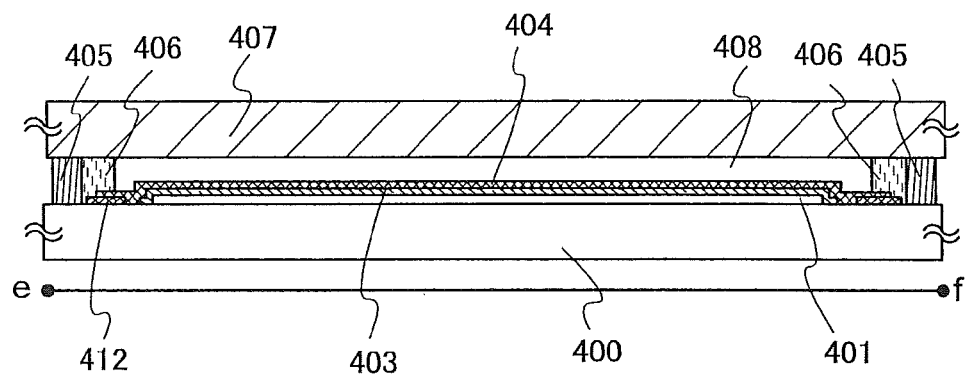
FIGS. 6A and 6B illustrate a lighting device.
Figure 6B:
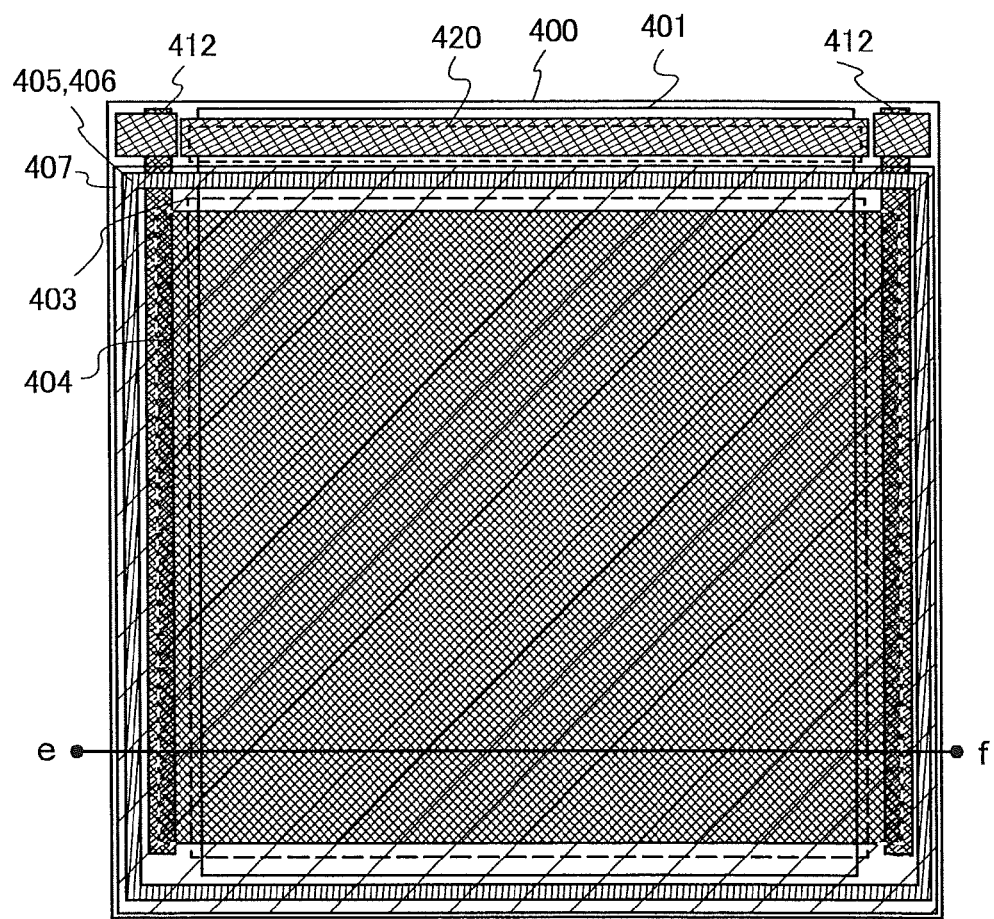

In this embodiment, an example in which the light-emitting element described in Embodiment 1 or 2 is used for a lighting device is described with reference to FIGS. 6A and 6B. FIG. 6B is a top view of the lighting device, and FIG. 6A is a cross-sectional view of FIG. 6A taken along line e-f.

In the lighting device in this embodiment, a first electrode 401 is formed over a substrate 400 which is a support and has a light-transmitting property. The first electrode 401 corresponds to the first electrode 101 in Embodiment 1. When light is extracted through the first electrode 401 side, the first electrode 401 is formed using a material having a light-transmitting property.

A pad 412 for applying voltage to a second electrode 404 is provided over the substrate 400.

An EL layer 403 is formed over the first electrode 401. The structure of the EL layer 403 corresponds to, for example, the structure of the EL layer 103 in Embodiment 1, or the structure in which the light-emitting units 511 and 512 and the charge-generation layer 513 are combined. For these structures, the description in Embodiment 1 can be referred to.

The second electrode 404 is formed to cover the EL layer 403. The second electrode 404 corresponds to the second electrode 102 in Embodiment 1. The second electrode 404 is formed using a material having high reflectance when light is extracted through the first electrode 401 side. The second electrode 404 is connected to the pad 412, whereby voltage is applied thereto.

As described above, the lighting device described in this embodiment includes a light-emitting element including the first electrode 401, the EL layer 403, and the second electrode 404. Since the light-emitting element has high emission efficiency, the lighting device in this embodiment can be a lighting device having low power consumption.

The light-emitting element having the above structure is fixed to a sealing substrate 407 with sealing materials 405 and 406 and sealing is performed, whereby the lighting device is completed. It is possible to use only either the sealing material 405 or the sealing material 406. In addition, the inner sealing material 406 (not shown in FIG. 6B) can be mixed with a desiccant which enables moisture to be adsorbed, increasing reliability.

When parts of the pad 412 and the first electrode 401 are extended to the outside of the sealing materials 405 and 406, the extended parts can serve as external input terminals. An IC chip 420 mounted with a converter or the like may be provided over the external input terminals.

As described above, since the lighting device described in this embodiment includes the light-emitting element described in Embodiment 1 or 2 as an EL element, the lighting device can be a lighting device having low power consumption. Further, the lighting device can be a lighting device driven at low voltage. The lighting device can also be inexpensive.

(Embodiment 5)

In this embodiment, examples of electronic appliances each including the light-emitting element described in Embodiment 1 or 2 are described. The light-emitting element described in Embodiment 1 or 2 has favorable emission efficiency and reduced power consumption. As a result, the electronic appliances described in this embodiment can each include a light-emitting portion having reduced power consumption. The light-emitting element described in Embodiment 1 or 2 includes a smaller number of layers to be formed; thus, the electronic appliance can be inexpensive.

Examples of the electronic appliance to which the above light-emitting element is applied include television devices (also referred to as TV or television receivers), monitors for computers and the like, cameras such as digital cameras and digital video cameras, digital photo frames, mobile phones (also referred to as cell phones or mobile phone devices), portable game machines, portable information terminals, audio playback devices, large game machines such as pachinko machines, and the like. Specific examples of these electronic appliances are described below.

FIG. 7A illustrates an example of a television device. In the television device, a display portion 7103 is incorporated in a housing 7101. Here, the housing 7101 is supported by a stand 7105. Images can be displayed on the display portion 7103, and in the display portion 7103, the light-emitting elements described in Embodiment 1 or 2 are arranged in a matrix. The light-emitting elements can have favorable emission efficiency. Further, the light-emitting elements can be driven at low voltage. Moreover, the light-emitting elements can have a long lifetime. Therefore, the television device including the display portion 7103 which is formed using the light-emitting element can have reduced power consumption. Further, the television device can be driven at low voltage. Moreover, the television device can have high reliability.

The television device can be operated with an operation switch of the housing 7101 or a separate remote controller 7110. With operation keys 7109 of the remote controller 7110, channels and volume can be controlled and images displayed on the display portion 7103 can be controlled. Further, the remote controller 7110 may be provided with a display portion 7107 for displaying data output from the remote controller 7110.

Note that the television device is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

FIG. 7B1 illustrates a computer, which includes a main body 7201, a housing 7202, a display portion 7203, a keyboard 7204, an external connection port 7205, a pointing device 7206, and the like. Note that this computer is manufactured using light-emitting elements arranged in a matrix in the display portion 7203, which are the same as that described in Embodiment 1 or 2. The computer illustrated in FIG. 7B1 may have a structure illustrated in FIG. 7B2. The computer illustrated in FIG. 7B2 is provided with a second display portion 7210 instead of the keyboard 7204 and the pointing device 7206. The second display portion 7210 is a touch screen, and input can be performed by operation of display for input on the second display portion 7210 with a finger or a dedicated pen. The second display portion 7210 can also display images other than the display for input. The display portion 7203 may also be a touchscreen. Connecting the two screens with a hinge can prevent troubles; for example, the screens can be prevented from being cracked or broken while the computer is being stored or carried. Note that this computer is manufactured using light-emitting elements arranged in a matrix in the display portion 7203, which are the same as that described in Embodiment 2 or 3. The light-emitting elements can have favorable emission efficiency. Therefore, this computer having the display portion 7203 which is formed using the light-emitting elements consumes less power.

FIG. 7C illustrates a portable game machine, which includes two housings, a housing 7301 and a housing 7302, which are connected with a joint portion 7303 so that the portable game machine can be opened or folded. The housing 7301 incorporates a display portion 7304 including the light-emitting elements each of which is described in Embodiment 1 or 2 and which are arranged in a matrix, and the housing 7302 incorporates a display portion 7305. In addition, the portable game machine illustrated in FIG. 7C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the display portion including the light-emitting elements each of which is described in Embodiment 1 or 2 and which are arranged in a matrix is used as at least either the display portion 7304 or the display portion 7305, or both, and the structure can include other accessories as appropriate. The portable game machine illustrated in FIG. 7C has a function of reading out a program or data stored in a storage medium to display it on the display portion, and a function of sharing information with another portable game machine by wireless communication. The portable game machine illustrated in FIG. 7C can have a variety of functions without limitation to the above. The portable game machine having the display portion 7304 can consume less power because the light-emitting elements used in the display portion 7304 have favorable emission efficiency. Since the light-emitting elements used in the display portion 7304 has low driving voltage, the portable game machine can also be a portable game machine having low driving voltage. Furthermore, since the light-emitting elements used in the display portion 7304 has high reliability, the portable game machine can also have high reliability.

FIG. 7D illustrates an example of a mobile phone. The mobile phone is provided with a display portion 7402 incorporated in a housing 7401, operation buttons 7403, an external connection port 7404, a speaker 7405, a microphone 7406, and the like. Note that the mobile phone 7400 has the display portion 7402 including the light-emitting elements each of which is described in Embodiment 1 or 2 and which are arranged in a matrix. The light-emitting elements can have favorable emission efficiency. In addition, the light-emitting element can have low driving voltage. Furthermore, the light-emitting element can have a long lifetime. Therefore, this mobile phone having the display portion 7402 which is formed using the light-emitting elements consumes less power. In addition, the mobile phone can have low driving voltage. Furthermore, the mobile phone can have high reliability.

When the display portion 7402 of the mobile phone illustrated in FIG. 7D is touched with a finger or the like, data can be input into the mobile phone. In this case, operations such as making a call and creating an e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be inputted. In this case, it is preferable to display a keyboard or number buttons on almost the entire screen of the display portion 7402.

When a detection device which includes a sensor for detecting inclination, such as a gyroscope or an acceleration sensor, is provided inside the mobile phone, the direction of the cellular phone (whether the cellular phone is placed horizontally or vertically for a landscape mode or a portrait mode) is determined so that display on the screen of the display portion 7402 can be automatically switched.

The screen modes are switched by touching the display portion 7402 or operating the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Note that the structure described in this embodiment can be combined with any of the structures described in Embodiments 1 to 4 as appropriate.

As described above, the application range of the light-emitting device having the light-emitting element described in Embodiment 1 or 2 is wide so that this light-emitting device can be applied to electronic appliances in a variety of fields. By using the light-emitting element described in Embodiment 1 or 2, an electronic appliance having reduced power consumption can be obtained.

Figure 8:
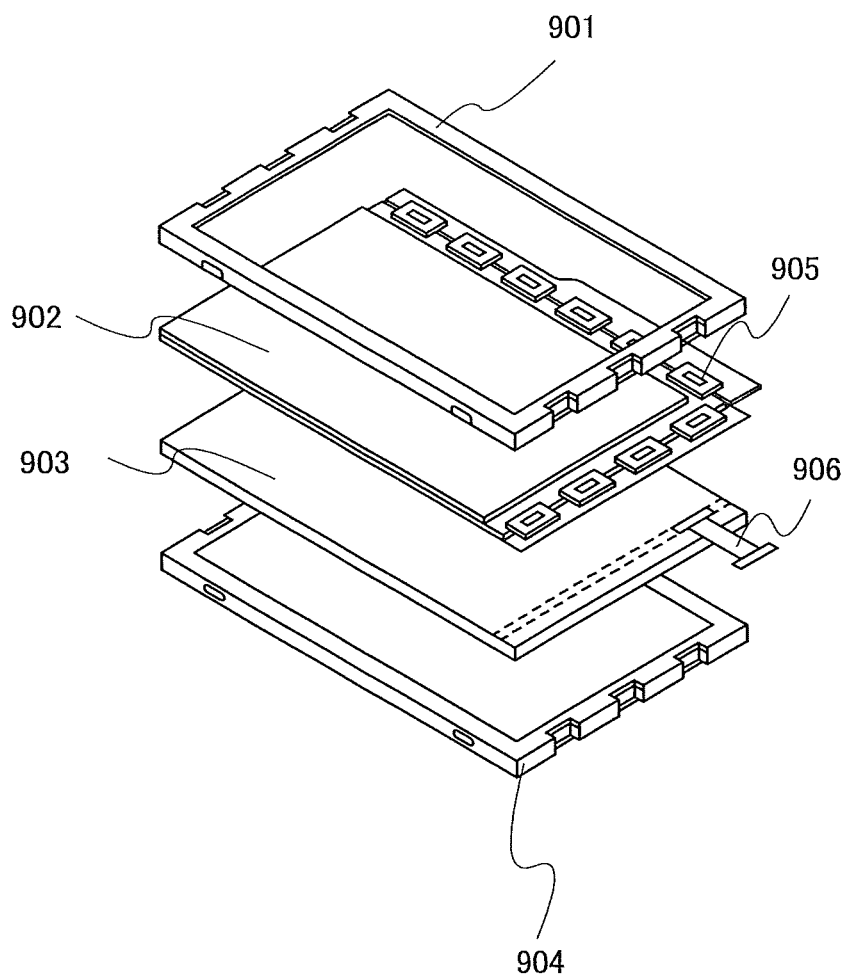
FIG. 8 illustrates a light source device.

FIG. 8 illustrates an example of a liquid crystal display device using the light-emitting element described in Embodiment 1 or 2 for a backlight. The liquid crystal display device shown in FIG. 8 includes a housing 901, a liquid crystal layer 902, a backlight unit 903, and a housing 904. The liquid crystal layer 902 is connected to a driver IC 905. The light-emitting element described in Embodiment 1 or 2 is used for the backlight unit 903, to which current is supplied through a terminal 906.

The light-emitting element described in Embodiment 1 or 2 is used for the backlight of the liquid crystal display device; thus, the backlight can have reduced power consumption. In addition, the use of the light-emitting element described in Embodiment 2 enables manufacture of a planar-emission lighting device and further a larger-area planar-emission lighting device; therefore, the backlight can be a larger-area backlight, and the liquid crystal display device can also be a larger-area device. Furthermore, the light-emitting device using the light-emitting element described in Embodiment 2 can be thinner than a conventional one; accordingly, the display device can also be thinner.

Figure 9:
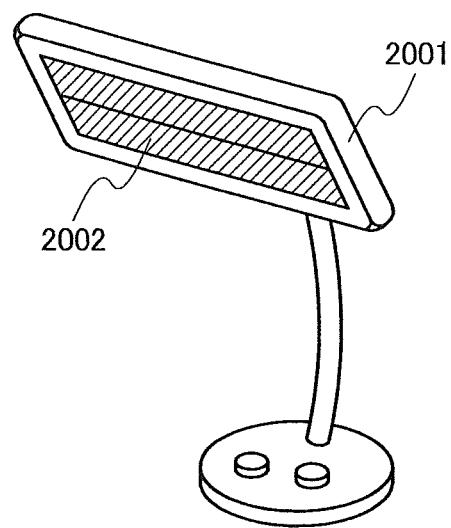
FIG. 9 illustrates a lighting device.

FIG. 9 illustrates an example in which the light-emitting element described in Embodiment 1 or 2 is used for a table lamp which is a lighting device. The table lamp illustrated in FIG. 9 includes a housing 2001 and a light source 2002, and the lighting device described in Embodiment 4 is used for the light source 2002.

Figure 10:
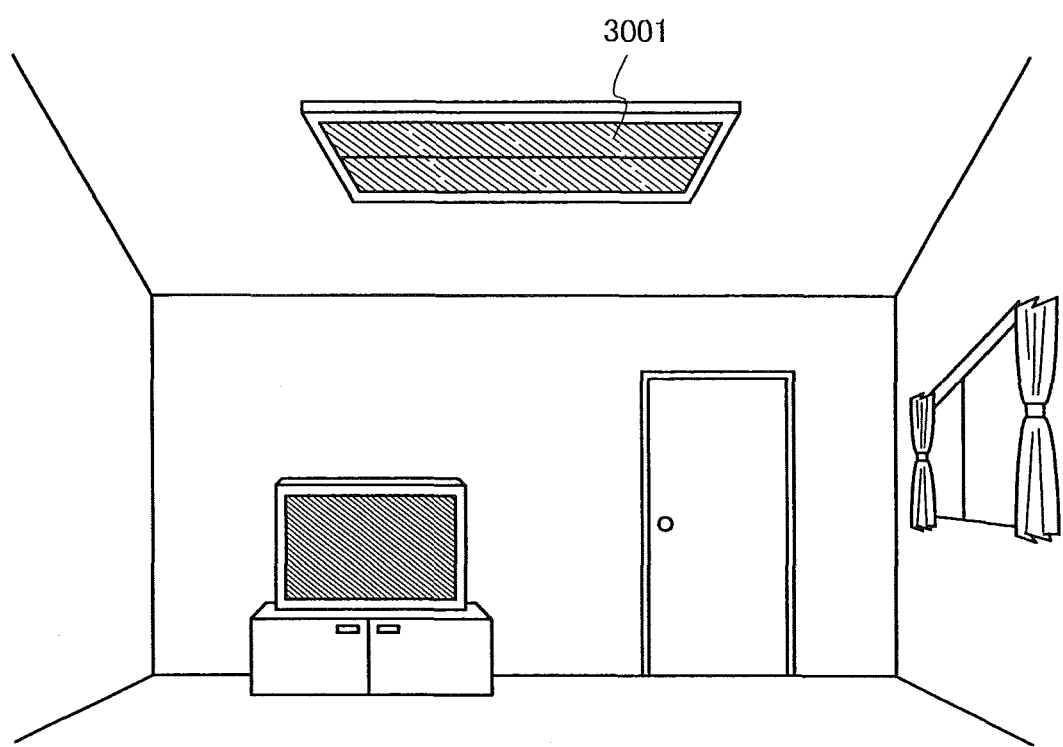
FIG. 10 illustrates a lighting device.

FIG. 10 illustrates an example in which the light-emitting element described in Embodiment 1 or 2 is used for an indoor lighting device 3001. Since the light-emitting element described in Embodiment 1 or 2 has reduced power consumption, a lighting device having reduced power consumption can be obtained. Further, since the light-emitting element described in Embodiment 1 or 2 can have a large area, the light-emitting element can be used for a large-area lighting device. Furthermore, since the light-emitting element described in Embodiment 1 or 2 is thin, the light-emitting element can be used for a lighting device having a reduced thickness.

Figure 11:
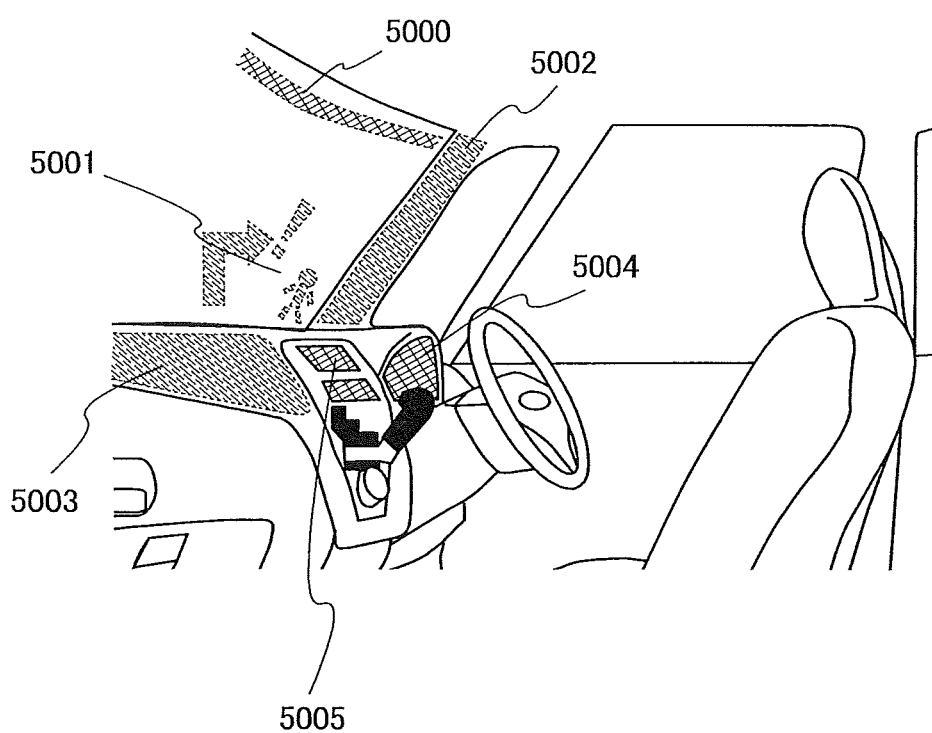
FIG. 11 illustrates in-vehicle display devices and lighting devices.

The light-emitting element described in Embodiment 1 or 2 can also be used for an automobile windshield or an automobile dashboard. FIG. 11 illustrates one mode in which the light-emitting element described in Embodiment 2 is used for an automobile windshield and an automobile dashboard. Display regions 5000 to 5005 each include the light-emitting elements described in Embodiments 1 or 2.

The display regions 5000 and the display region 5001 are provided in the automobile windshield in which the light-emitting elements described in Embodiment 1 or 2 are incorporated. The light-emitting element described in Embodiment 1 or 2 can be formed into what is called a see-through display device, through which the opposite side can be seen, by including a first electrode and a second electrode formed of electrodes having light-transmitting properties. Such see-through display devices can be provided even in the automobile windshield, without hindering the vision. Note that in the case where a transistor for driving or the like is provided, a transistor having a light-transmitting property, such as an organic transistor using an organic semiconductor material or a transistor using an oxide semiconductor, is preferably used.

A display device incorporating the light-emitting element described in Embodiment 1 or 2 is provided in the display region 5002 in a pillar portion. The display region 5002 can compensate for the view hindered by the pillar portion by showing an image taken by an imaging unit provided in the car body. Similarly, the display region 5003 provided in the dashboard can compensate for the view hindered by the car body by showing an image taken by an imaging unit provided in the outside of the car body, which leads to elimination of blind areas and enhancement of safety. Showing an image so as to compensate for the area which a driver cannot see makes it possible for the driver to confirm safety easily and comfortably.

The display region 5004 and the display region 5005 can provide a variety of kinds of information such as navigation data, a speedometer, a tachometer, a mileage, a fuel meter, a gearshift indicator, and air-condition setting. The content or layout of the display can be changed freely by a user as appropriate. Further, such information can also be shown by the display regions 5000 to 5003. Note that the display regions 5000 to 5005 can also be used as lighting devices.

The light-emitting element described in Embodiment 1 or 2 can have high emission efficiency and low power consumption. Therefore, load on a battery is small even when a number of large screens such as the display regions 5000 to 5005 are provided, which provides comfortable use. For that reason, the light-emitting device and the lighting device each of which includes the light-emitting element described in Embodiment 1 or 2 can be suitably used as an in-vehicle light-emitting device and an in-vehicle lighting device.

Figure 12A:
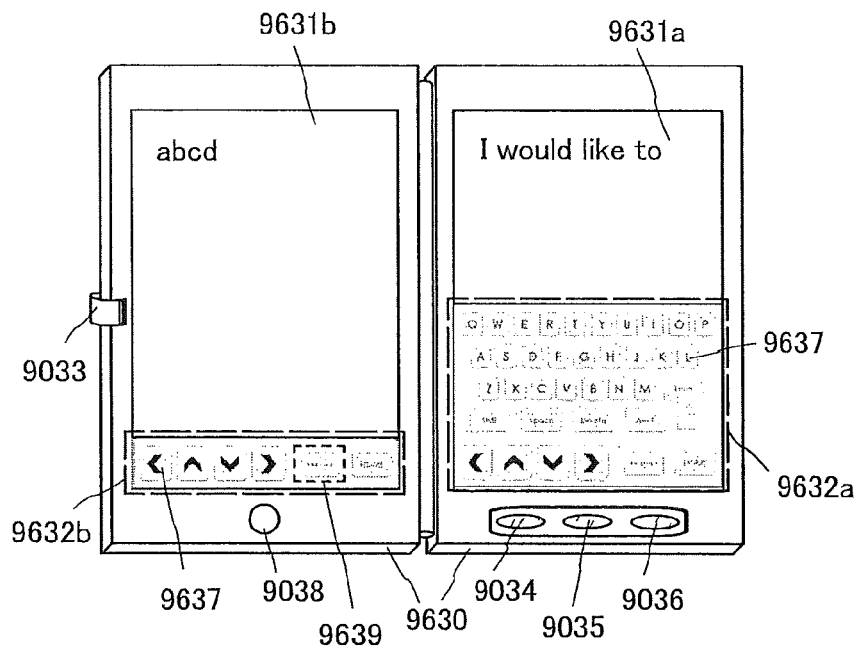
FIGS. 12A to 12C illustrate an electronic appliance.
Figure 12B:
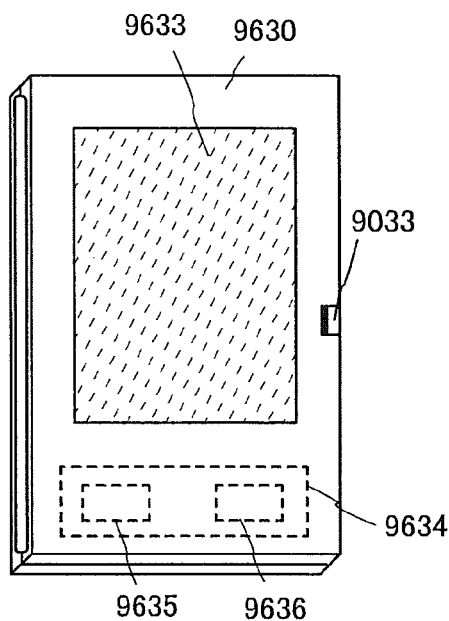

FIGS. 12A and 12B illustrate an example of a foldable tablet terminal. The tablet terminal is opened in FIG. 12A. The tablet terminal includes a housing 9630, a display portion 9631a, a display portion 9631b, a display mode switch 9034, a power switch 9035, a power saver switch 9036, a clasp 9033, and an operation switch 9038. Note that in the tablet terminal, one or both of the display portion 9631a and the display portion 9631b is/are formed using a light-emitting device which includes the light-emitting element described in Embodiment 1 or 2.

Part of the display portion 9631a can be a touchscreen region 9632a and data can be input when a displayed operation key 9637 is touched. Although half of the display portion 9631a has only a display function and the other half has a touchscreen function, one embodiment of the present invention is not limited to the structure. The whole display portion 9631a may have a touchscreen function. For example, a keyboard can be displayed on the entire region of the display portion 9631a so that the display portion 9631a is used as a touchscreen, and the display portion 9631b can be used as a display screen.

Like the display portion 9631a, part of the display portion 9631b can be a touchscreen region 9632b. A switching button 9639 for showing/hiding a keyboard of the touch panel is touched with a finger, a stylus, or the like, so that keyboard buttons can be displayed on the display portion 9631b.

Touch input can be performed in the touchscreen region 9632a and the touchscreen region 9632b at the same time.

The display mode switch 9034 can switch the display between portrait mode, landscape mode, and the like, and between monochrome display and color display, for example. With the switch 9036 for switching to power-saving mode, the luminance of display can be optimized in accordance with the amount of external light at the time when the tablet is in use, which is detected with an optical sensor incorporated in the tablet. The tablet may include another detection device such as a sensor for detecting orientation (e.g., a gyroscope or an acceleration sensor) in addition to the optical sensor.

Although FIG. 12A illustrates an example in which the display portion 9631a and the display portion 9631b have the same display area, one embodiment of the present invention is not limited to the example. The display portion 9631a and the display portion 9631b may have different display areas and different display quality. For example, one of them may be a display panel that can display higher-definition images than the other.

The tablet terminal is folded in FIG. 12B. The tablet terminal includes the housing 9630, a solar cell 9633, a charge and discharge control circuit 9634, a battery 9635, and a DC-to-DC converter 9636. Note that FIG. 12B illustrates an example in which the charge and discharge control circuit 9634 includes the battery 9635 and the DC-to-DC converter 9636.

Since the tablet terminal can be folded, the housing 9630 can be closed when not in use. Thus, the display portions 9631a and 9631b can be protected, thereby providing a tablet terminal with high endurance and high reliability for long-term use.

In addition, the tablet terminal illustrated in FIGS. 12A and 12B can have a function of displaying various kinds of information (e.g., a still image, a moving image, and a text image) on the display portion, a function of displaying a calendar, the date, the time, or the like on the display portion, a touch input function of operating or editing information displayed on the display portion by touch input, a function of controlling processing by various kinds of software (programs), and the like.

The solar cell 9633, which is attached on the surface of the tablet terminal, supplies electric power to a touch panel, a display portion, an image signal processor, and the like. Note that the solar cell 9633 is preferably provided on one or two surfaces of the housing 9630, in which case the battery 9635 can be charged efficiently.

Figure 12C:
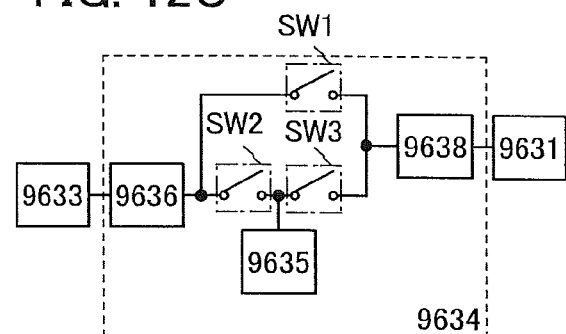
Figure 13:
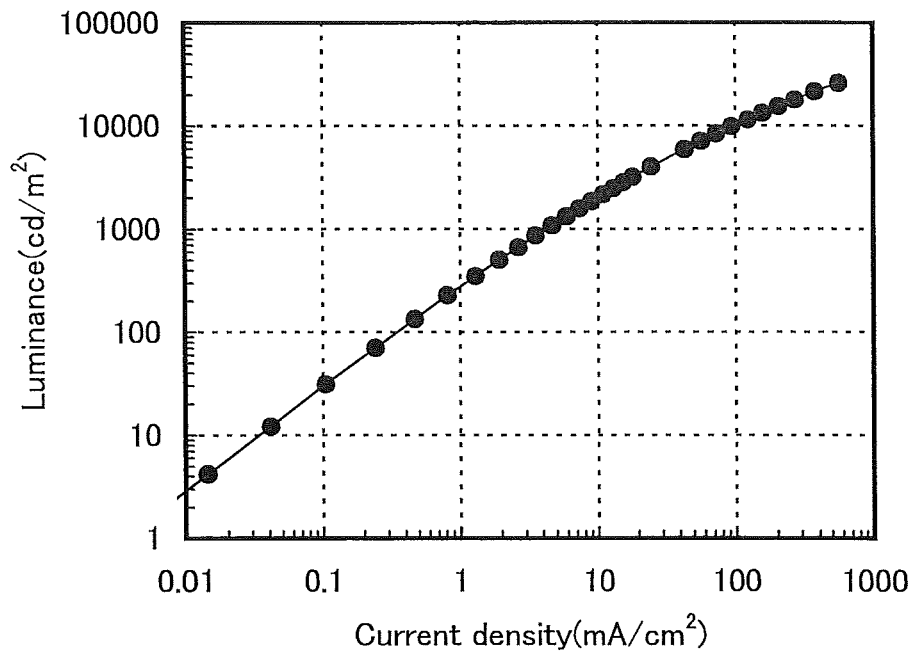
FIG. 13 shows luminance-current density characteristics of a light-emitting element 1.
Figure 14:
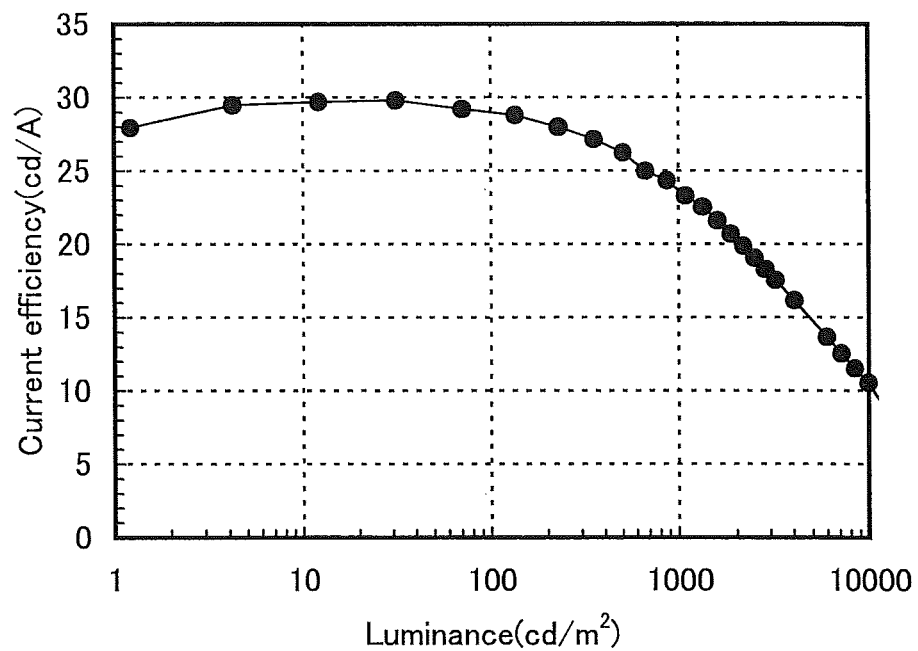
FIG. 14 shows current efficiency-luminance characteristics of the light-emitting element 1.
Figure 15:
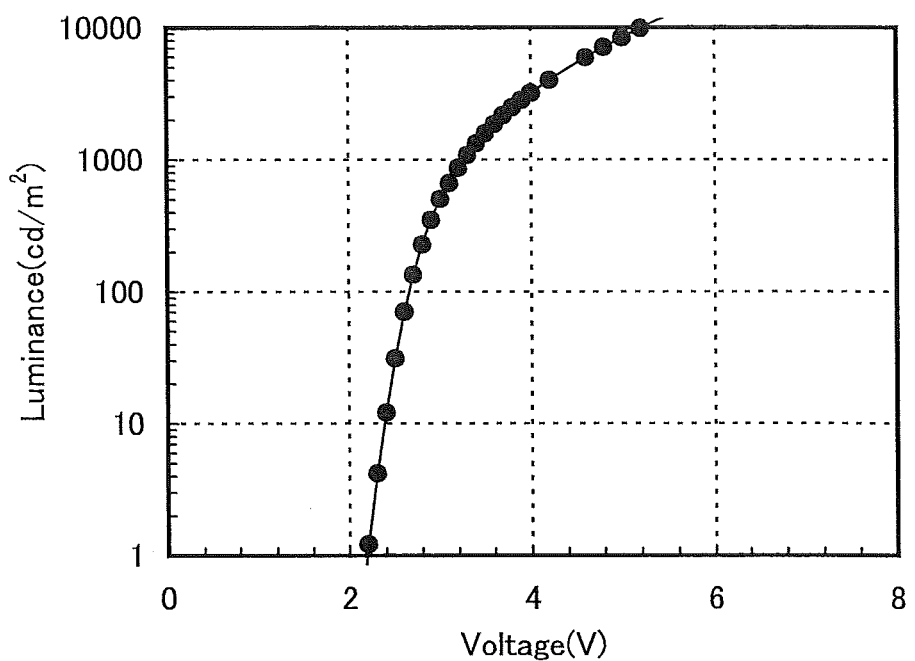
FIG. 15 shows luminance-voltage characteristics of the light-emitting element 1.
Figure 16:
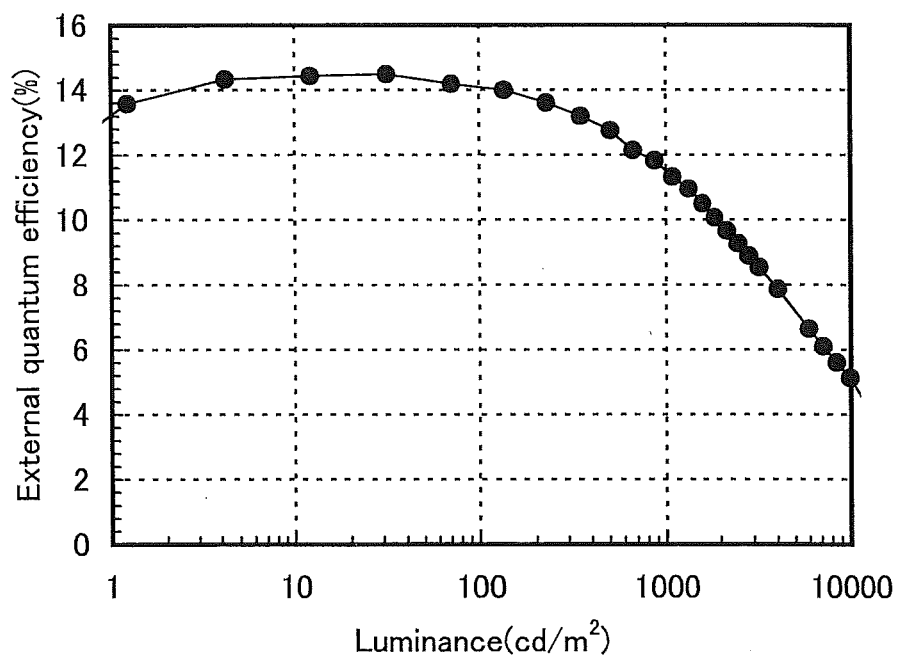
FIG. 16 shows external quantum efficiency-luminance characteristics of the light-emitting element 1.
Figure 17:
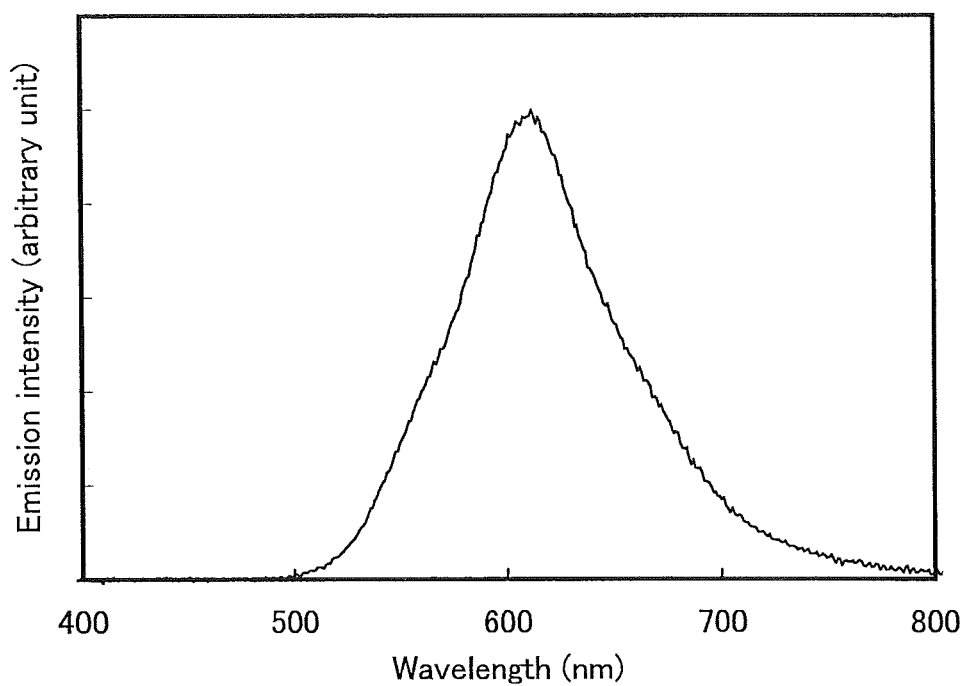
FIG. 17 shows an emission spectrum of the light-emitting element 1.
Figure 18:
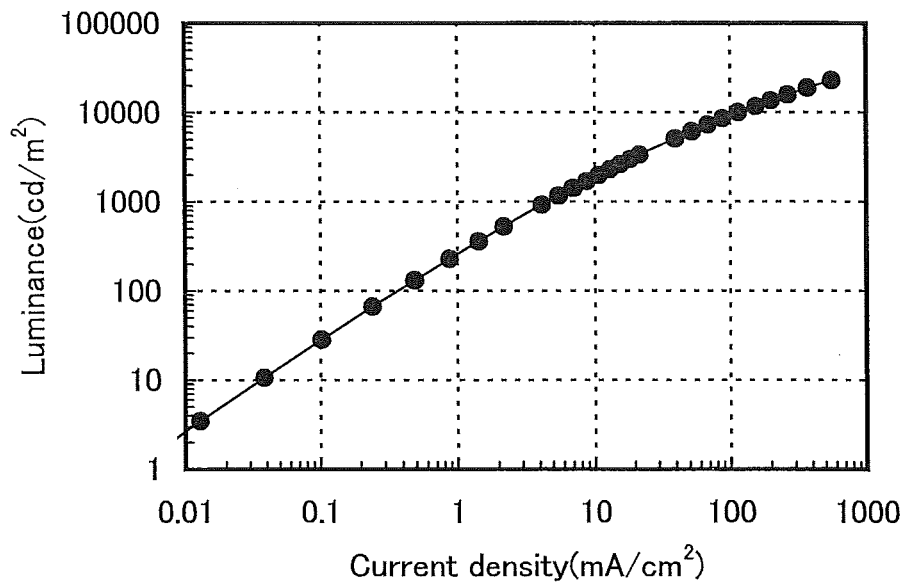
FIG. 18 shows luminance-current density characteristics of a light-emitting element 2.
Figure 19:
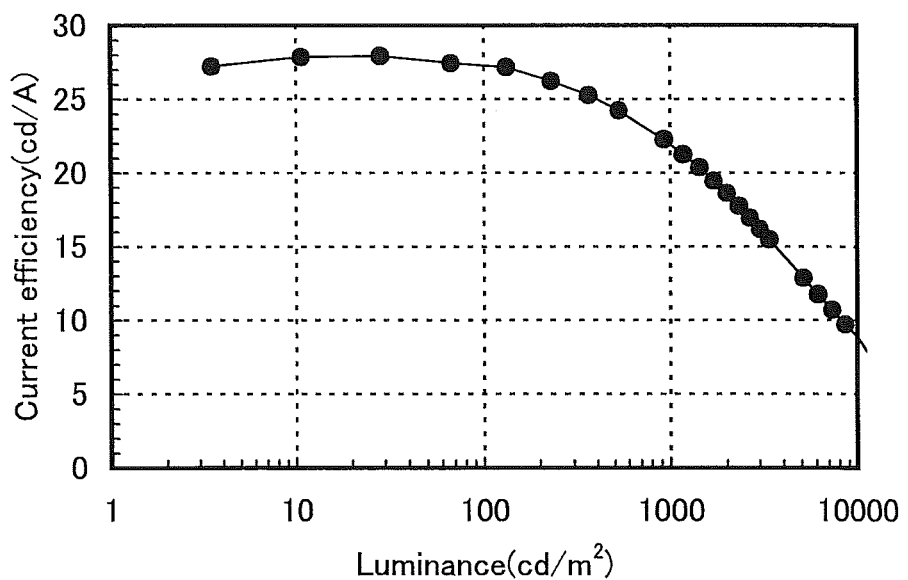
FIG. 19 shows current efficiency-luminance characteristics of the light-emitting element 2.
Figure 20:
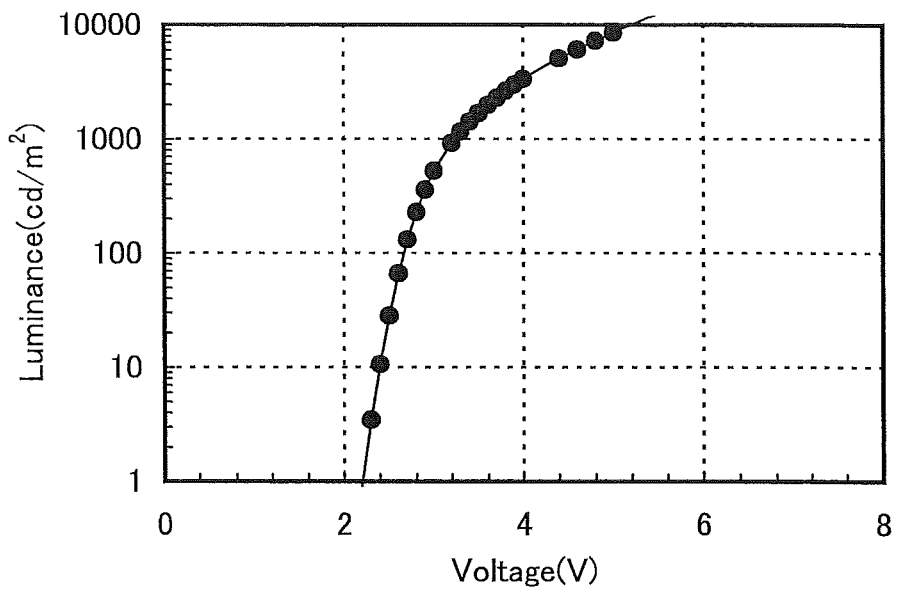
FIG. 20 shows luminance-voltage characteristics of the light-emitting element 2.
Figure 21:
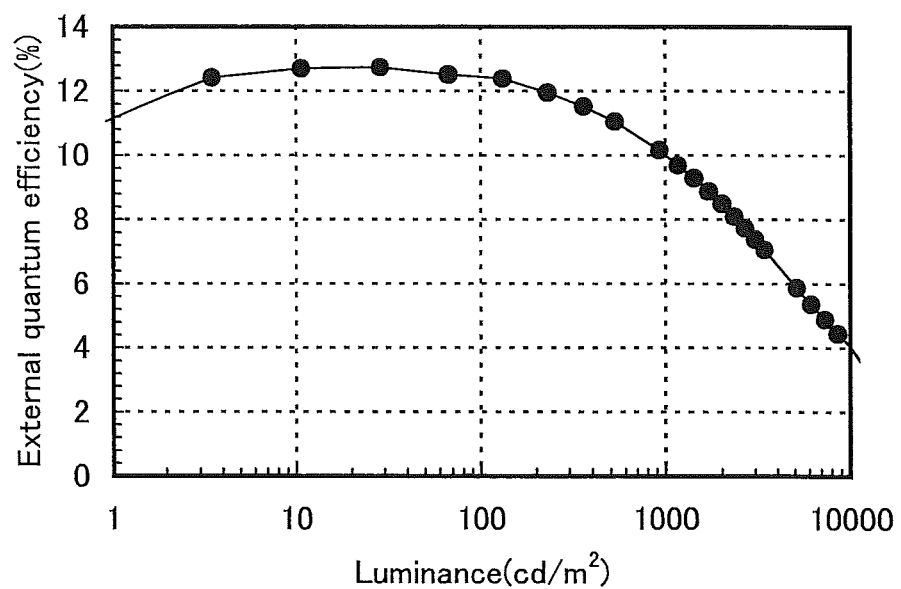
FIG. 21 shows external quantum efficiency-luminance characteristics of the light-emitting element 2.
Figure 22:
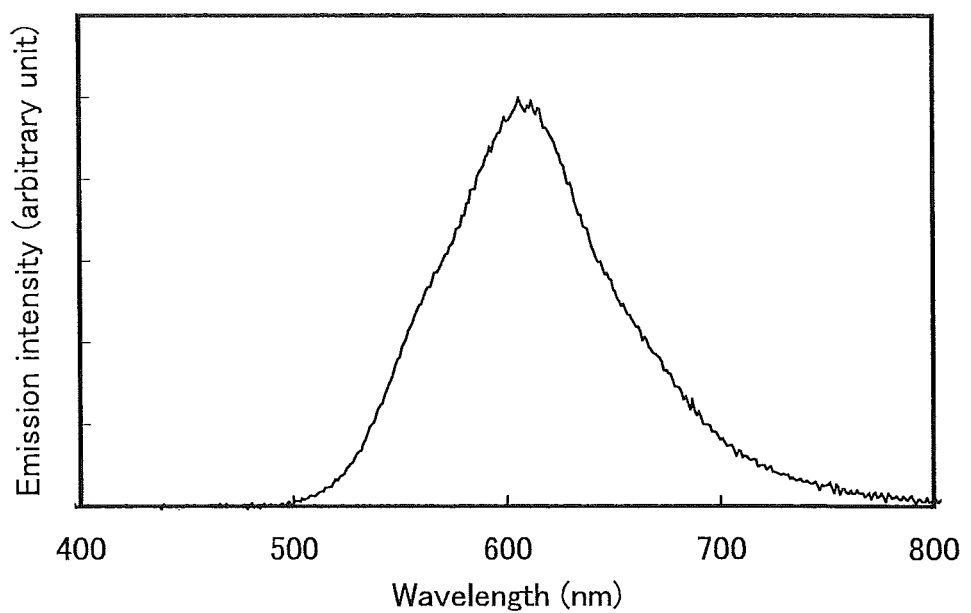
FIG. 22 shows an emission spectrum of the light-emitting element 2.
Figure 23:
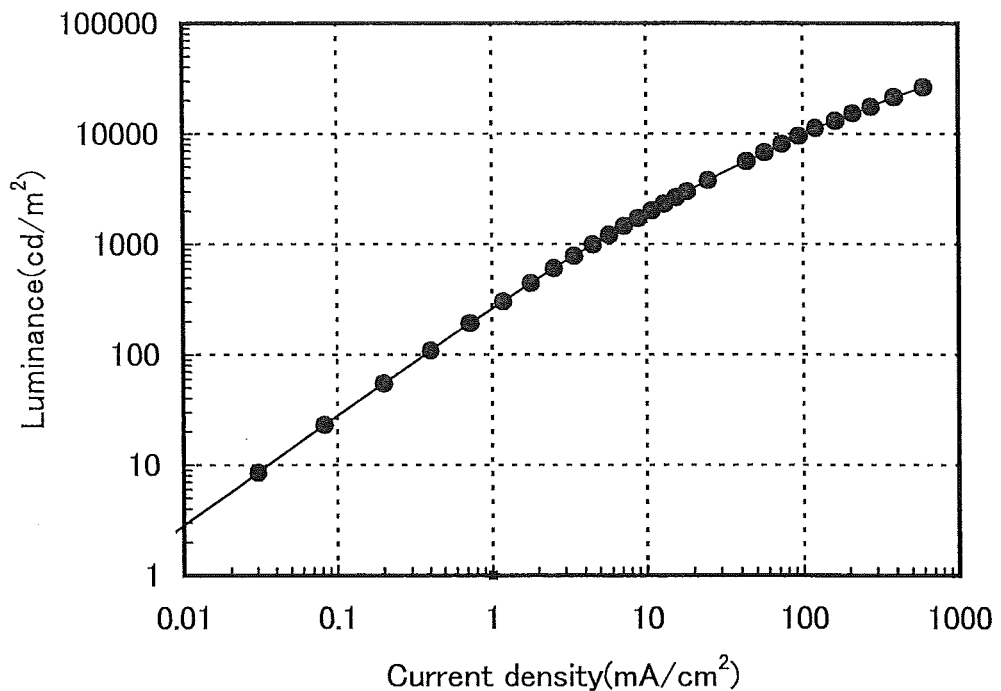
FIG. 23 shows luminance-current density characteristics of a light-emitting 3.
Figure 24:
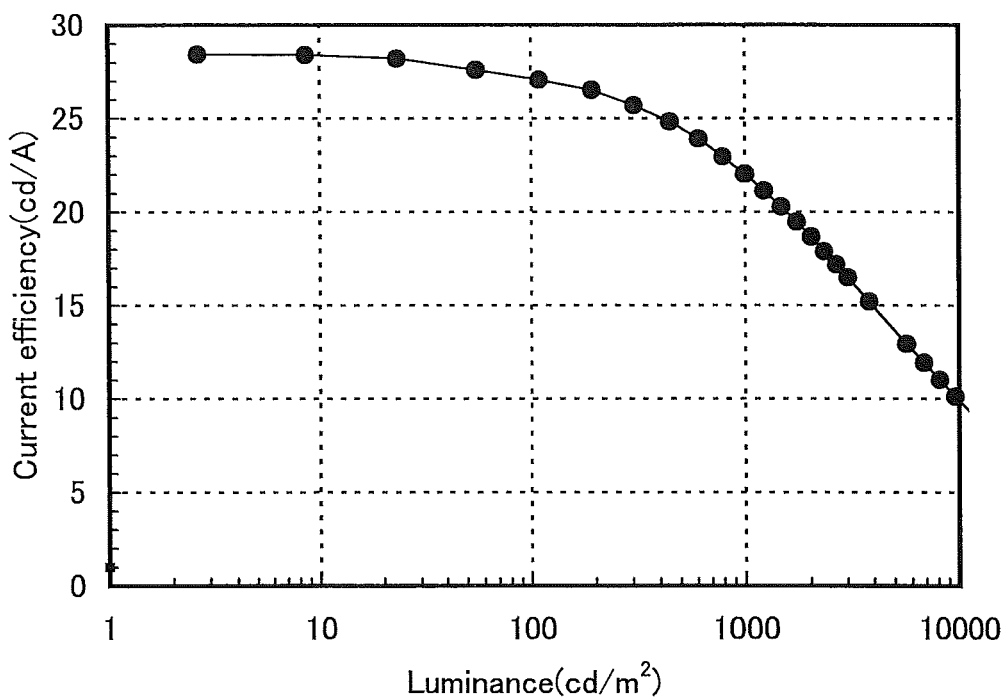
FIG. 24 shows current efficiency-luminance characteristics of the light-emitting element 3.
Figure 25:
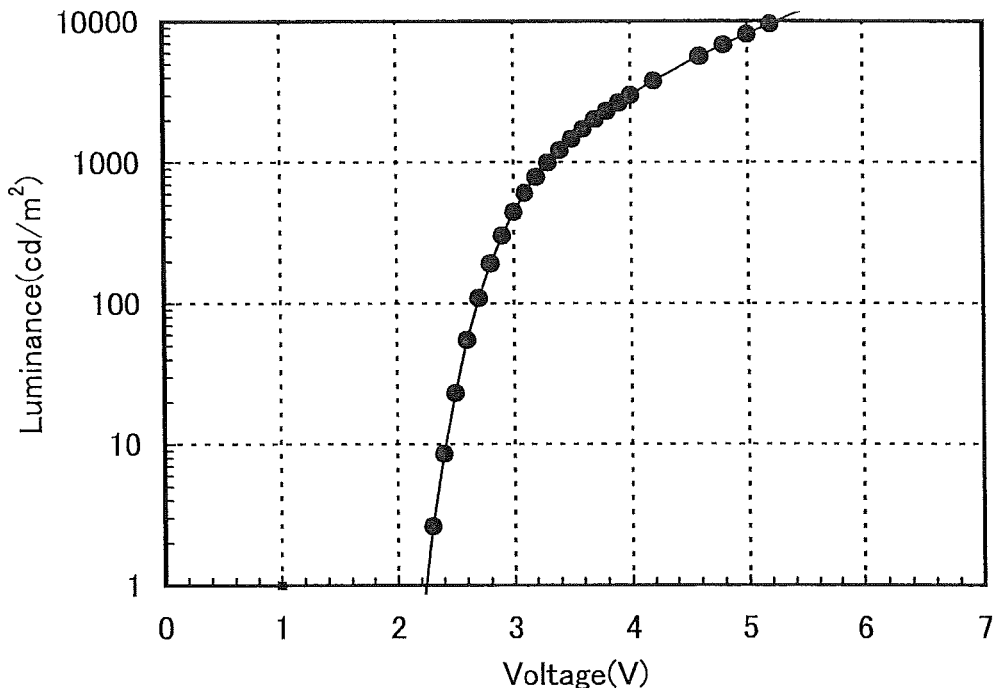
FIG. 25 shows luminance-voltage characteristics of the light-emitting element 3.
Figure 26:
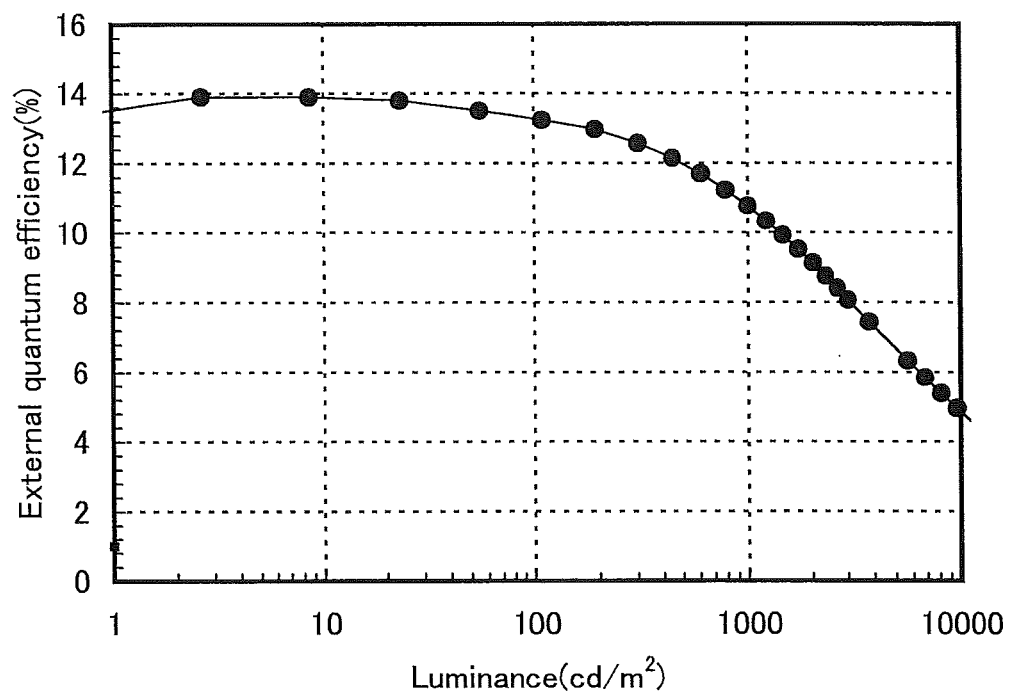
FIG. 26 shows external quantum efficiency-luminance characteristics of the light-emitting element 3.
Figure 27:
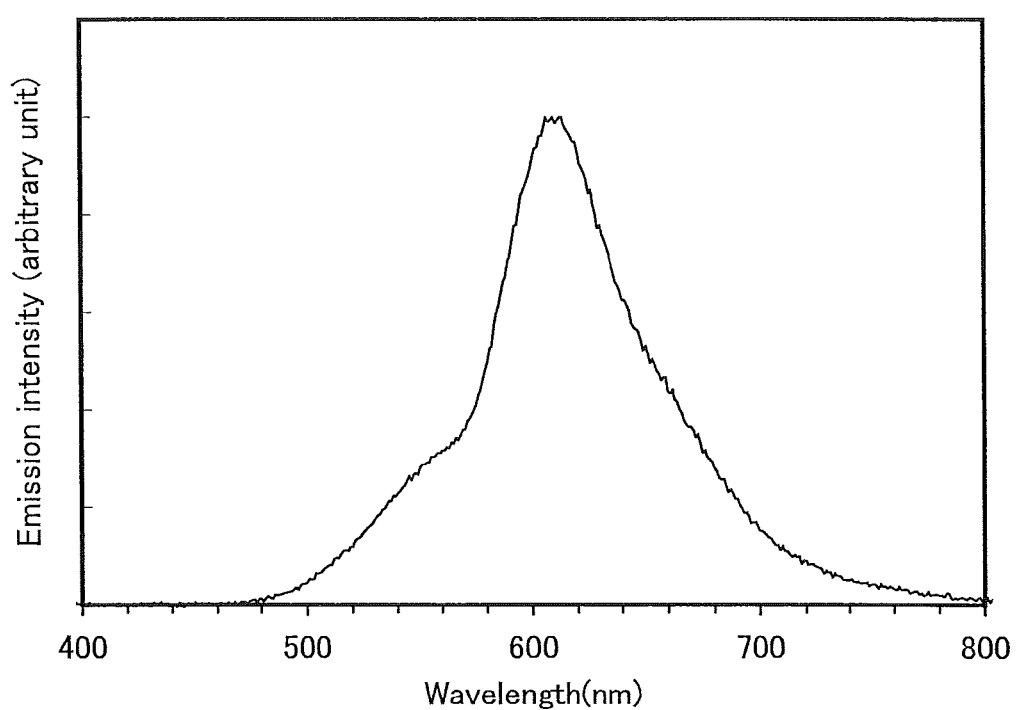
FIG. 27 shows an emission spectrum of the light-emitting element 3.
Figure 28:
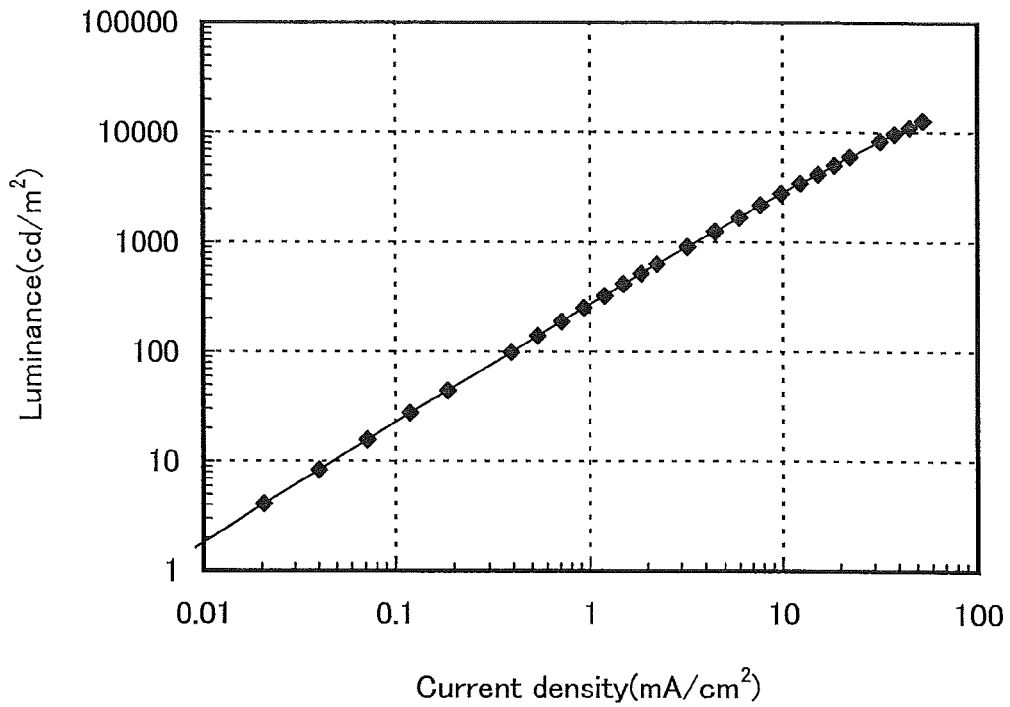
FIG. 28 shows luminance-current density characteristics of a light-emitting element 4.
Figure 29:
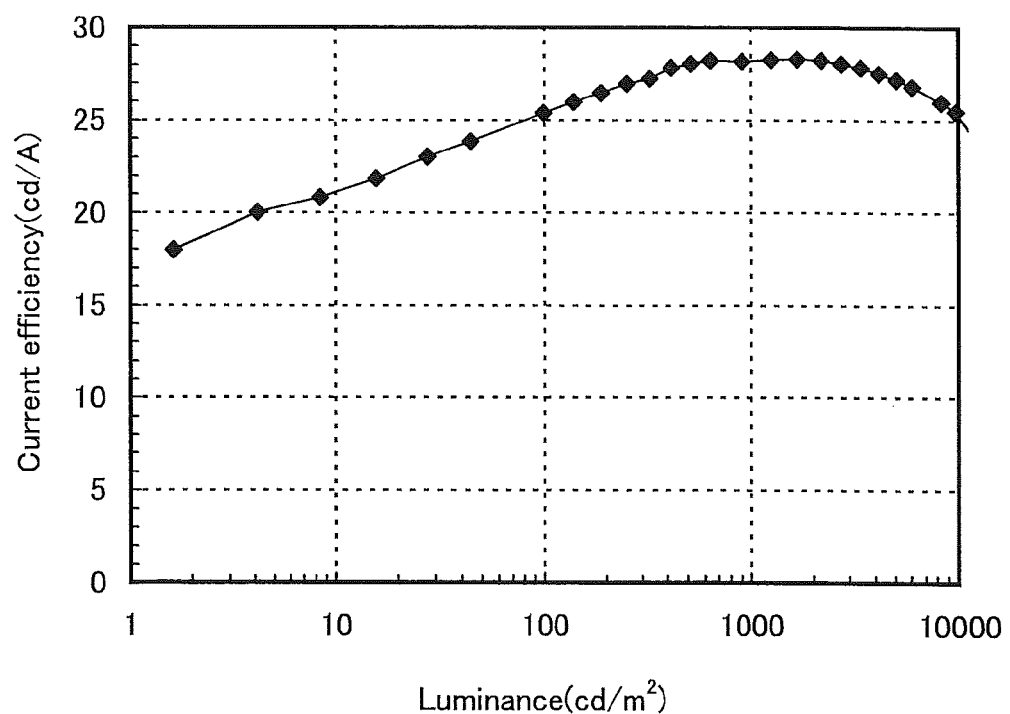
FIG. 29 shows current efficiency-luminance characteristics of the light-emitting element 4.
Figure 30:
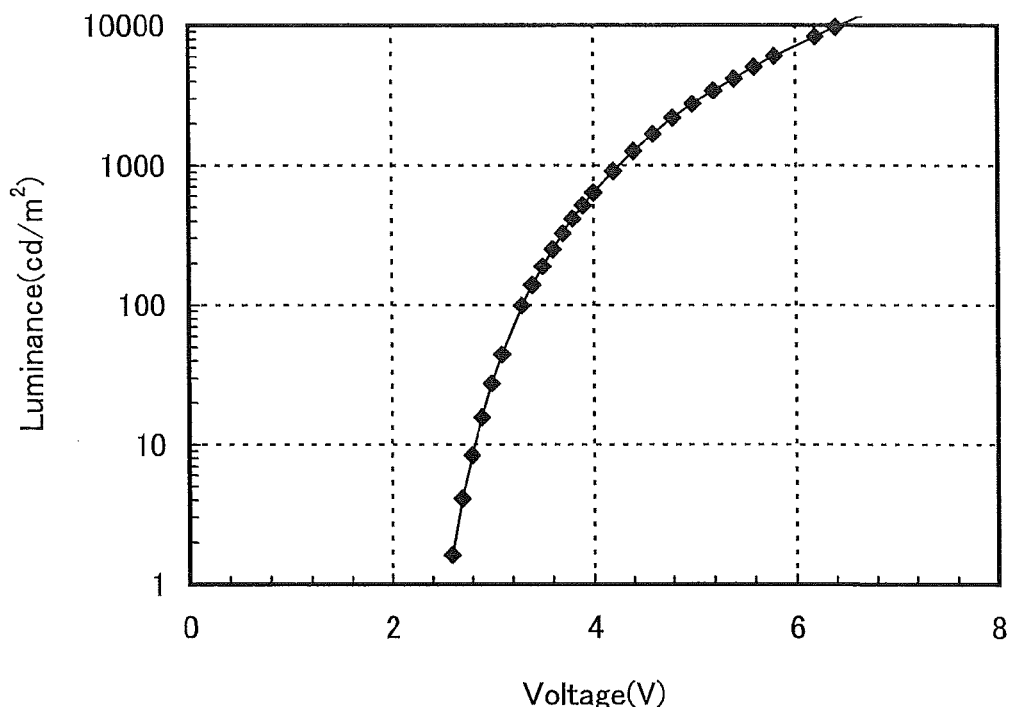
FIG. 30 shows luminance-voltage characteristics of the light-emitting element 4.
Figure 31:
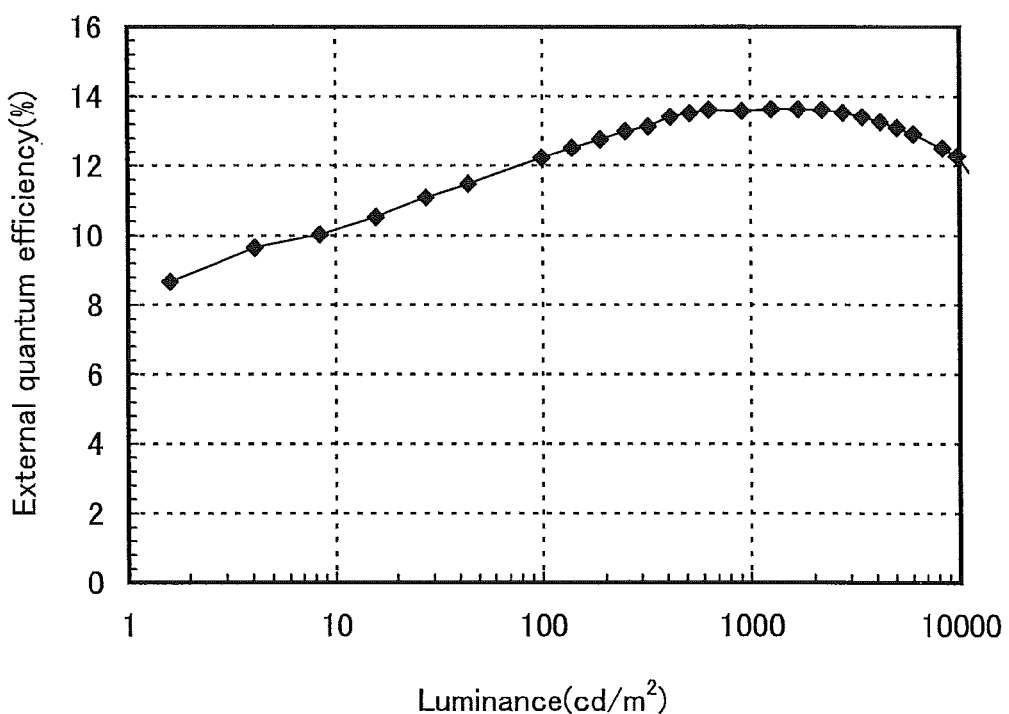
FIG. 31 shows external quantum efficiency-luminance characteristics of the light-emitting element 4.
Figure 32:
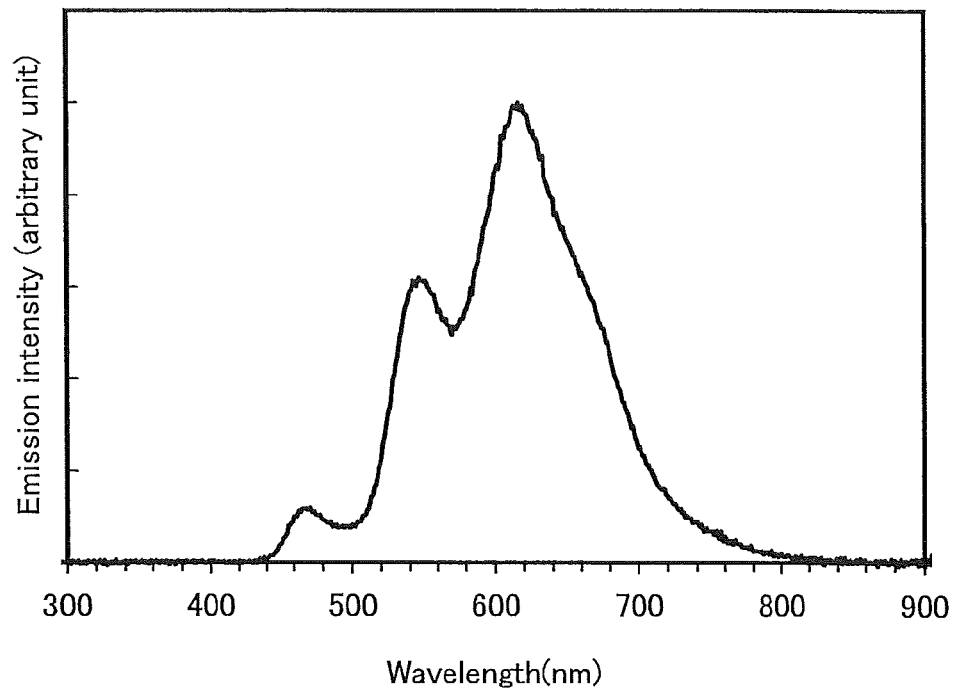
FIG. 32 shows an emission spectrum of the light-emitting element 4.

The structure and operation of the charge and discharge control circuit 9634 illustrated in FIG. 12B are described with reference to a block diagram of FIG. 12C. FIG. 12C shows the solar cell 9633, the battery 9635, the DC-to-DC converter 9636, a converter 9638, switches SW1 to SW3, and the display portion 9631. The battery 9635, the DC-to-DC converter 9636, the converter 9638, and the switches SW1 to SW3 correspond to the charge and discharge control circuit 9634 in FIG. 12B.

First, an example of operation in the case where power is generated by the solar cell 9633 using external light is described. The voltage of power generated by the solar cell is raised or lowered by the DC-to-DC converter 9636 so that the power has voltage for charging the battery 9635. Then, when power supplied from the battery 9635 charged by the solar cell 9633 is used for the operation of the display portion 9631, the switch SW1 is turned on and the voltage of the power is raised or lowered by the converter 9638 so as to be voltage needed for the display portion 9631. In addition, when display on the display portion 9631 is not performed, the switch SW1 is turned off and a switch SW2 is turned on so that charge of the battery 9635 may be performed.

Although the solar cell 9633 is described as an example of a power generation means, the power generation means is not particularly limited, and the battery 9635 may be charged by another power generation means such as a piezoelectric element or a thermoelectric conversion element (Peltier element). The battery 9635 may be charged by a non-contact power transmission module which is capable of charging by transmitting and receiving power by wireless (without contact), or another charge means used in combination, and the power generation means is not necessarily provided.

One embodiment of the present invention is not limited to the tablet terminal having the shape illustrated in FIGS. 12A to 12C as long as the display portion 9631 is included.

EXAMPLE 1

In this example, light-emitting elements (light-emitting elements 1 to 3) each of which is one embodiment of the present invention are described. Chemical formulae of materials used in this example are shown below. Note that each of the light-emitting elements 1 to 3 includes a light-emitting layer formed of two light-emitting layers (a first light-emitting layer and a second light-emitting layer) which are in contact with each other. The first light-emitting layer has the structure described in Embodiment 1, in which light emission is obtained from an exciplex, and the second light-emitting layer has the structure described in Embodiment 1, in which light emission is obtained from a phosphorescent compound.

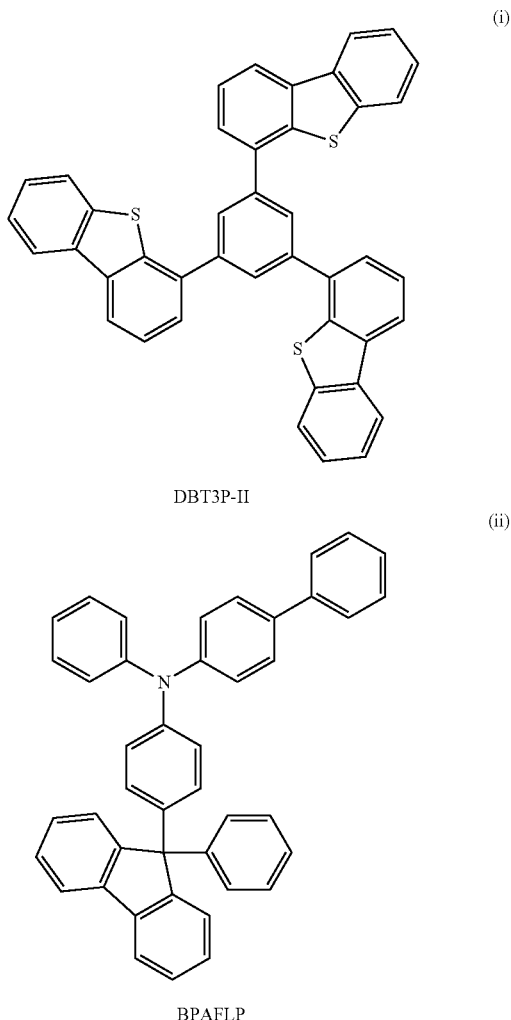

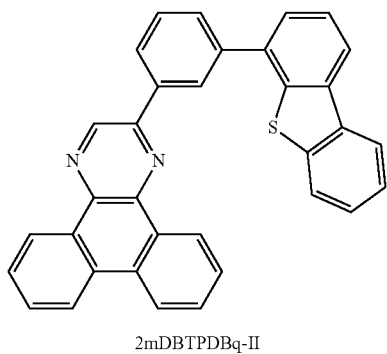

2mDBTPDBq-II (iii)

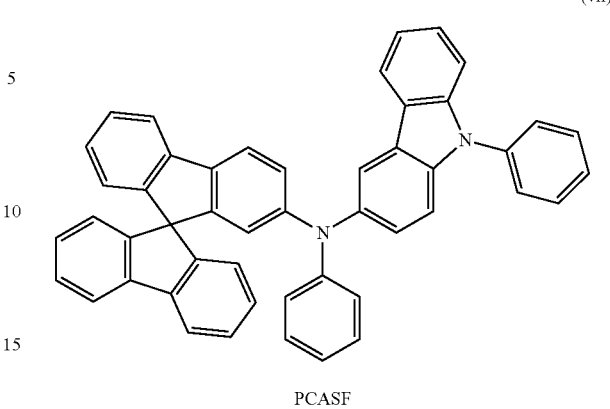

PCASF (vii)

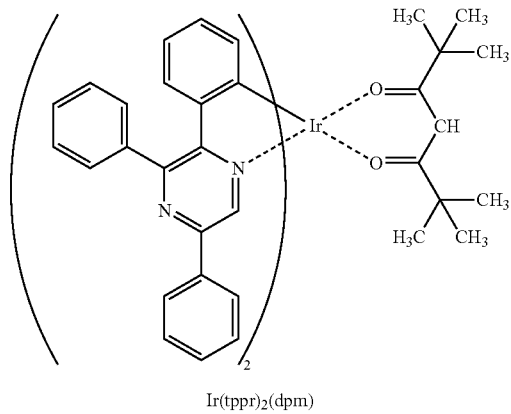

PCA2SF (iv)

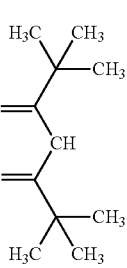

Ir(tppr)₂(dpm) (v)

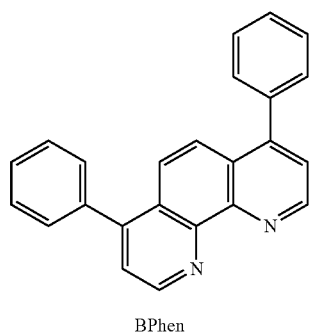

BPhen (vi)

Methods for manufacturing the light-emitting elements 1 to 3 of this example are described below.

(Method for Manufacturing Light-Emitting Element 1)

First, a film of indium tin oxide containing silicon oxide (ITSO) was formed over a glass substrate by a sputtering method to form the first electrode 101. The thickness of the first electrode 101 was set to 110 nm and the electrode area was set to 2 mm×2 mm. Here, the first electrode 101 functions as an anode of the light-emitting element.

Next, as pretreatment for forming the light-emitting element over the substrate, a surface of the substrate was washed with water, baked at 200° C. for one hour, and then subjected to UV ozone treatment for 370 seconds.

After that, the substrate was transferred into a vacuum evaporation apparatus where the pressure had been reduced to approximately $10^{-4}$ Pa, subjected to vacuum baking at 170° C. for 30 minutes in a heating chamber of the vacuum evaporation apparatus, and then cooled down for about 30 minutes.

Then, the substrate provided with the first electrode 101 was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, on the first electrode 101, 4,4′,4″-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating to form the hole-injection layer 111. The thickness of the hole-injection layer 111 was set to 20 nm, and the weight ratio of DBT3P-II to molybdenum oxide was adjusted to 4:2 (=DBT3P-II: molybdenum oxide). Note that the co-evaporation method refers to an evaporation method in which evaporation is carried out from a plurality of evaporation sources at the same time in one treatment chamber.

Next, 4-phenyl-4′-(9-phenylfluoren-9-yl)triphenylamine (abbreviation: BPAFLP) represented by Structural Formula (ii) was deposited to a thickness of 20 nm on the hole-injection layer 111 to form the hole-transport layer 112.

Furthermore, on the hole-transport layer 112, 2-[3-(dibenzothiophen-4-yl)phenyl]dibenzo[f,h]quinoxaline (abbreviation: 2mDBTPDBq-II) represented by Structural Formula (iii) and N,N′-bis(9-phenyl-9H-carbazol-3-yl)-N,N′-diphenyl-spiro-9,9′-bifluorene-2,7-diamine (abbreviation: PCA2SF) represented by Structural Formula (iv) were deposited to a thickness of 20 nm by co-evaporation so that the weight ratio of 2mDBTPDBq-II to PCA2SF was 0.8:0.2

(=2mDBTPDBq-II:PCA2SF) to form the first light-emitting layer 113a, and then 2mDBTPDBq-II, PCA2SF, and bis(2,3,5-triphenylpyrazinato)(dipivaloylmethanato)iridium(III) (abbreviation: [Ir(tppr)$_2$(dpm)]) represented by Structural Formula (v) were deposited to a thickness of 20 nm by co-evaporation so that the weight ratio of 2mDBTPDBq-II to PCA2SF and [Ir(tppr)$_2$(dpm)] was 0.8:0.2:0.025 (=2mDBTPDBq-II:PCA2SF:[Ir(tppr)$_2$(dpm)]) to form the second light-emitting layer 113b. In the above-described manner, the light-emitting layer 113 was formed. Note that 2mDBTPDBq-II and PCA2SF form an exciplex.

After that, on the light-emitting layer 113, 2mDBTPDBq-II was deposited to a thickness of 20 nm, and bathophenanthroline (abbreviation: BPhen) represented by Structural Formula (v) was deposited to a thickness of 20 nm to form the electron-transport layer 114.

After the formation of the electron-transport layer 114, lithium fluoride (LiF) was deposited by evaporation to a thickness of 1 nm to form the electron-injection layer 115. Finally, aluminum was deposited by evaporation to a thickness of 200 nm to form the second electrode 102 functioning as a cathode. Through the above-described steps, the light-emitting element 1 of this example was manufactured.

Note that in all the above evaporation steps, evaporation was performed by a resistance-heating method.
(Method for Manufacturing Light-Emitting Element 2)

The light-emitting element 2 was manufactured in such a manner that 2mDBTPDBq-II and [Ir(tppr)$_2$(dpm)] were deposited to a thickness of 20 nm by co-evaporation so that the weight ratio of 2mDBTPDBq-II to [Ir(tppr)$_2$(dpm)] was 1:0.025 (=2mDBTPDBq-II:[Ir(tppr)$_2$(dpm)]) to form the second light-emitting layer 113b. The structures and manufacturing methods of the other components were the same as those of the light-emitting element 1.
(Method for Manufacturing Light-Emitting Element 3)

The light-emitting layer 113 in the light-emitting element 3 was formed in such a manner that 2mDBTPDBq-II and 2-[N-(9-phenylcarbazol-3-yl)-N-phenylamino]spiro-9,9'-bifluorene (abbreviation: PCASF) represented by Structural Formula (vii) were deposited by co-evaporation to a thickness of 20 nm so that the weight ratio of 2mDBTPDBq-II to PCASF was 0.8:0.2 (=2mDBTPDBq-II:PCASF) to form the first light-emitting layer 113a, and then 2mDBTPDBq-II, PCASF, and [Ir(tppr)$_2$(dpm)] were deposited by co-evaporation to a thickness of 20 nm so that the weight ratio of 2mDBTPDBq-II to PCASF and [Ir(tppr)$_2$(dpm)] was 0.8:0.2:0.025 (=2mDBTPDBq-II:PCASF:[Ir(tppr)$_2$(dpm)]) to form the second light-emitting layer 113b. In other words, the light-emitting element 3 was manufactured using PCASF instead of PCA2SF used in the light-emitting element 1. Note that the structures and manufacturing methods of the other components are the same as those of the light-emitting element 1. Note that 2mDBTPDBq-II and PCASF form an exciplex.

In a glove box under a nitrogen atmosphere, the light-emitting elements 1 to 3 were each sealed with a glass substrate so as not to be exposed to the air (specifically, a sealing material was applied onto an outer edge of the element, UV treatment was performed at the time of sealing, and heat treatment was performed at 80° C. for one hour). Then, the reliability of each of the light-emitting elements was measured. Note that the measurement was carried out at room temperature (in an atmosphere kept at 25° C.).

FIG. 13, FIG. 14, FIG. 15, FIG. 16, and FIG. 17 show the luminance-current density characteristics of the light-emitting element 1, the current efficiency-luminance characteristics thereof, the luminance-voltage characteristics thereof, the external quantum efficiency-luminance characteristics thereof, and the emission spectrum thereof, respectively.

FIG. 18, FIG. 19, FIG. 20, FIG. 21, and FIG. 22 show the luminance-current density characteristics of the light-emitting element 2, the current efficiency-luminance characteristics thereof, the luminance-voltage characteristics thereof, the external quantum efficiency-luminance characteristics thereof, and the emission spectrum thereof, respectively.

FIG. 23, FIG. 24, FIG. 25, FIG. 26, and FIG. 27 show the luminance-current density characteristics of the light-emitting element 3, the current efficiency-luminance characteristics thereof, the luminance-voltage characteristics thereof, the external quantum efficiency-luminance characteristics thereof, and the emission spectrum thereof, respectively.

According to the characteristics, the light-emitting elements 1 to 3 each have a current efficiency of 20 cd/A or higher and favorable emission efficiency with an external quantum efficiency of 10% or higher at around 1000 cd/m$^2$.

Further, in the emission spectra, red light emission originating from [Ir(tppr)$_2$(dpm)] and green light emission (a shoulder at around 550 nm) originating from an exciplex are observed. This indicates that light emission is obtained from both the first light-emitting layer 113a and the second light-emitting layer 113b.

EXAMPLE 2

In this example, a light-emitting element (a light-emitting element 4) of one embodiment of the present invention is described. Chemical formulae of materials used in this example are shown below. Note that the light-emitting element 4 includes a light-emitting layer in which two light-emitting layers (a first light-emitting layer and a second light-emitting layer) are formed in contact with each other. The first light-emitting layer has the structure described in Embodiment 1, in which light emission is obtained from a fluorescent compound to which energy has been transferred from an exciplex, and the second light-emitting layer has the structure described in Embodiment 1, in which light emission is obtained from a phosphorescent compound.

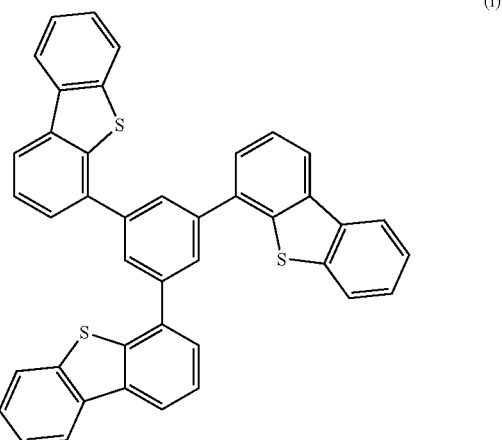

DBT3P-II (i)

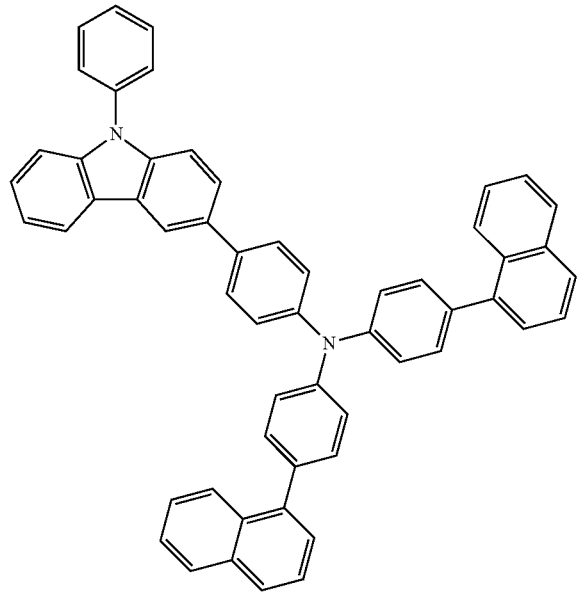

PCBNBB

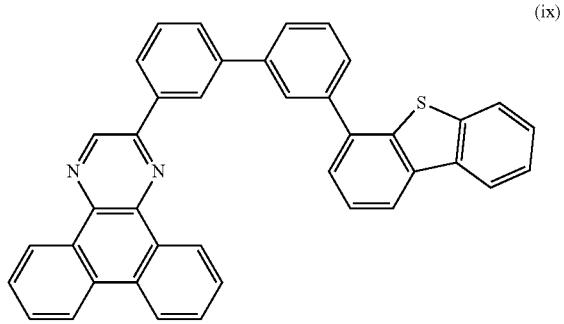

2mDBTBPDBq-II

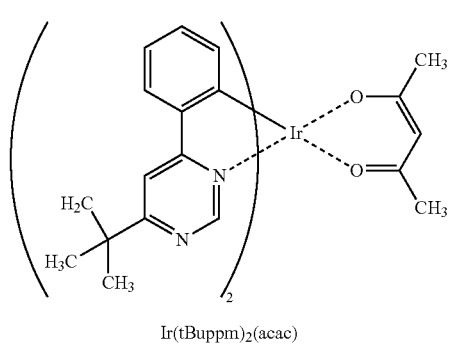

Ir(tBuppm)₂(acac)

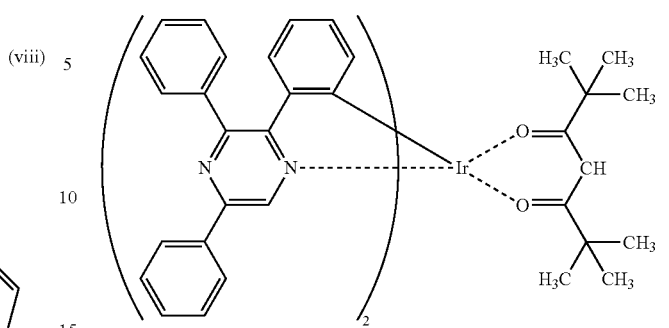

Ir(tppr)₂(dpm)

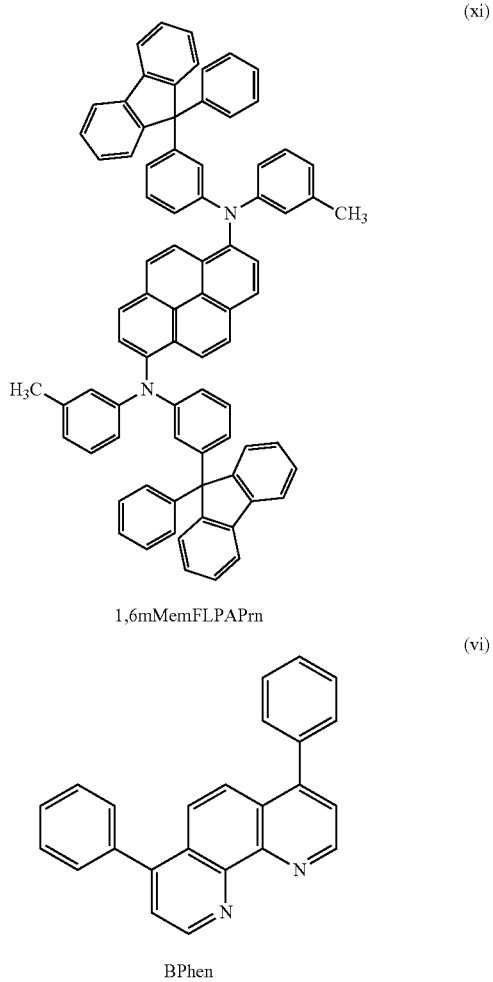

1,6mMemFLPAPrn

BPhen

A method for manufacturing the light-emitting element 4 of this example is described below.

(Method for Manufacturing Light-Emitting Element 4)

First, a film of indium tin oxide containing silicon oxide (ITSO) was formed over a glass substrate by a sputtering method to form the first electrode 101. The thickness of the first electrode 101 was set to 110 nm and the electrode area was set to 2 mm×2 mm. Here, the first electrode 101 functions as an anode of the light-emitting element.

Next, as pretreatment for forming the light-emitting element over the substrate, a surface of the substrate was washed with water, baked at 200° C. for one hour, and then subjected to UV ozone treatment for 370 seconds.

After that, the substrate was transferred into a vacuum evaporation apparatus where the pressure had been reduced to approximately $10^{-4}$ Pa, subjected to vacuum baking, at 170° C. for 30 minutes in a heating chamber of the vacuum evaporation apparatus, and then cooled down for about 30 minutes.

Then, the substrate provided with the first electrode 101 was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, on the first electrode 101, 4,4',4"-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating to form the hole-injection layer 111. The thickness of the hole-injection layer 111 was set to 40 nm, and the weight ratio of DBT3P-II to molybdenum oxide was adjusted to 4:2 (=DBT3P-II: molybdenum oxide). Note that the co-evaporation method refers to an evaporation method in which evaporation is carried out from a plurality of evaporation sources at the same time in one treatment chamber.

Next, 4,4'-di(1-naphthyl)-4"-(9-phenyl-9H-carbazol-3-yl)-triphenylamine (abbreviation: PCBNBB) represented by Structural Formula (viii) was deposited to a thickness of 20 nm on the hole-injection layer 111 to form the hole-transport layer 112.

Furthermore, on the hole-transport layer 112, 2-[3'-(dibenzothiophen-4-yl)biphenyl-3-yl]dibenzo[f,h]quinoxaline (abbreviation: 2mDBTBPDBq-II) represented by Structural Formula (ix), PCBNBB, and bis[2-(6-tert-butyl-4-pyrimidinyl-κN3)phenyl-κC](2,4-pentanedionato-κ$^2$O,O') iridium(III) (abbreviation: [Ir(tBuppm)$_2$(acac)]) represented by Structural Formula (x) were deposited by co-evaporation to a thickness of 20 nm so that the weight ratio of 2mDBTBPDBq-II to PCBNBB and [Ir(tBuppm)$_2$(acac)] was 0.8: 0.2:0.05 (=2mDBTBPDBq-II:PCBNBB:[Ir(tBuppm)$_2$(acac)]) and then 2mDBTBPDBq-II, PCBNBB, and [Ir(tppr)$_2$(dpm)] were deposited by co-evaporation to a thickness of 5 nm so that the weight ratio of 2mDBTBPDBq-II to PCBNBB and [Ir(tppr)$_2$(dpm)] was 0.9:0.1:0.05 (=2mDBTBPDBq-II:PCBNBB:[Ir(tBuppm)$_2$(acac)]) to form the second light-emitting layer 113b, and 2mDBTBPDBq-II, PCBNBB, and N,N'-bis(3-methylphenyl)-N,N'-bis [3-(9-phenyl-9H-fluoren-9-yl)phenyl]-pyrene-1,6-diamine (abbreviation: 1,6mMemFLPAPrn) represented by Structural Formula (xi) were deposited by co-evaporation to a thickness of 25 nm so that the weight ratio of 2mDBTBP-DBq-II to PCBNBB and 1,6mMemFLPAPrn was 0.3:0.7: 0.05 to form the first light-emitting layer 113a. In the above-described manner, the light-emitting layer 113 was formed. In the light-emitting element 4, the second light-emitting layer 113b was formed on the hole-transport layer 112, and the first light-emitting layer 113a was formed on the second light-emitting layer 113b.

Figure 34:
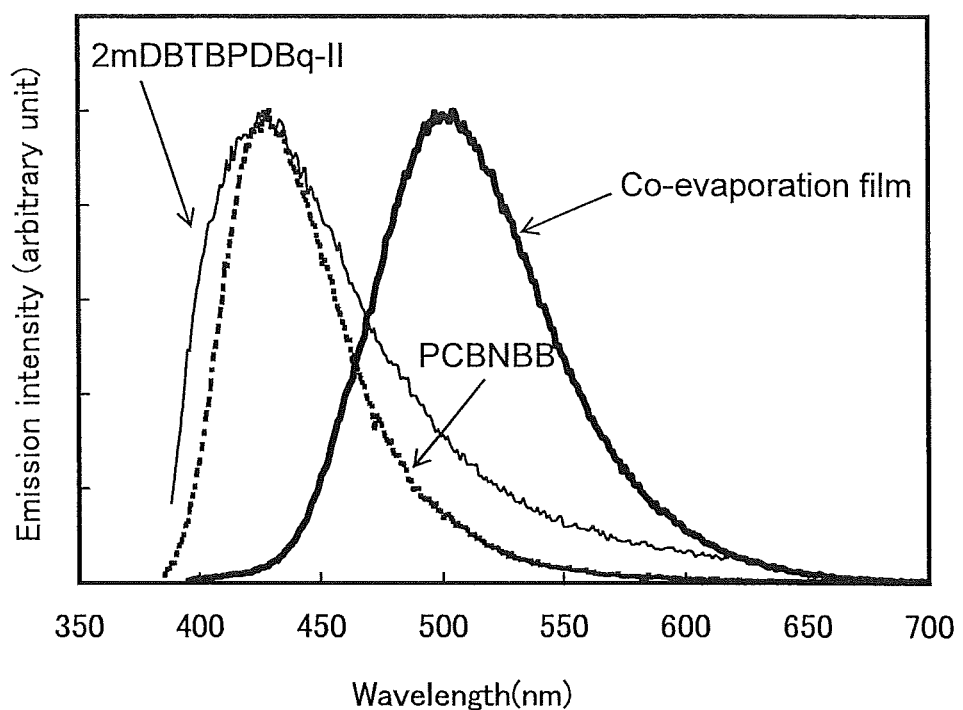
FIG. 34 shows emission spectra of single films of 2mDBTBPDBq-II and PCBNBB and a film formed by co-evaporation of 2mDBTBPDBq-II and PCBNBB.

Note that 2mDBTBPDBq-II and PCBNBB form an exciplex. FIG. 34 shows an emission spectrum of a film of 2mDBTBPDBq-II alone, an emission spectrum of a film of PCBNBB alone, and an emission spectrum of a film formed by co-evaporation of 2mDBTBPDBq-II and PCBNBB. As shown in FIG. 34, the position and the shape of the emission spectrum of the film formed by co-evaporation of 2mDBT-BPDBq-II and PCBNBB are different from those of the emission spectra of the film of 2mDBTBPDBq-II alone and the film of PCBNBB alone. Further, the emission spectrum is located in a longer wavelength region than the emission spectra of the film of 2mDBTBPDBq-II alone and the film of PCBNBB alone. This indicates that an exciplex is formed by 2mDBTBPDBq-II and PCBNBB.

After that, on the light-emitting layer 113, 2mDBTBP-DBq-II was deposited to a thickness of 15 nm, and bathophenanthroline (abbreviation: BPhen) represented by Structural Formula (v) was deposited to a thickness of 15 nm to form the electron-transport layer 114.

After the formation of the electron-transport layer 114, lithium fluoride (LiF) was deposited by evaporation to a thickness of 1 nm to form the electron-injection layer 115. Finally, aluminum was deposited by evaporation to a thickness of 200 nm to form the second electrode 102 functioning as a cathode. Through the above-described steps, the light-emitting element 4 of this example was manufactured.

Note that in all the above evaporation steps, evaporation was performed by a resistance-heating method.

In a glove box under a nitrogen atmosphere, the light-emitting element 4 was sealed with a glass substrate so as not to be exposed to the air (specifically, a sealing material was applied onto an outer edge of the element, UV treatment was performed at the time of sealing, and heat treatment was performed at 80° C. for one hour). Then, the reliability of the light-emitting element was measured. Note that the measurement was carried out at room temperature (in an atmosphere kept at 25° C.).

FIG. 28, FIG. 29, FIG. 30, FIG. 31, and FIG. 32 show the luminance-current density characteristics of the light-emitting element 4, the current efficiency-luminance characteristics thereof, the luminance-voltage characteristics thereof, the external quantum efficiency-luminance characteristics thereof, and an emission spectrum thereof, respectively.

According to the characteristics, the light-emitting element 4 has favorable emission efficiency with a current efficiency of 20 cd/A or higher and an external quantum efficiency of 10% or higher at around 1000 cd/m$^2$.

Further, according to the emission spectrum, red light emission originating from [Ir(tppr)$_2$(dpm)], green light emission originating from [Ir(tBuppm)$_2$(acac)], and blue light emission originating from 1,6mMemFLPAPrn are observed. This indicates that light emission is obtained from both of the first light-emitting layer 113a and the second light-emitting layer 113b and that the light-emitting element in which the fluorescent substance is used as an emission center substance in the first light-emitting layer 113a is able to obtain favorable characteristics.

Figure 33:
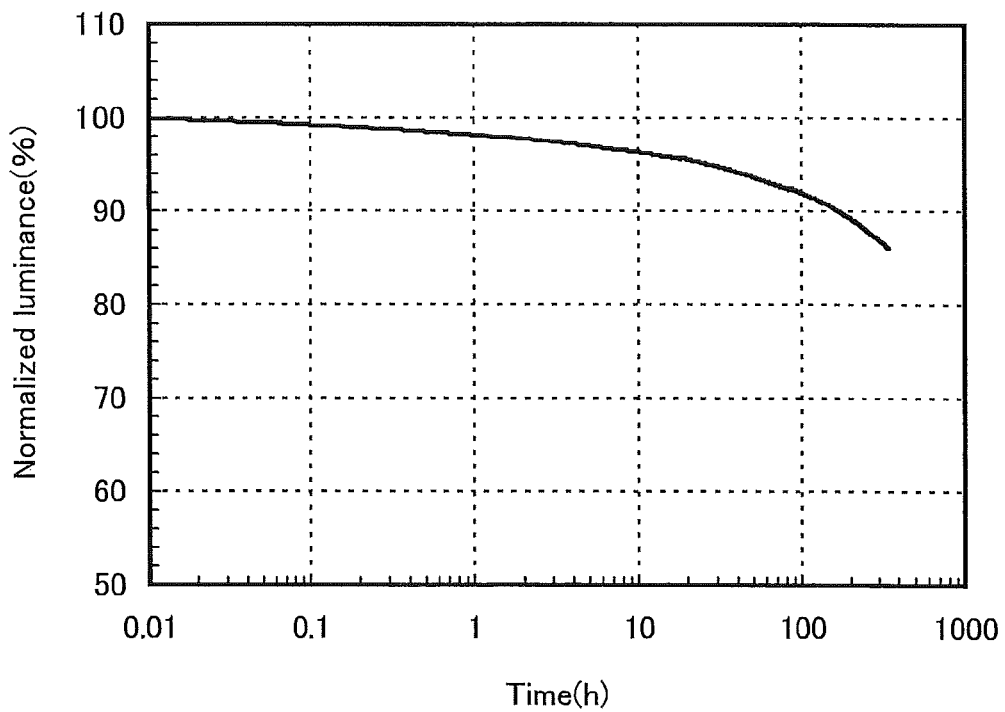
FIG. 33 shows time dependence of normalized luminance of the light-emitting element 4.

FIG. 33 shows the result of a reliability test in which the light-emitting element 4 was driven under conditions that the initial luminance was 3000 cd/m$^2$ and the current density was constant. FIG. 33 shows a change in normalized luminance from an initial luminance of 100%. The result shows that the light-emitting element 4 kept 86% of the initial luminance even after being driven for 350 hours, which means that the light-emitting element 4 has small luminance degradation with driving time and excellent reliability.

EXPLANATION OF REFERENCE

10: electrode, 11: electrode, 101: first electrode, 102: second electrode, 103: EL layer, 111: hole-injection layer, 112: hole-transport layer, 113: light-emitting layer, 113a: first light-emitting layer, 113b: second light-emitting layer, 114: electron-transport layer, 115: electron-injection layer, 400: substrate, 401: first electrode, 403: EL layer, 404: second electrode, 405: sealing material, 406: sealing material, 407: sealing substrate, 412: pad, 420: IC chip, 501: first electrode, 502: second electrode, 511: first light-emitting unit, 512: second light-emitting unit, 513: charge generation layer, 601: driver circuit portion (source line driver circuit), 602: pixel portion, 603: driver circuit portion (gate line driver circuit), 604: sealing substrate, 605: sealing material, 607: space, 608: wiring, 609: FPC (flexible printed circuit), 610: element substrate, 611: switching TFT, 612: current controlling TFT, 613: first electrode, 614: insulator, 616: EL layer, 617: second electrode, 618: light-emitting element, 623: n-channel TFT, 624: p-channel TFT, 625: desiccant, 901: housing, 902: liquid crystal layer, 903: backlight unit, 904: housing, 905: driver IC, 906: terminal, 951: substrate, 952: electrode, 953: insulating layer, 954: partition layer, 955: EL layer, 956: electrode, 1001: substrate, 1002: base insulating film, 1003: gate insulating film, 1006: gate electrode, 1007: gate electrode, 1008: gate electrode, 1020: first interlayer insulating film, 1021: second interlayer insulating film, 1022: electrode, 1024W: first electrode of light-emitting element, 1024R: first electrode of light-emitting element, 1024G: first electrode of light-emitting element, 1024B: first electrode of light-emitting element, 1025: partition, 1028: EL layer, 1029: second electrode of light-emitting element, 1031: sealing substrate, 1032: sealing material, 1033: transparent base material, 1034R: red coloring layer, 1034G: green coloring layer, 1034B: blue coloring layer, 1035: black layer (black matrix), 1036: overcoat layer, 1037: third interlayer insulating film, 1040: pixel portion, 1041: driver circuit portion, 1042: peripheral portion, 2001: housing, 2002: light source, 3001: lighting device, 5000: display region, 5001: display region, 5002: display region, 5003: display region, 5004: display region, 5005: display region, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7210: second display portion, 7301: housing, 7302: housing, 7303: joint portion, 7304: display portion, 7305: display portion, 7306: speaker portion, 7307: recording medium insertion portion, 7308: LED lamp, 7309: operation key, 7310: connection terminal, 7311: sensor, 7401: housing, 7402: display portion, 7403: operation button, 7404: external connection port, 7405: speaker, 7406: microphone, 7400: mobile phone, 9033: hinge, 9034: switch, 9035: power switch, 9036: switch, 9038: operation switch, 9630: housing, 9631: display portion, 9631a: display portion, 9631b: display portion, 9632a: touchscreen region, 9632b: touchscreen region, 9633: solar cell, 9634: charge and discharge control circuit, 9635: battery, 9636: DC-to-DC converter, 9637: operation key, 9638: converter, and 9639: button.

This application is based on Japanese Patent Application serial no. 2012-173027 filed with Japan Patent Office on Aug. 3, 2012, the entire contents of which are hereby incorporated by reference.

What is claimed is:

1. A light-emitting element comprising:
a first electrode,
a second electrode, and
an electroluminescence layer interposed between the first electrode and the second electrode,
wherein the electroluminescence layer comprises a light-emitting layer in which a first light-emitting layer and a second light-emitting layer are stacked,
wherein the first light-emitting layer contains a first organic compound, a second organic compound, and a fluorescent substance,
wherein the second light-emitting layer contains a third organic compound and a phosphorescent substance,
wherein a combination of the first organic compound and the second organic compound forms a first exciplex,
wherein the first light-emitting layer is a fluorescent layer,
wherein the second light-emitting layer is a phosphorescent layer, and
wherein the first organic compound and the second organic compound are mixed in the first light-emitting layer to form a single light-emitting layer.

2. The light-emitting element according to claim 1, wherein a light emission spectrum of the first exciplex has a peak on a shorter wavelength side than a light emission spectrum of the phosphorescent substance.

3. The light-emitting element according to claim 1, wherein a difference in energy between a triplet excited level and a singlet excited level of the first exciplex is greater than or equal to 0 eV and less than or equal to 0.2 eV.

4. The light-emitting element according to claim 1, wherein white light emission is exhibited.

5. A light-emitting module comprising:
the light-emitting element according to claim 1, and
a means controlling the light-emitting element.

6. A light-emitting device comprising:
the light-emitting element according to claim 1, and
a means controlling the light-emitting element.

7. An electronic appliance comprising the light-emitting element according to claim 1.

8. A light-emitting element comprising:
a first electrode,
a second electrode, and
an electroluminescence layer interposed between the first electrode and the second electrode,
wherein the electroluminescence layer comprises a light-emitting layer in which a first light-emitting layer and a second light-emitting layer are stacked,
wherein the first light-emitting layer contains a first organic compound, a second organic compound, and a fluorescent substance,
wherein the second light-emitting layer contains a third organic compound, a fourth organic compound, and a phosphorescent substance,
wherein a combination of the first organic compound and the second organic compound forms a first exciplex,
wherein a combination of the third organic compound and the fourth organic compound forms a second exciplex,
wherein the first light-emitting layer is a fluorescent layer, and
wherein the second light-emitting layer is a phosphorescent layer.

9. The light-emitting element according to claim 8, wherein a light emission spectrum of the first exciplex has a peak on a shorter wavelength side than a light emission spectrum of the phosphorescent substance.

10. The light-emitting element according to claim 8, wherein a difference in energy between a triplet excited level and a singlet excited level of the first exciplex is greater than or equal to 0 eV and less than or equal to 0.2 eV.

11. The light-emitting element according to claim 8, wherein a lowest-energy-side absorption band of the phosphorescent substance overlaps with an emission spectrum of the second exciplex.

12. The light-emitting element according to claim 8, wherein a difference in equivalent energy values between a peak wavelength of a lowest-energy-side absorption band of the phosphorescent substance and a peak wavelength of an emission spectrum of the second exciplex is less than or equal to 0.2 eV.

13. The light-emitting element according to claim 8,
wherein one of the first organic compound and the second organic compound is a material having an electron-transport property and the other is a material having a hole -transport property, and
wherein one of the third organic compound and the fourth organic compound is a material having an electron-transport property and the other is a material having a hole-transport property.

14. The light-emitting element according to claim 13,
wherein one of the first electrode and the second electrode functions as an anode and the other functions as a cathode,
wherein one of the first light-emitting layer and the second light-emitting layer, which is positioned on the side where the electrode functioning as the anode is formed, contains a large amount of the material having the hole-transport property, and
wherein the other of the first light-emitting layer and the second light-emitting layer, which is positioned on the side where the electrode functioning as the cathode is formed, contains a large amount of the material having the electron-transport property.

15. The light-emitting element according to claim 8, wherein a combination of the first organic compound and the second organic compound is the same as a combination of the third organic compound and the fourth organic compound.

16. The light-emitting element according to claim 8, wherein a light emission spectrum of the first exciplex has a peak on a shorter wavelength side than a light emission spectrum of the second exciplex.

17. The light-emitting element according to claim 8, wherein white light emission is exhibited.

18. A light-emitting module comprising:
the light-emitting element according to claim 8, and
a means controlling the light-emitting element.

19. A light-emitting device comprising:
the light-emitting element according to claim 8, and a means controlling the light-emitting element.

* * * * *